(12) United States Patent
Mi et al.

(10) Patent No.: US 7,833,430 B2
(45) Date of Patent: Nov. 16, 2010

(54) METHOD FOR FABRICATING MICROSTRUCTURE AND MICROSTRUCTURE

(75) Inventors: Xiaoyu Mi, Kawasaki (JP); Norinao Kouma, Kawasaki (JP); Osamu Tsuboi, Kawasaki (JP); Masafumi Iwaki, Kawasaki (JP); Hisao Okuda, Kawasaki (JP); Hiromitsu Soneda, Kawasaki (JP); Satoshi Ueda, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1242 days.

(21) Appl. No.: 11/256,959

(22) Filed: Oct. 25, 2005

(65) Prior Publication Data

US 2006/0057761 A1    Mar. 16, 2006

Related U.S. Application Data

(63) Continuation of application No. PCT/JP03/05404, filed on Apr. 25, 2003.

(51) Int. Cl.
*B44C 1/22* (2006.01)

(52) U.S. Cl. .............................. 216/79; 216/58; 216/75; 216/99; 438/719

(58) Field of Classification Search .................. 216/58, 216/75, 79, 99, 100; 438/58, 719
See application file for complete search history.

(56) References Cited

U.S. PATENT DOCUMENTS 5,728,625 A * 3/1998 Tung ........................... 438/586

6,287,885 B1    9/2001 Muto et al.
6,942,814 B2 *  9/2005 Wood et al. .................... 216/24
2002/0159170 A1 * 10/2002 Tsuboi et al. ............... 359/872

FOREIGN PATENT DOCUMENTS

| JP | 10-190007 | 7/1998 |
| JP | 10-270714 | 10/1998 |
| JP | 2000-31502 | 1/2000 |
| JP | 2002-267996 | 9/2002 |
| JP | 2003-15064 | 1/2003 |
| JP | 2003-57574 | 2/2003 |

* cited by examiner

*Primary Examiner*—Lan Vinh
(74) *Attorney, Agent, or Firm*—Fujitsu Patent Center

(57) ABSTRACT

A method of making a microstructure with thin wall portions (T1-T3) includes a step of performing a first etching process to a material substrate having a laminate structure including a first conductive layer (11) and a second conductive layer (12) having a thickness of the thin wall portions (T1-T3), where the etching is performed from the side of the first conductive layer (11) thereby forming in the second conductive layer (12) pre thin wall portions (T1'-T3') which has a pair of side surfaces apart from each other in an in-plane direction of the second conductive layer (12) and contact the first conductive layer (11). The method also includes a step of performing a second etching process from the side of the first conductive layer (11) for removing part of the first conductive layer (11) contacting the pre thin wall portions (T1'-T3') to form the thin wall portions.

28 Claims, 35 Drawing Sheets

510a

520a

510a

520a

METHOD FOR FABRICATING MICROSTRUCTURE AND MICROSTRUCTURE

This application is a continuing application, filed under 35 U.S.C. §111(a), of International Application PCT/JP2003/005404, filed Apr. 25, 2003.

TECHNICAL FIELD

The present invention relates to methods of making microstructures such as micromirror elements, acceleration sensor elements, angular-speed sensor elements and vibration elements, while also relating to microstructures made by micromachining technology.

BACKGROUND ART

In recent years, efforts have been made for making practical use of elements which have a micro-structure formed by micromachining technology. For example, in the field of optical communications technology, micromirror elements, which are very small elements capable of reflecting light, are gathering attention.

In the optical communications, optical fibers serve as a medium through which optical signals are passed. When the optical signal passing through a given optical fiber is switched to another optical fiber, so-called optical switching devices are used in general. In order to achieve high quality optical communications, the optical switching device must have such characteristics as high capacity, high speed and high reliability, in switching action. In view of these, micromirror elements manufactured by utilizing micromachining technology are gathering attention as a switching element to be incorporated in the optical switching devices. The micromirror elements enable the switching operation without converting optical signals into electric signals between the optical paths on the input side and the output side of the optical switching device. This is advantageous in achieving the above-mentioned characteristics.

Micromirror elements have mirror surfaces for reflecting light, and are capable of varying the direction of light reflection by pivoting the mirror surfaces. Many micromirror elements which are used in optical devices are electrostatically-driven. The electrostatically-driven micromirror elements are roughly divided into two types: the micromirror element manufactured by so called surface micromachining technology, and the micromirror element manufactured by so called bulk micromachining technology.

In the surface micromachining technology, material thin film is formed on a substrate, into a desired pattern according to component parts to be made. Such a pattern is laminated in sequence to form supports, mirror surfaces, electrodes and other component parts which constitute the element as well as sacrifice layers which will be removed later.

On the other hand, in the bulk micromachining technology, etching is made to a material substrate itself, whereby supports, mirror regions and so on are made into desired shapes. Thin-film formation is performed as necessary, to form mirror surfaces and electrodes. Technical details of the bulk micromachining technology are disclosed in JP-A 10-190007, JP-A 10-270714 and JP-A 2000-31502, for example.

Micromirror elements must satisfy a technical requirement that the mirror surface which is responsible for reflecting light should be highly flat. However, according to the surface micromachining technology, the finalized mirror surface is thin and susceptible to warp. For this reason, a high flatness is guaranteed only within an area of mirror surface measured by a side length of up to 50 μm.

On the contrary, according to the bulk micromachining technology, a relatively thick material substrate is etched to form mirror regions, and mirror surfaces are made on this mirror regions. Therefore, it is possible to provide rigidity to a larger area of mirror surface, and as a result, it is possible to form mirror surfaces which have sufficiently high optical flatness. For this reason, bulk micromachining technology is employed widely particularly in the manufacture of micromirror elements whose mirror surface must have a side length not smaller than 100 μm.

FIG. 32 is a partially non-illustrated exploded perspective view of a micromirror element 400 as an example of a conventional, electrostatically-driven micromirror element manufactured by the bulk micromachining technology. The micromirror element 400 has a laminated structure in which a mirror substrate 410 and a base substrate 420 are laminated via a spacer (not illustrated). The mirror substrate 410 includes a mirror region 411, an inner frame 412 and an outer frame 413. The mirror region 411 and the inner frame 412 are connected with each other by a pair of torsion bars 414. The inner frame 412 and the outer frame 413 are connected with each other by a pair of torsion bars 415. The pair of torsion bars 414 provides a center axis for a pivotal action of the mirror region 411 with respect to the inner frame 412. The torsion bars 415 provide a center axis for a pivotal action of the inner frame 412 with respect to the outer frame 413 and of the mirror region 411 associating therewith.

The mirror region 411 has a back surface provided with a pair of flat-plate electrodes 411a, 411b, and a top surface provided with a mirror surface (not illustrated) for refection of light. The inner frame 412 has a back surface provided with a pair of flat-plate electrodes 412a, 412b.

The base substrate 420 is provided with: flat-plate electrodes 420a, 420b which are faced to the flat-plate electrodes 411a, 411b of the mirror region 411; and flat-plate electrodes 420c, 420d which are faced to the flat-plate electrodes 412a, 412b of the inner frame 412. Such flat-plate electrodes are often used in conventional micromirror element as driving means in order to generate electrostatic force.

According to the above construction, when the flat-plate electrode 411a of the mirror region 411 is positively charged for example, and the flat-plate electrode 420a of the base substrate 420 is negatively charged, then electrostatic attraction is generated between the flat-plate electrodes 411a and the flat-plate electrodes 420a, which pivots the mirror region 411 in a direction indicated by Arrow M1 while twisting the torsion bars 414.

On the other hand, for example, when the flat-plate electrode 412a of the mirror region 412 is positively charged, and the flat-plate electrode 420c of the base substrate 420 is negatively charged, then electrostatic attraction is generated between the flat-plate electrodes 412a and the flat-plate electrode 420c, which pivots the mirror region 412 together with the mirror region 411 in a direction indicated by Arrow M2 while twisting the torsion bars 415. FIG. 33 shows a situation in which the inner frame 412 and the associating mirror region 411 are displaced at an angle θ with respect to the outer frame 413.

According to the flat-plate electrode structure which is utilized in the micromirror element 400, the flat-plate electrodes 420a, 420b, 420c, 420d in the base substrate 420 tend to draw the mirror region 411 which is provided with the flat-plate electrodes 411a, 411b or the inner frame 412 which is provided with the flat-plate electrodes 412a, 412b for eventual contact. Therefore, there is a pull-in voltage between a pair of electrodes; specifically, when a voltage applied between a pair of electrodes exceeds the pull-in voltage, the mirror region 411 and/or the inner frame 412 can begin to approach the base substrate 420 at a wildly accelerated speed in the course of pivoting action, resulting in a problem that the tilting angle of the mirror region 411 cannot be controlled appropriately. The problem is particularly egregious when a large tilting angle (5° approx. or greater) must be achieved, i.e. when the torsion bars are twisted to a large extent.

In an attempt to solve this problem, proposals are made in which the micromirror element is driven by a comb-teeth electrode structure instead of the flat-plate electrode structure. FIG. 34 is a partially non-illustrated perspective view of a micromirror element 500 which utilizes a comb-teeth electrode structure.

The micromirror element 500 includes a mirror region 510 which has an upper surface or a lower surface provided with a mirror surface (not illustrated), a mirror region 510, inner frame 520 and an outer frame 530 (partially non-illustrated). Each component is integrally formed with a comb-teeth electrode. Specifically, the mirror region 510 has a pair of mutually parallel sides formed with a pair of outwardly extended comb-teeth electrodes 510a, 510b. The inner frame 520 is formed with a pair of inwardly extended comb-teeth electrodes 520a, 520b correspondingly to the comb-teeth electrode 510a, 510b, and with a pair of outwardly extended comb-teeth electrodes 520c, 520d. The outer frame 530 is formed with a pair of inwardly extended comb-teeth electrodes 530a, 530b correspondingly to the comb-teeth electrode 520c, 520d. The mirror region 510 and the inner frame 520 are connected with each other by a pair of torsion bars 540. The inner frame 520 and the outer frame 530 are connected with each other by a pair of torsion bars 550. The torsion bars 540 provide a center of axis for the pivotal action of the mirror region 510 with respect to the inner frame 520. The torsion bars 550 provides a center of axis for the pivotal action of the inner frame 520 with respect to the outer frame 530 and a center of axis for the associating pivotal action of the mirror region 510.

According to the micromirror element 500 which has the structure as described, a set of comb-teeth electrodes which are placed closely to each other for generation of electrostatic force, e.g. the comb-teeth electrode 510a and the comb-teeth electrode 520a, are apart from each other, making an upper and a lower steps as shown in FIG. 35A when no voltage is applied. When a voltage is applied, as shown in FIG. 35B, the comb-teeth electrode 520a pulls the comb-teeth electrode 510a in, thereby driving the mirror region 510. More specifically, in FIG. 34, when the comb-teeth electrode 510a is positively charged and the comb-teeth electrode 520a is negatively charged, then the mirror region 510 pivots in a direction indicated by Arrow M3 while twisting the torsion bars 540. On the other hand, when the comb-teeth electrode 520c is positively charged and the comb-teeth electrode 530a is negatively charged, then the inner frame 520 pivots in a direction indicated by Arrow M4 while twisting the torsion bars 550.

According to the comb-teeth electrode, the electrostatic force developed between the electrodes acts in directions which are generally perpendicular to the pivoting directions of the mirror region 510. Therefore, when the mirror region 510 is driven, the distance between the electrodes in directions in which the electrostatic force acts is generally constant, and thus, the comb-teeth electrodes are unlikely to contact with each other due to the pull-in. This enables to attain a large tilting angle of the mirror region 510 appropriately.

According to the micromirror element 500, pivoting action of the mirror region 510 and the inner frame 520 causes a displacement of the comb teeth (electrode), and therefore it is necessary that the comb-teeth electrodes are formed to have a sufficient thickness for predetermined tilting angle of the mirror region 510 and the inner frame 520. For example, if the mirror region 510 has a body region 511 which has a length D of 1 mm, and the mirror region 510 is pivoted with respect to the inner frame 520, by 5 degrees around an axis provided by a pair of torsion bars 540, one of two body end regions 511' dips down by 44 μm. For this reason, the mirror region 510 must be formed with comb-teeth electrodes 510a, 510b which have a thickness T of at least 44 μm.

On the other hand, from the view point that a large tilting angle should be attained with a small voltage, it is desirable that the torsion bars 540, 550 which have torsional resistance should be thin. However, in the conventional micromirror element 500, the torsion bars 540, 550 are formed to have the same large thickness with the material substrate which constitutes the mirror region 510, the inner frame 520 and the outer frame 530. For example, if the comb-teeth electrodes 510a, 510b are designed to have a thickness T of 44 μm or greater as described above, both the mirror region 510 and the torsion bars 540, 550 will be 44 μm or greater. If the torsion bars 540, 550 are as thick as this, a large electrostatic force must be generated between the comb-teeth electrodes in order to twist these torsion bars, and as a result, a large driving voltage must be supplied. Although torsional resistance of the torsion bars 540, 550 are adjusted by varying the width of torsion bars 540, 550 according to the conventional art, design change in the width is often not enough to attain an appropriate torsional resistance.

As described, according to the microstructures manufactured by the bulk micromachining technology, it is sometimes necessary that structural regions which are formed by etching the material substrate have different thicknesses or heights. However, in the conventional bulk micromachining technology, it is difficult to form a thin structural region or a thin wall portion which has a highly accurate thickness dimension, integrally with a thick structural region or a thick wall region.

DISCLOSURE OF THE INVENTION

The present invention has been proposed under the circumstances described above, and it is therefore an object of the present invention to provide a manufacturing method of microstructures having a thin wall portion which has a highly accurate thickness dimension, and a microstructure manufactured thereby.

A first aspect of the present invention provides a method of manufacturing a microstructure which has a thin wall portion. The method includes: a step of performing a first etching process to a material substrate having a laminate structure including a first conductive layer and a second conductive layer having a thickness corresponding to a thickness of the thin wall portion, where the etching is performed from the side of the first conductive layer thereby forming, in the second conductive layer, a pre thin wall portion having a pair of side surfaces apart from each other in an in-plane direction of the second conductive layer and contacting the first conductive layer; and a step of performing a second etching process from the side on the first conductive layer for removing part of the first conductive layer contacting the pre thin wall portion thereby forming the thin wall portion.

In the first aspect, preferably, the first etching process is provided by anisotropic reactive ion etching in which etching speed in the first conductive layer and the second conductive layer is faster in a thickness direction than in in-plane directions.

Preferably, the second etching process is provided by wet etching in which etching speed in the first conductive layer is faster than in the second conductive layer. In this case, preferably, the first conductive layer and the second conductive layer are made of electroconductive silicon material, and the dopant concentration in the second conductive layer is higher than the dopant concentration in the first conductive layer.

Preferably, the first conductive layer is made of silicon material which has a crystal structure including a (110) surface extending in in-plane directions of the first conductive layer and two (111) surfaces perpendicular to the (110) surface.

Preferably, the first conductive layer is made of silicon material which has a crystal structure including a (110) surface or a (100) surface extending in in-plane directions of the first conductive layer.

A second aspect of the present invention provides another method of manufacturing a microstructure which has a thin wall portion. The method includes: a step of performing a first etching process to a material substrate having a laminate structure including a first conductive layer, a second conductive layer having a thickness corresponding to a thickness of the thin wall portion and contacting the first conductive layer, a third conductive layer, and an insulating layer between the second conductive layer and the third conductive layer, where the etching is performed from the side of the first conductive layer via a first masking pattern masking a region on the material substrate to become a thick wall region and via a second masking pattern masking part of the first conductive layer which corresponds to a region on the second conductive layer to become the thin wall portion; a step of removing the second masking pattern and then performing a second etching process to the material substrate from the side of the first conductive layer via the first masking pattern thereby forming in the second conductive layer a pre thin wall portion having a pair of side surfaces that are apart from each other in an in-plane direction of the second conductive layer, and that contacts the first conductive layer and the insulating layer; a step of performing a third etching process from the side of the first conductive layer thereby removing part of the first conductive layer contacting the pre thin wall portion; and a step of performing a fourth etching process for removing part of the insulating layer contacting the pre thin wall portion thereby forming the thin wall portion.

In the second aspect of the present invention, preferably, the second etching process is provided by anisotropic reactive ion etching in which etching speed in the first conductive layer and the second conductive layer is faster in a thickness direction than in in-plane directions.

Preferably, the third etching process is provided by wet etching in which etching speed in the first conductive layer is faster than in the second conductive layer. In this case, preferably, the first conductive layer and the second conductive layer are made of electroconductive silicon material, and the dopant concentration in the second conductive layer is higher than the dopant concentration in the first conductive layer.

Preferably, the first conductive layer is made of silicon material having a crystal structure including a (110) surface extending in in-plane directions of the first conductive layer and two (111) surfaces perpendicular to the (110) surface and crossing each other. The first masking pattern has at least part of its outline following the two (111) surfaces.

Preferably, the third conductive layer is provided by silicon material having a crystal structure including a (110) surface extending in in-plane directions of the third conductive layer and two (111) surfaces crossing each other and being parallel to one of the two (111) surfaces in the first conductive layer.

Preferably, the method further includes: a step of performing an etching process from the side of the first conductive layer for forming a hole which penetrates the first conductive layer, the second conductive layer and the insulating layer to reach the third conductive layer; and a step of filling the hole with electroconductive material thereby forming an electroconductive path.

A third aspect of the present invention provides a method of manufacturing a microstructure which has a first thin wall portion and a second thin wall portion. The method includes: a step of performing a first etching process to a material substrate having a laminate structure including a first conductive layer, a second conductive layer having a thickness corresponding to a thickness of the first thin wall portion and contacting the first conductive layer, a third conductive layer having a thickness corresponding to a thickness of the second thin wall portion, a fourth conductive layer contacting the third conductive layer, and an insulating layer between the second conductive layer and the third conductive layer, where the etching is performed from the side of the first conductive layer via a first masking pattern masking a region on the material substrate to become a thick wall region and via a second masking pattern masking part of the first conductive layer which corresponds to a region on the second conductive layer to become the thin wall portion; a step of performing a second etching process to the material substrate from the side of the fourth conductive layer via a third masking pattern masking part of the material substrate to become a thick wall region and via a fourth masking pattern masking part of the fourth conductive layer corresponding to a region on the third conductive layer to become the second thin wall portion; a step of removing the second masking pattern and then performing a third etching process to the material substrate from the side of the first conductive layer via the first masking pattern thereby forming in the second conductive layer a first pre thin wall portion having a pair of side surfaces apart from each other in an in-plane direction of the second conductive layer and contacting the first conductive layer and the insulating layer; a step of removing the fourth masking pattern and then performing a fourth etching process to the material substrate from the side of the fourth conductive layer via the third masking pattern thereby forming in the third conductive layer a second pre thin wall portion having a pair of side surfaces apart from each other in an in-plane direction of the third conductive layer and contacting the fourth conductive layer and the insulating layer; a step of performing a fifth etching process thereby removing part of the first conductive layer contacting the first pre thin wall portion and removing part of the fourth conductive layer contacting the second pre thin wall portion; and a step of performing a sixth etching process for removing part of the insulating layer contacting the first pre thin wall portion thereby forming the first thin wall portion, and removing part of the insulating layer contacting the second pre thin wall portion thereby forming the second thin wall portion.

In the third aspect of the present invention, preferably, the third etching process is provided by anisotropic reactive ion etching in which etching speed in the first conductive layer and the second conductive layer is faster in a thickness direction than in in-plane directions, and the fourth etching is provided by anisotropic reactive ion etching in which etching speed in the fourth conductive layer and the third conductive layer is faster in a thickness direction than in in-plane directions.

Preferably, the fifth etching process is provided by wet etching in which etching speed in the first conductive layer is faster than in the second conductive layer, and etching speed in the fourth conductive layer is faster than in the third conductive layer. In this case, preferably, the first conductive layer, the second conductive layer, the third conductive layer and the fourth conductive layer are made of electroconductive silicon material. The dopant concentration in the second conductive layer is higher than the dopant concentration in the first conductive layer. The dopant concentration in the third conductive layer is higher than the dopant concentration in the fourth conductive layer.

Preferably, the first conductive layer is made of silicon material which has a crystal structure including a (110) surface extending in in-plane directions of the first conductive layer and two (111) surfaces perpendicular to the (110) surface and crossing each other. The first masking pattern has at least part of its outline following the two (111) surfaces.

Preferably, the fourth conductive layer is made of silicon material which has a crystal structure including a (110) surface extending in in-plane directions of the fourth conductive layer and two (111) surfaces crossing each other and being parallel to one of the two (111) surfaces in the first conductive layer. The third masking pattern has at least part of its outline following the two (111) surfaces of the fourth conductive layer.

A fourth aspect of the present invention provides another method of manufacturing a microstructure which has a thin wall portion. The method includes: a step of performing a first etching process to a material substrate having a laminate structure including a first conductive layer having a thickness corresponding to a thickness of the thin wall portion and a second conductive layer, from the side of the first conductive layer via a masking pattern masking a region on the first conductive layer to become a thick wall region thereby forming in the first conductive layer a pre thin wall portion having a pair of side surfaces apart from each other in an in-plane direction of the first conductive layer and contacting the second conductive layer; and a step of performing a second etching process from the side of the first conductive layer thereby removing part of the second conductive layer contacting the pre thin wall portion.

In the fourth aspect of the present invention, preferably, the second etching process is provided by wet etching in which etching speed in the second conductive layer is faster than in the first conductive layer. In this case, preferably, the first conductive layer and the second conductive layer are provided by electroconductive silicon material, and the dopant concentration in the first conductive layer is higher than the dopant concentration in the second conductive layer.

Preferably, the second conductive layer is made of silicon material which has a crystal structure including a (111) surface extending in in-plane directions of the second conductive layer.

Preferably, the laminate structure in the material substrate further includes: an insulating layer contacting the second conductive layer on a side opposite to the first conductive layer; and a third conductive layer contacting the insulating layer on a side opposite to the second conductive layer.

Preferably, the method further includes: a step of performing an etching process from the side on the first conductive layer for forming a hole which penetrates the first conductive layer, the second conductive layer and the insulating layer to the third conductive layer; and a step of filling the hole with electroconductive material thereby forming an electroconductive path.

A fifth aspect of the present invention provides another method of manufacturing a microstructure which has a thin wall portion. The method includes: a step of performing a first etching process to a material substrate having a laminate structure including a first conductive layer, a second conductive layer and an insulating layer between the first conductive layer and the second conductive layer, where the etching is performed from the side on the first conductive layer part way to the insulating layer via a first masking pattern masking a region on the first conductive layer to become a thin wall portion thereby forming in the first conductive layer a pre thin wall portion having a pair of side surfaces apart from each other in an in-plane direction of the first conductive layer; a step of forming an wet-etching stop layer on a surface of the first conductive layer which includes the pre thin wall portion; a step of performing a second etching process provided by dry etching, where the etching is performed from the side on the first conductive layer to the insulating layer via a second masking pattern masking the pre thin-film layer; and a step of performing wet etching for removing material between the pre thin wall portion and the insulating layer in the first conductive layer.

In the fifth aspect of the present invention, preferably, the first conductive layer and the wet-etching stop layer are made of electroconductive silicon material, and the dopant concentration in the wet-etching stop layer is higher than the dopant concentration in the first conductive layer.

Preferably, the first conductive layer is made of silicon material which has a crystal structure including a (111) surface extending in in-plane directions of the first conductive layer.

Preferably, the method further includes: a step of performing an etching process from the side of the first conductive layer for forming a hole which penetrates the first conductive layer and the insulating layer to reach the second conductive layer; and a step of filling the hole with electroconductive material thereby forming an electroconductive path.

A sixth aspect of the present invention provides a microstructure. The microstructure is formed from a material substrate having a laminate structure including: a first conductive layer made of electroconductive silicon material having a crystal structure including a (110) surface extending in in-plane directions and two (111) surfaces perpendicular to the (110) surface and crossing each other; and a second conductive layer made of electroconductive silicon material having a dopant concentration higher than in the first conductive layer. The microstructure includes a plurality of thick wall regions each including: a first region formed of the first conductive layer and having an outline following the (110) surface and the two (111) surfaces; a second region formed of the second conductive layer and contacting the first region; and a thin wall portion formed of the second conductive layer, exposed and connecting two selected thick wall regions.

In the sixth aspect of the present invention, preferably, the laminate structure in the material substrate further includes: an insulating layer contacting the second conductive layer on a side opposite to the first conductive layer; and a third conductive layer contacting the insulating layer on a side opposite to the second conductive layer. The third conductive layer is made of silicon material which has a crystal structure including a (110) surface extending in in-plane directions and two (111) surfaces crossing each other and being parallel to one of the two (111) surfaces in the first conductive layer. At least one of the thick wall regions includes a third region formed in the third conductive layer and having an outline following the (110) surface and the two (111) surfaces of the third conductive layer.

Preferably, the microstructure further includes an electroconductive path which penetrates the insulating layer for electrically connecting the first region, the second region and the third region.

Preferably, the laminate structure in the material substrate further includes: an insulating layer contacting the second conductive layer on a side opposite to the first conductive layer; a third conductive layer contacting the insulating layer on a side opposite to the second conductive layer; and a fourth conductive layer contacting the third conductive layer on a side opposite to the insulating layer. The fourth conductive layer is made of electroconductive silicon material which has a crystal structure including a (110) surface extending in in-plane directions and two (111) surfaces crossing each other and being parallel to one of the two (111) surfaces in the first conductive layer. The third conductive layer is made of electroconductive silicon material which has a dopant concentration higher than the fourth conductive layer. At least one of the thick wall regions further includes a third region formed of the third conductive layer and a fourth region formed of the fourth conductive layer and has an outline following the (110) surface and the two (111) surfaces of the fourth conductive layer.

BEST MODE FOR CARRYING OUT THE INVENTION

Figure 1:
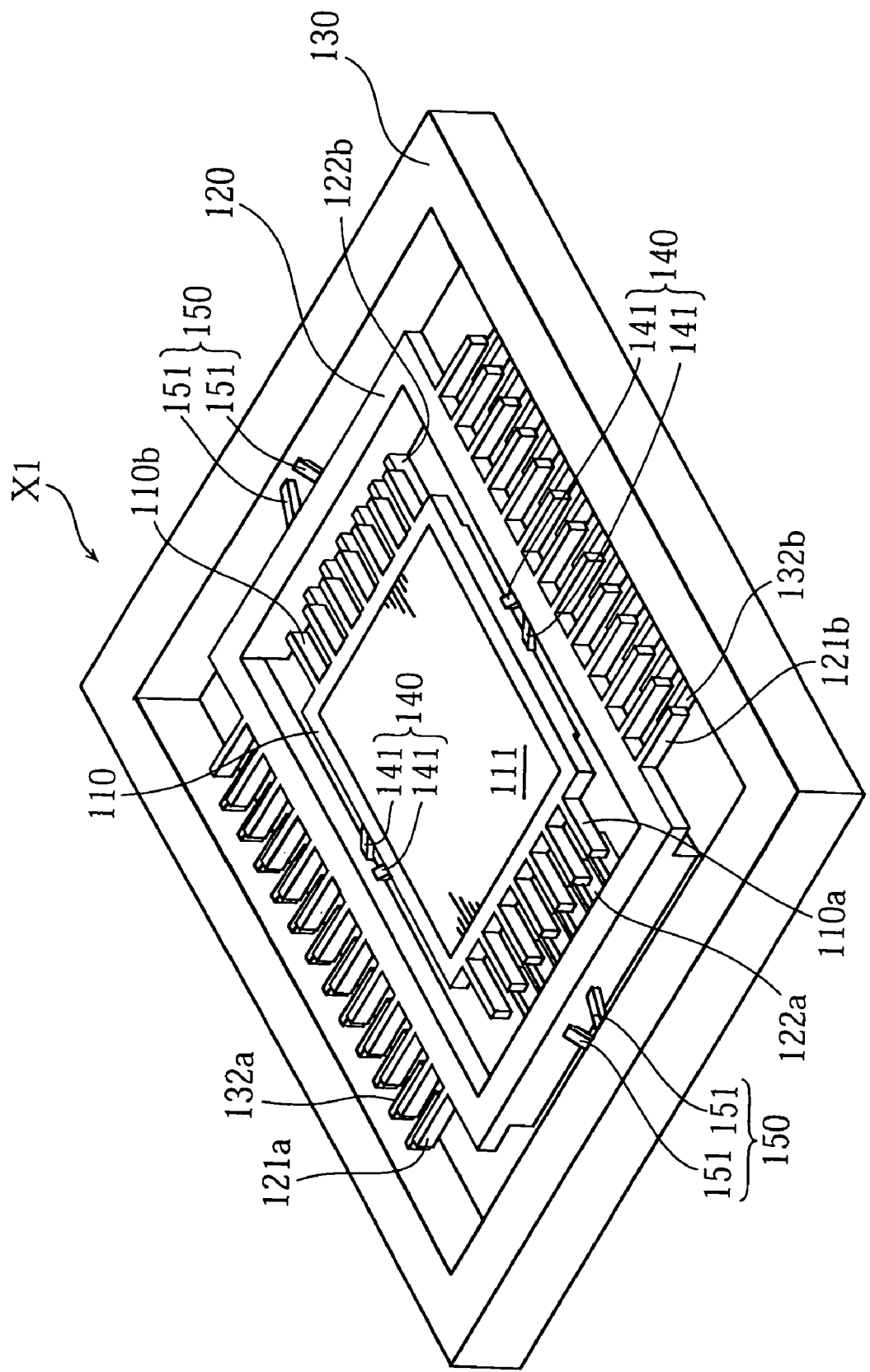
FIG. 1 is a perspective view of a micromirror element as an example of the microstructure which can be manufactured according to the present invention.
Figure 2:
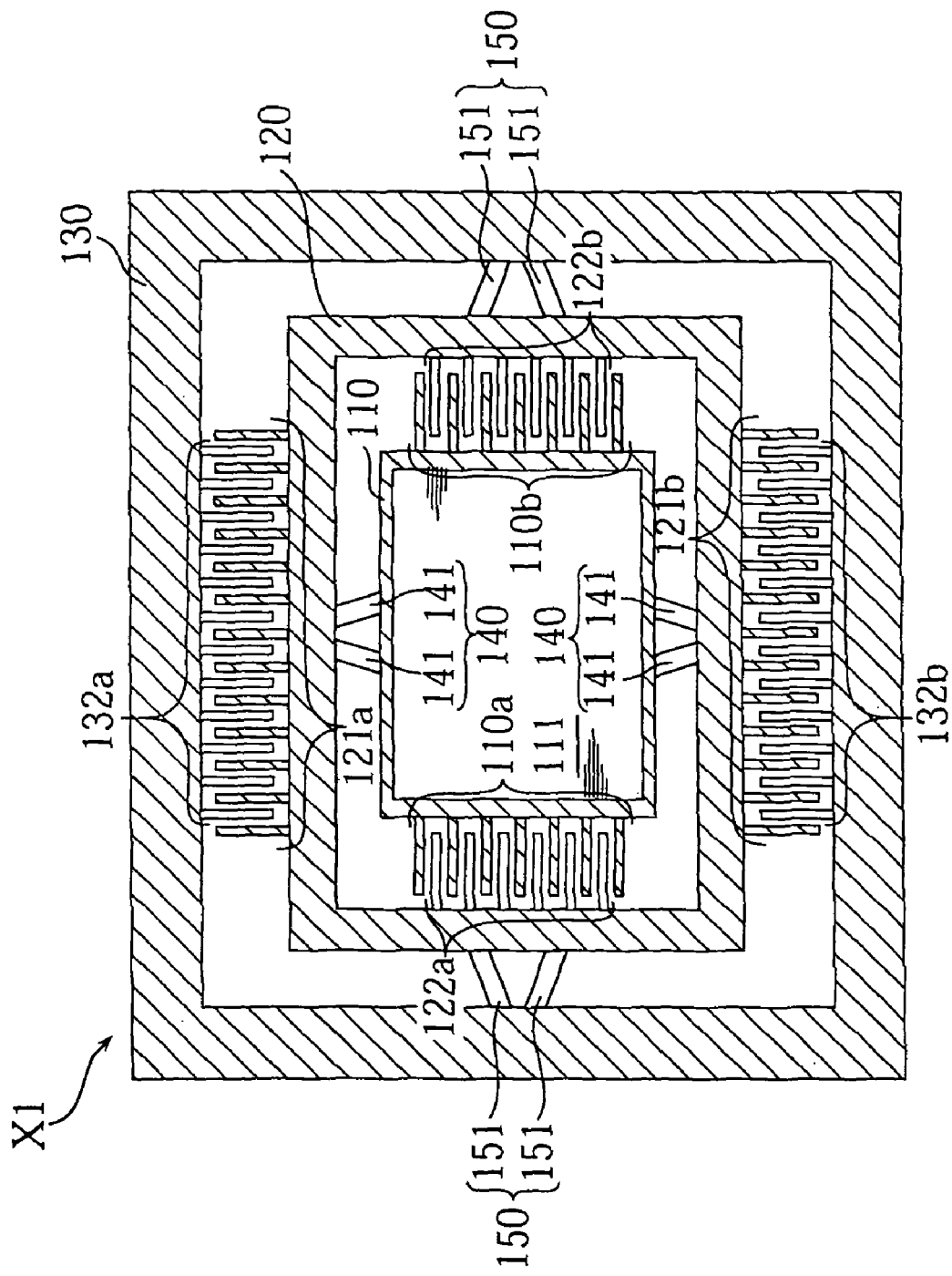
FIG. 2 is a plan view of the micromirror element in FIG. 1.

FIG. 1 and FIG. 2 show a micromirror element X1 as an example of microstructures which can be manufactured according to the present invention.

The micromirror element X1 is formed by micromachining technology, from a material substrate having a predetermined laminate structure which includes an electroconductive silicon material layer. The element includes a mirror region 110, an inner frame 120 surrounding it, an outer frame 130 surrounding the inner frame 120, a pair of connecting regions 140 connecting the mirror region 110 and the inner frame 120, and a pair of connecting regions 150 connecting the inner frame 120 and the outer frame 130. Note that FIG. 1 does not illustrate the laminate structure of the material substrate. The mirror region 110 and the inner frame 120 are spaced from each other, and, the inner frame 110 and the outer frame 120 are spaced from each other, by e.g. 10-200 µm. The connecting regions 140 provide a center axis for a pivotal action of the mirror region 110 with respect to the inner frame 120. The connecting regions 150 provide a center axis for a pivotal action of the inner frame 120 with respect to the outer frame 130, and provides a center axis for a pivotal action of the mirror region 110 associating therewith. These connecting regions 140, 150 have their respective axis being perpendicular to each other. In FIG. 2, hatching indicates regions which are higher than the connecting regions 140, 150, protruding above the paper surface, toward the viewer (except for a mirror surface 111 to be described later).

The mirror region 110 has a pair of mutually parallel sides formed integrally with a pair of outwardly extended comb-teeth electrodes 110a, 110b. The mirror region 110 has an upper surface provided with the mirror surface 111.

The inner frame 120 is integrally formed with outwardly extended comb-teeth electrodes 121a, 121b, and is integrally formed with inwardly extended comb-teeth electrodes 122a, 122b. The comb-teeth electrode 122a is disposed below the comb-teeth electrode 110a, and the teeth of the comb-teeth electrode 110a does not make contact with the teeth of the comb-teeth electrode 122a when the mirror region 110 pivots with respect to the inner frame 120. Likewise, the comb-teeth electrode 122b is disposed below the comb-teeth electrode 110b, and the teeth of the comb-teeth electrode 110b do not make contact with the teeth of the comb-teeth electrode 122b when the mirror region 110 pivots.

The outer frame 130 is integrally formed with inwardly extended comb-teeth electrodes 132a, 132b. The comb-teeth electrode 132a is disposed below the comb-teeth electrode 121a, and the teeth of the comb-teeth electrode 121a do not make contact with the teeth of the comb-teeth electrode 132a when the inner frame 120 pivots with respect to the outer frame 130. Likewise, the comb-teeth electrode 132b is disposed below the comb-teeth electrode 121b, and the teeth of the comb-teeth electrode 121b do not make contact with the teeth of the comb-teeth electrode 132b when the inner frame 120 pivots.

Each of the connecting regions 140 includes two torsion bars 141 which are separated from each other. Each torsion bar 141 connects with the mirror region 110 and with the inner frame 120, and is thinner than them. The distance between the two torsion bars 141 gradually increases from the side on the inner frame 120 toward the side on the mirror region 110.

Each of the connecting regions 150 includes two torsion bars 151 which are separated from each other. Each torsion bar 151 connects with the inner frame 120 and with the outer frame 130, and is thinner than them. The distance between the two torsion bars 151 gradually increases from the side on the outer frame 130 toward the side on the inner frame 120.

The location where the connecting regions 140, 150 are formed, and shapes of the torsion bars 141, 151 included therein are appropriately varied depending on mechanical characteristics required of the connecting regions 140, 150, a driving mode of the element, and a manufacturing method of the element.

As described, the micromirror element X1 has: the connecting regions 140 or the torsion bars 141 which are thinner than the mirror region 110 and the inner frame 120 and can serve as electrical paths between the mirror region 110 and the inner frame 120; and the connecting regions 150 or the torsion bars 151 which are thinner than the inner frame 120 and the outer frame 130 and can serve as electrical paths between the inner frame 120 and the outer frame 130.

FIG. 3A through FIG. 7D show a series of steps of a manufacturing method for the microstructure according to the first embodiment of the present invention. The method is an example through which the micromirror element X1 described above is manufactured by micromachining technology.

Figure 6A:
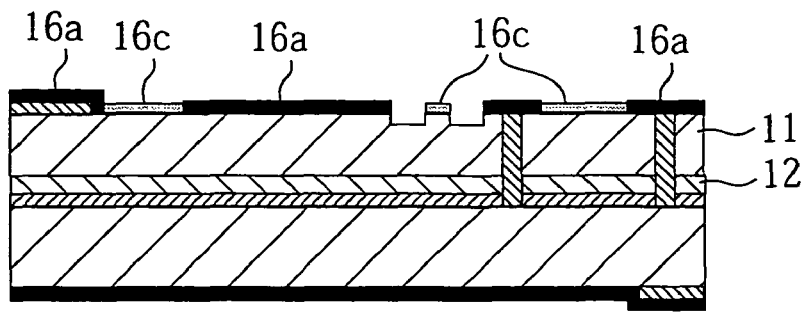
FIG. 6A through FIG. 6D show steps which follow the steps in FIG. 5D.
Figure 6B:
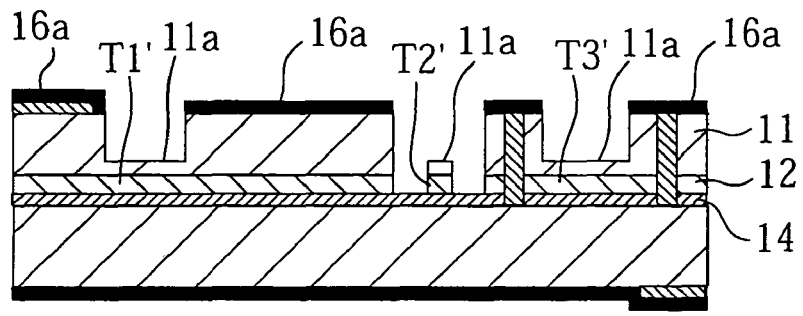
Figure 6C:
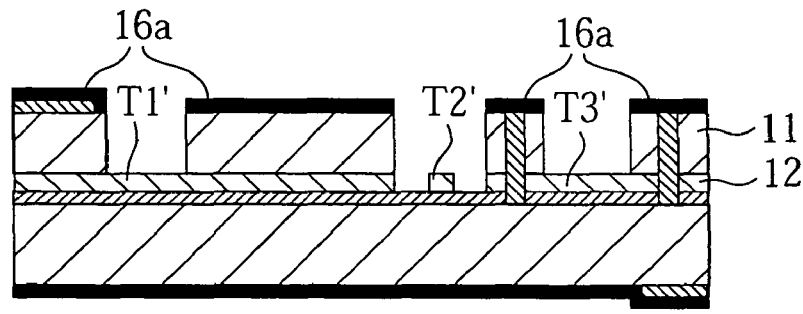
Figure 6D:
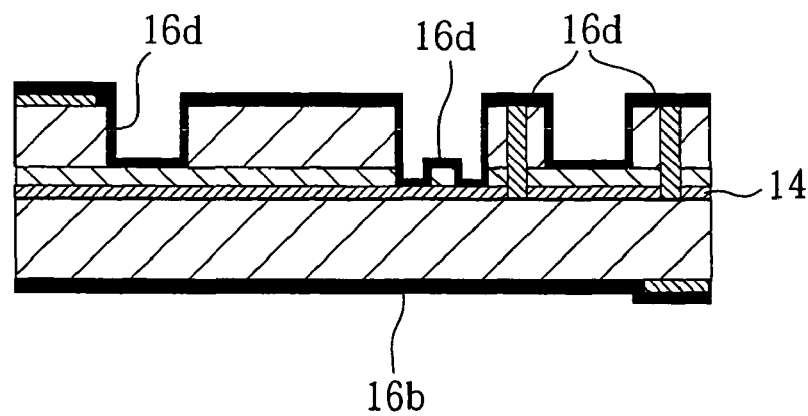
Figure 7A:
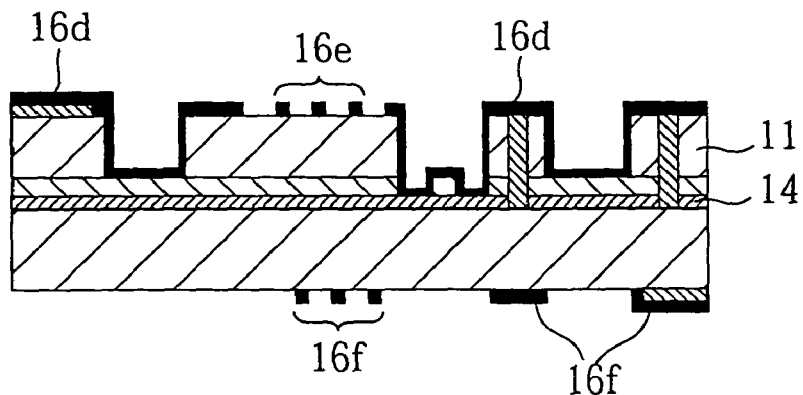
FIG. 7A through FIG. 7D show steps which follow the steps in FIG. 6D.
Figure 7B:
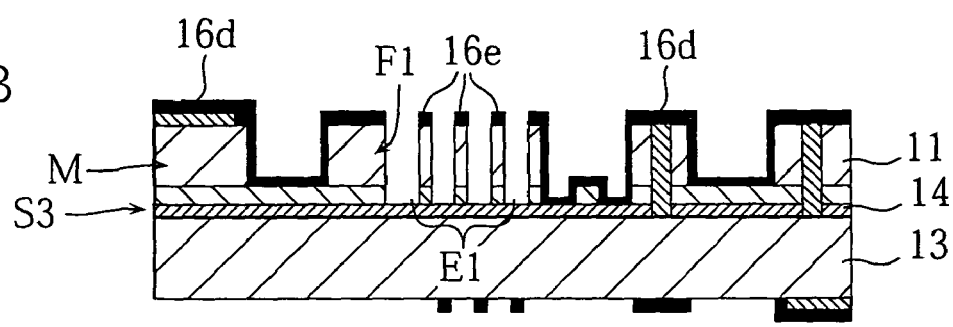
Figure 7C:
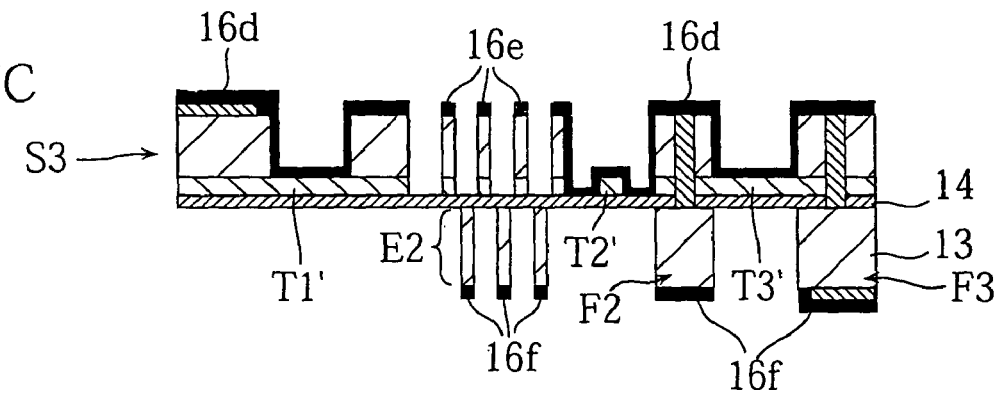
Figure 7D:
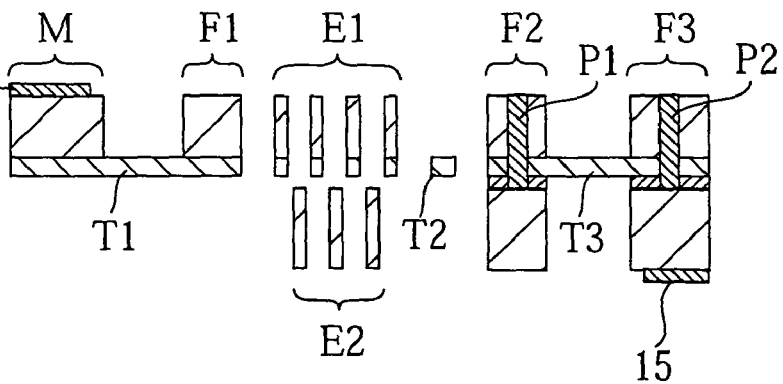

Throughout FIG. 3A to FIG. 7D, views of a section will be given to illustrate a process of forming those components which are shown in FIG. 7D, i.e. a mirror region M, torsion bars T1-T3, inner frames F1, F2, a pair of comb-teeth electrodes E1, E2, and an outer frame F3. The section represents a section of a material substrate (a wafer having a multi-layer structure) to which micromachining is performed, and more specifically a section of a single block from which a single micromirror element is formed. The section includes sections of a plurality of component regions, and the sectional views are illustrative sequential depictions.

In FIG. 7D, the mirror region M represents a part of the mirror region 110. The torsion bar T1 represents the torsion bar 141, and is expressed in a longitudinal section along the direction in which the bar extends. The inner frame F1 represents a part of the inner frame 120 where the torsion bar 141 makes contact with. The comb-teeth electrode E1 represents a part of the comb-teeth electrodes 110a, 110b, 121a, 121b. The comb-teeth electrode E2 represents a part of the comb-teeth electrodes 122a, 122b, 132a, 132b. The torsion bar T2 represents the torsion bars 141, 151, and is expressed in a cross section perpendicular to the direction in which the bar extends. The inner frame F2 represents a part of inner frame 120 where the torsion bar 151 makes contact with. The torsion bar T3 represents the torsion bar 151, and is expressed in a cross section along the direction in which the bar extends. The outer frame F3 represents a part of the outer frame 130 where the torsion bar 151 makes contact with.

Figure 3A:
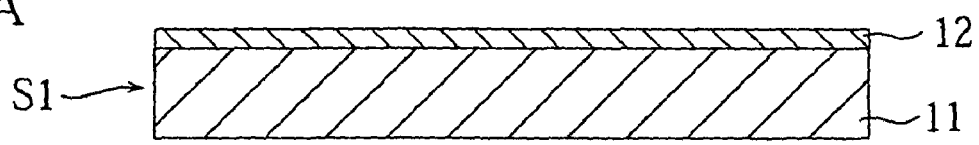
FIG. 3A through FIG. 3D show a few steps of a micromirror element manufacturing method according to a first embodiment of the present invention.

In the method of manufacturing the microstructure according to the first embodiment, a material substrate S1 as shown in FIG. 3A is prepared first. The material substrate S1 has a laminate structure which includes a silicon layer 11 and a silicon layer 12.

The silicon layer 11 is made of a silicon material which is doped with a p-type impurity such as boron thereby given electric conductivity. The concentration of B dopant in the silicon layer 11 is $1 \times 10^{17}$-$1 \times 10^{18}$ atom/cm$^3$ for example. The silicon layer 11 has a crystal structure in which (110) surface or (100) surface extends in in-plane directions of the layer.

The silicon layer 12 is made of a silicon material which is doped with a p-type impurity such as B thereby given electric conductivity. The layer has a thickness of 1-5 μm for example. The thickness represents the thickness of the torsion bars T1-T3. The concentration of B dopant in the silicon layer 12 is higher than that in the silicon layer 11, being $1 \times 10^{19}$ atom/cm$^3$ or greater for example. Preferably, the dopant concentration in the silicon layer 12 is 100 times or greater than the dopant concentration in the silicon layer 11.

In order to provide the silicon layers 11, 12 with electric conductivity, P or Sb may be used as the dopant in place of B. P or Sb may also be used in place of B to give electric conductivity to silicon materials which are to be described later.

In the preparation of the material substrate S1, first, direct bonding is made between a first silicon wafer which is for making the silicon layer 11 and has the same thickness as the silicon layer 11 and a second silicon wafer which is for making the silicon layer 12 and has a greater thickness than the silicon layer 12. When bonding, bonding surface of each wafer is physically or chemically activated, and then the surfaces are pressed against each other while being heated as necessary. After the bonding, the second silicon wafer is polished by chemical-mechanical polishing (CMP) method, to form a silicon layer 12 of a desired thickness. The CMP methods enable to give silicon layer 12 a highly accurate thickness dimension. Other steps of polishing the silicon material will be described later, for which the CMP method may also be used. Thus, the material substrate S1 shown in FIG. 3A is prepared.

Figure 3B:
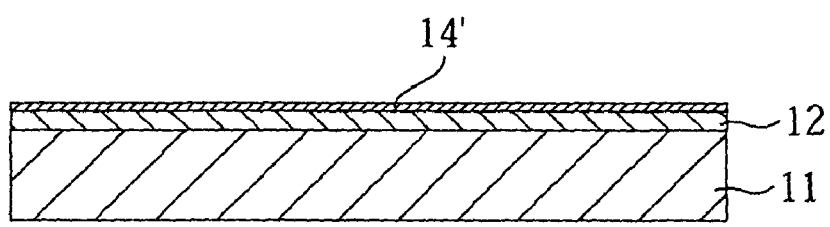

In the present embodiment, next, as shown in FIG. 3B, an oxide film 14' is formed on the surface of silicon layer 12. The oxide film 14' can be formed using CVD method, by forming a film of silicon dioxide on the silicon layer 12. Alternatively, the oxide film 14' may be formed using thermal oxidization method (heating temperature: 900° C. for example), by oxidizing the surface of silicon layer 12. The oxide film 14' may be polished as necessary. The oxide film 14' has a thickness of 0.1-1 μm.

Figure 3C:
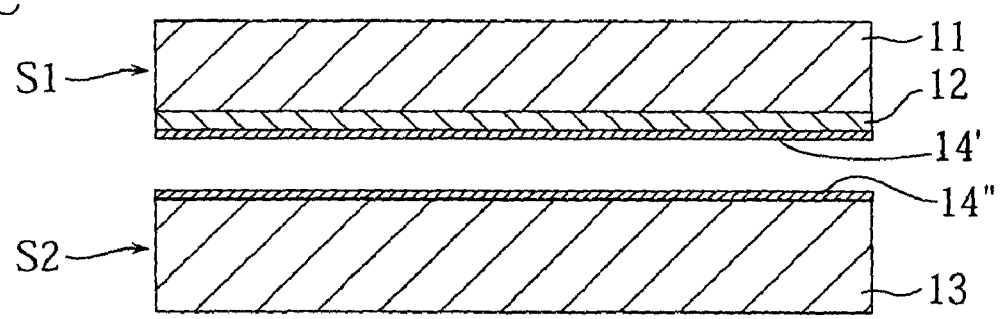
Figure 3D:
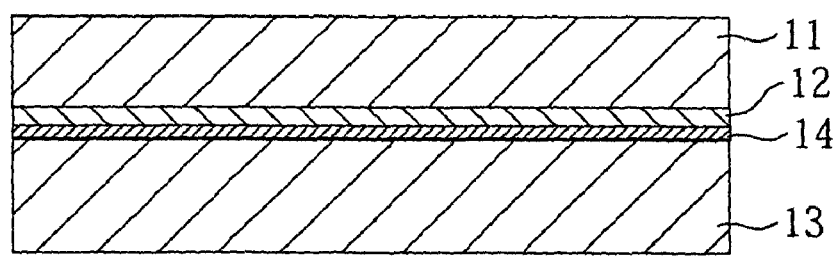

Next, as shown in FIG. 3C and FIG. 3D, the material substrate S1 is bonded to a separately prepared material substrate S2. The material substrate S2 is made of a silicon layer 13 and an oxide film 14" provided by silicon dioxide, and can be formed by forming an oxide film 14" on a surface of the silicon wafer by CVD method or thermal oxidation method (heating temperature: 900° C. for example). The oxide film 14" may be polished as necessary. This particular silicon wafer, and thus the silicon layer 13, is made of a silicon material which is doped with a p-type impurity such as B thereby given electric conductivity. The oxide film 14" has a thickness of 0.1-1 μm for example. Bonding between the material substrate S1 and the material substrate S2 is achieved by a predetermined direct bonding via the oxide film 14' and the oxide film 14". The oxide film 14' and the oxide film 14" are integrated with each other as shown in FIG. 3D, to become an insulating layer 14. The insulating layer 14 has a thickness of 0.2-2 μm for example.

Figure 4A:
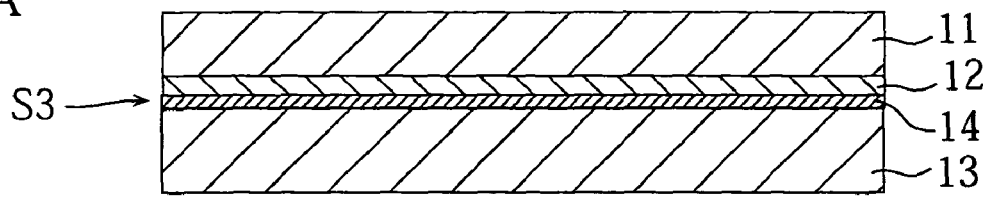
FIG. 4A through FIG. 4D show steps which follow the steps in FIG. 3D.

Next, as shown in FIG. 4A, the silicon layer 11 and the silicon layer 13 are polished to a desired thickness. In this way, the material substrate S3 is made which has a laminate structure including electroconductive silicon layers 11, 12, 13, and an insulating layer 14. In the material substrate S3, the silicon layer 11 has a thickness of 50-100 μm for example, whereas the silicon layer 12 has a thickness, as has been mentioned, of 1-5 μm for example. The silicon layer 13 has a thickness of 50-100 μm for example, and the insulating layer 14 has a thickness, as has been mentioned, of 0.2-2 μm for example.

Figure 4B:
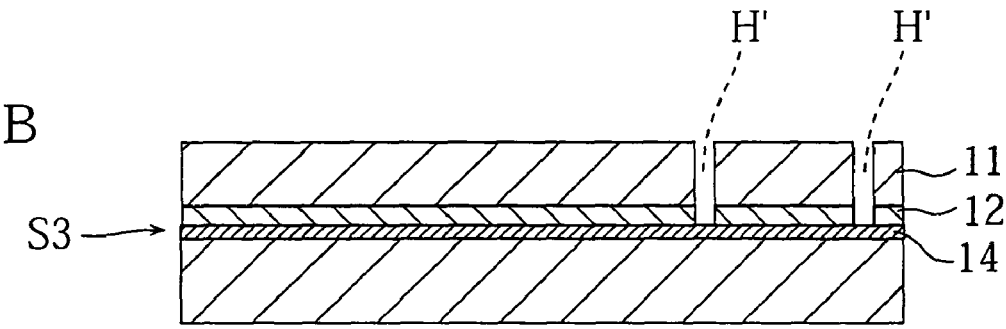

Next, as shown in FIG. 4B, holes H' are formed at predetermined locations of the material substrate S3, to penetrate the silicon layers 11, 12. In forming the holes H', first, a predetermined resist pattern is formed on the silicon layer 11. The resist pattern has openings at locations where the holes H' are formed. Next, using the resist pattern as a mask, etching is performed by DRIE (Deep Reactive Ion Etching), from the side on the silicon layer 11 to the insulating layer 14. The mask for this etching process may not necessarily be a resist pattern. An alternative may be an oxide film pattern or a nitride film pattern.

In the DRIE, good etching is achievable in a Bosch process in which etching and side-wall protection are alternated with each other. The Bosch process may also be used in other DRIE steps to be described later.

Figure 4C:
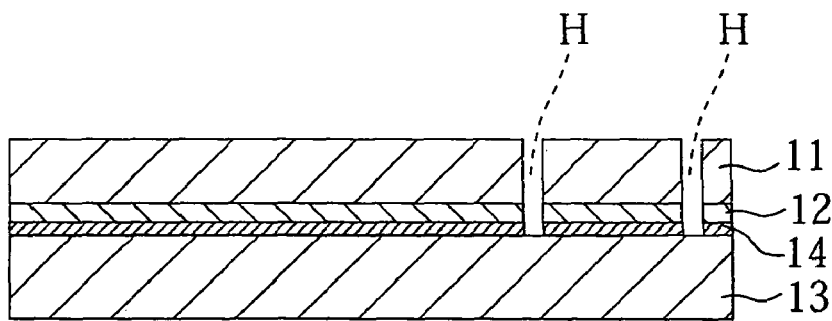

Next, as shown in FIG. 4C, areas in the insulating layer 14 exposed to the holes H' are removed, whereby holes H are formed which penetrate the silicon layers 11, 12 and the insulating layer 14. The removal can be achieved by wet etching or dry etching. If wet etching is used, the etchant used in this process may be buffered hydrofluoric acid (BHF) which contains hydrofluoric acid and ammonium fluoride. If dry etching is used, examples of usable etching gas include hydrogen fluoride. Wet etching and dry etching may also be used when removing an oxide film and an oxide film pattern which are made of silicon dioxide as well as insulating layer to be described later.

Figure 4D:
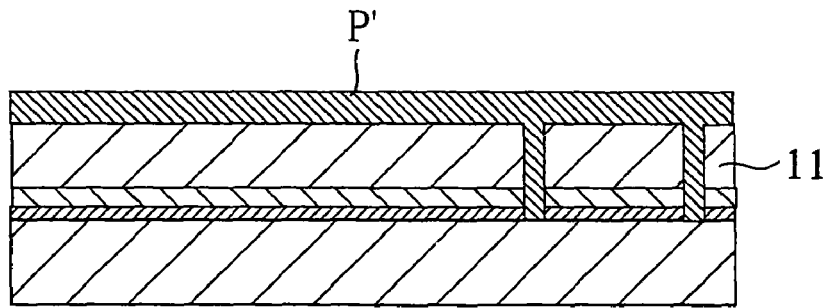

Next, as shown in FIG. 4D, CVD method is used for example, to make a deposit of electroconductive material P' inside the holes H, on the silicon layer 11. Examples of the electroconductive material P' include poly silicon doped with a predetermined impurity, and metals such as Cu and W.

Figure 5A:
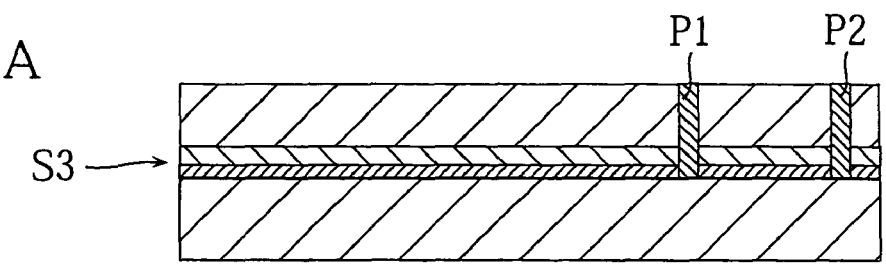
FIG. 5A through FIG. 5D show steps which follow the steps in FIG. 4D.

Next, as shown in FIG. 5A, the deposit of electroconductive material P' on the silicon layer 11 is removed by CMP polishing. These steps leave plugs P1, P2 which are buried in the material substrate S3.

Figure 5B:
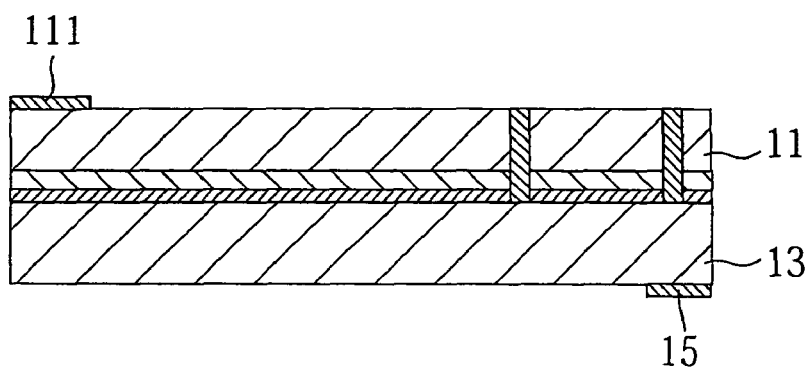

Next, as shown in FIG. 5B, a mirror surface 111 is formed on the silicon layer 11, and an electrode pad 15 (not illustrated in FIG. 1 or FIG. 2) is formed on the silicon layer 13.

In forming the mirror surface 111, first, spattering method is used to form a film of e.g. Cr (50 nm) and then of Au (200 nm) on the silicon layer 11. Next, pattern formation is made by etching these metal films sequentially with predetermined masks, to form the mirror surface 111. Au can be etched by using an etchant such as potassium iodide/iodine aqueous solution. Cr can be etched by using an etchant such as diammonium cerium nitrate aqueous solution.

The electrode pad 15 which has a predetermined pattern can be formed in the same way as the mirror surface 111.

Figure 5C:
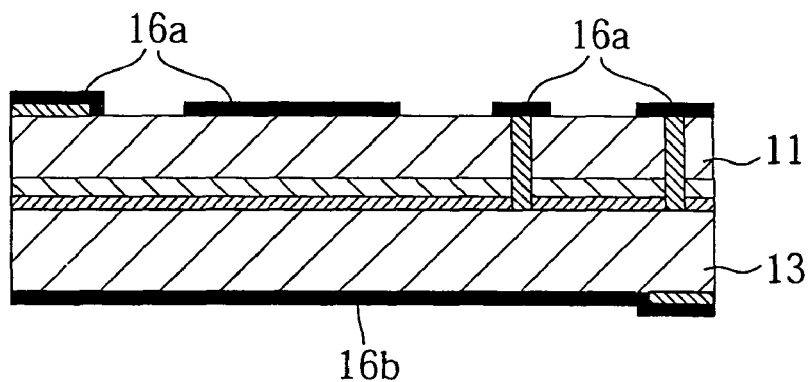

Next, as shown in FIG. 5C, an oxide film pattern 16a is formed on the silicon layer 11, and an oxide film 16b is formed on the silicon layer 13. In forming the oxide film pattern 16a, first, CVD method is used to form a film of silicon dioxide having a thickness of 1 μm for example, on surfaces of the silicon layers 11, 13. This step provides the silicon layer 13 with the oxide film 16b. Next, the oxide film on the silicon layer 11 is patterned by etching via a predetermined resist pattern mask. The etchant used in this patterning may be buffered hydrofluoric acid (BHF) which contains hydrofluoric acid and ammonium fluoride. Other oxide film patterns to be described later are also formed through the step of forming a resist pattern on an oxide film and a step of etching thereafter. The oxide film pattern 16a serves as a mask in later steps shown in FIG. 6A through FIG. 6C, to mask regions of the material substrate S3 which are to become the mirror region M, the inner frame F1, the comb-teeth electrode E1, part of the inner frame F2, and part of the outer frame F3.

Figure 5D:
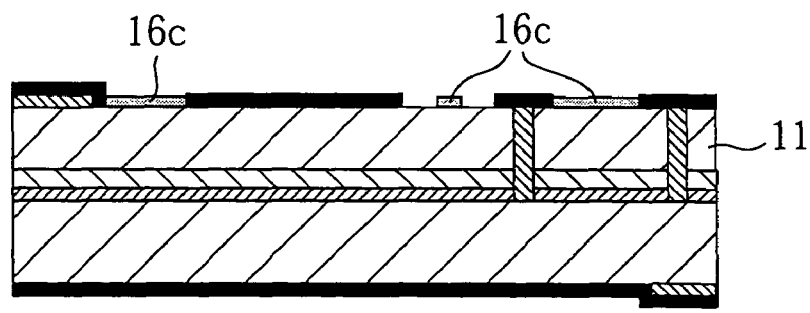

Next, as shown in FIG. 5D, a resist pattern 16c is formed on the silicon layer 11. In forming the resist pattern 16c, first, a liquid photoresist is spin-coated on the silicon layer 11. Next, the photo-resist film is patterned through an exposure process and a development process thereafter. Examples of the photoresist include AZP 4210 (made by Clariant Japan) and AZ 1500 (made by Clariant Japan). Other resist patterns to be described later are also formed through the same steps of photo-resist film formation, exposure process and development process. The resist pattern 16c serves as a mask in the step shown in FIG. 6A, to mask parts of the silicon layer 11 which correspond to regions in the silicon layer 12 to become the torsion bars T1-T3.

Next, as shown in FIG. 6A, the silicon layer 11 is etched to a predetermined depth, using the oxide film pattern 16a and resist pattern 16c as masks in DRIE. The predetermined depth is determined appropriately depending upon the thickness of the torsion bars T1-T3, i.e. the thickness of the silicon layer 12. The type of the etching is anisotropic ion etching in which etching speed in the silicon layer 11 is faster in the thickness direction than in the in-plane directions. After the etching process, the resist pattern 16c is removed. The remover used for removing the resist pattern 16c may be AZ Remover 700 (made by Clariant Japan). This remover is also usable in other removal operations of a resist pattern to be described later.

Next, as shown in FIG. 6B, using the oxide film pattern 16a as a mask, etching is performed by DRIE, from the side on the silicon layer 11 to the insulating layer 14. The type of the etching is anisotropic ion etching in which etching speed in the silicon layers 11, 12 is faster in the thickness direction than in the in-plane directions. This operation yields pre torsion bars T1'-T3' each having a pair of sides separated in in-plane directions of the silicon layer 12 and making contact with the silicon material 11a which originates from the silicon layer 11, and with the insulating layer 14. The pre torsion bars T1'-T3' originates from the silicon layer 12. Note that this etching process also yields the mirror region M, the inner frame F1, part of the inner frame F2, and part of the outer frame F3.

Next, as shown in FIG. 6C, using the oxide film pattern 16a and the oxide film 16b as masks, the silicon material 11a is removed by wet etching method. The etchant used in this process may be EPW (ethylendiamine, pyrocatechol and water), TMAH (tetramethyl ammonium hydroxide), or water solution of potassium hydroxide.

In this wet etching, the silicon layer 12 or the pre torsion bars T1'-T3' are etched at a very much slower speed than the silicon layer 11 or the silicon material 11a. Therefore, it is possible to appropriately remove the silicon material 11a while preserving the pre torsion bars T1'-T3', in this etching process. The difference in etching speed is due to the difference in dopant concentration in the silicon materials. As described earlier, the dopant concentration in the silicon layer 12 is preferably 100 times or greater than the dopant concentration in the silicon layer 11.

Next, as shown in FIG. 6D, by CVD method or spin-on glass application method, a film of silicon dioxide is formed on the material substrate S3 over the oxide film pattern 16a, whereby an oxide film 16d is formed. The oxide film 16d protects surfaces of the structure which is formed on the insulating layer 14 and drawn on an upper side of the layer as in the drawing.

Next, as shown in FIG. 7A, an oxide film pattern 16e is formed from part of the oxide film 16d, and an oxide film pattern 16f is formed form the oxide film 16b. The oxide film pattern 16e serves as a mask in a step to be described later with reference to FIG. 7B, where masking is made to a region on the material substrate S3 which are to be formed into the comb-teeth electrode E1. The oxide film pattern 16f serves as a mask in a step to be described later with reference to FIG. 7C, where masking is made to regions on the material substrate S3 which are to be formed into the comb-teeth electrode E2, part of the inner frame F2, and part of the outer frame F3.

Next, as shown in FIG. 7B, using the oxide film 16d and the oxide film pattern 16e as masks, etching is performed by DRIE, from the side on the silicon layer 11 to the insulating layer 14, which yields the comb-teeth electrode E1.

Next, as shown in FIG. 7C, using the oxide film pattern 16f as a mask, etching is performed by DRIE, from the side on the silicon layer 13 to the insulating layer 14, which yields part of the comb-teeth electrode E2, part of the inner frame F2, and part of the outer frame F3.

Next, as shown in FIG. 7D, etching is made in order to remove the oxide film 16d, the oxide film pattern 16e, the oxide film pattern 16f, and exposed parts in the insulating layer 14. In this etching process, parts of the insulating layer 14 which make contact with the pre torsion bars T1'-T3' are removed, to form the torsion bars T1-T3.

The above-described series of steps yield the mirror region M, the torsion bars T1-T3, the inner frames F1, F2, the comb-teeth electrodes E1, E2, and the outer frame F3. In other words, the micromirror element X1 shown in FIG. 1 and FIG. 2 is manufactured.

In the present embodiment, it is possible to form a silicon layer 12 which has a highly accurate thickness dimension, in the manufacturing process of making the material substrate S1 described earlier with reference to FIG. 3A. The torsion bars T1-T3, which are thin wall portions of the micromirror element X1, are formed from such a silicon layer 12, at the same thickness as the silicon layer 12, and therefore have a highly accurate thickness dimension.

The mirror region M formed in the present embodiment has a part which originates from the silicon layer 11, and a part which originates from the silicon layer 12 and is continuous to the torsion bar T1. These two parts are electroconductive. The inner frame F1 has a part which originates from the silicon layer 11, and a part which originates from the silicon layer 12 and is continuous to the torsion bar T1. These two parts are electroconductive. Therefore, the mirror region M (mirror region 110) and the inner frame F1 (inner frame 120) are electrically connected with each other via the torsion bar T1 (torsion bar 141).

Similarly, the inner frame F2 has a part which originates from the silicon layer 11, a part which originates from the silicon layer 12 and is continuous to the torsion bar T3, and a part which originates from the silicon layer 13. These three parts are electroconductive, and are electrically connected with each other via the plug P1. The outer frame F3 has a part which originates from the silicon layer 11, a part which originates from the silicon layer 12 and is continuous to the torsion bar T3, and a part which originates from the silicon layer 13. These three parts are electroconductive and are electrically connected with each other via the plug P2. Therefore, the parts which originate from the silicon layer 13 in the inner frame F2 (inner frame 120) are electrically connected with the parts which originate from the silicon layer 13 in outer frame F3 (outer frame 130), via the torsion bar T3 (torsion bar 151).

The present embodiment may be varied in terms of electrical connection between the inner frame F2 and the outer frame F3, by not making the plug P1 or the plug P2. For example, if the plug P1 is not made, it is then possible to form electrical isolation between the part of the inner frame F2 which originates from the silicon layer 13 and the part of the outer frame F3 which originates from the silicon layer 13.

In the micromirror element X1 manufactured in accordance with the present embodiment, appropriate selections may be made for the mode of electrical connection made by each torsion bar 151 included in the connecting regions 150, and appropriate electrical paths may be formed inside the inner frame 120 and outer frame 130 so that each torsion bar 151 will not make inappropriate short circuit. Then, it becomes possible to transfer a plurality of electric potentials via a plurality of torsion bars 151, from the outer frame 130 to the inner frame 120. Thus, it becomes possible to individually control the amount of electric potential to be applied to each comb-teeth electrode.

Figure 8:
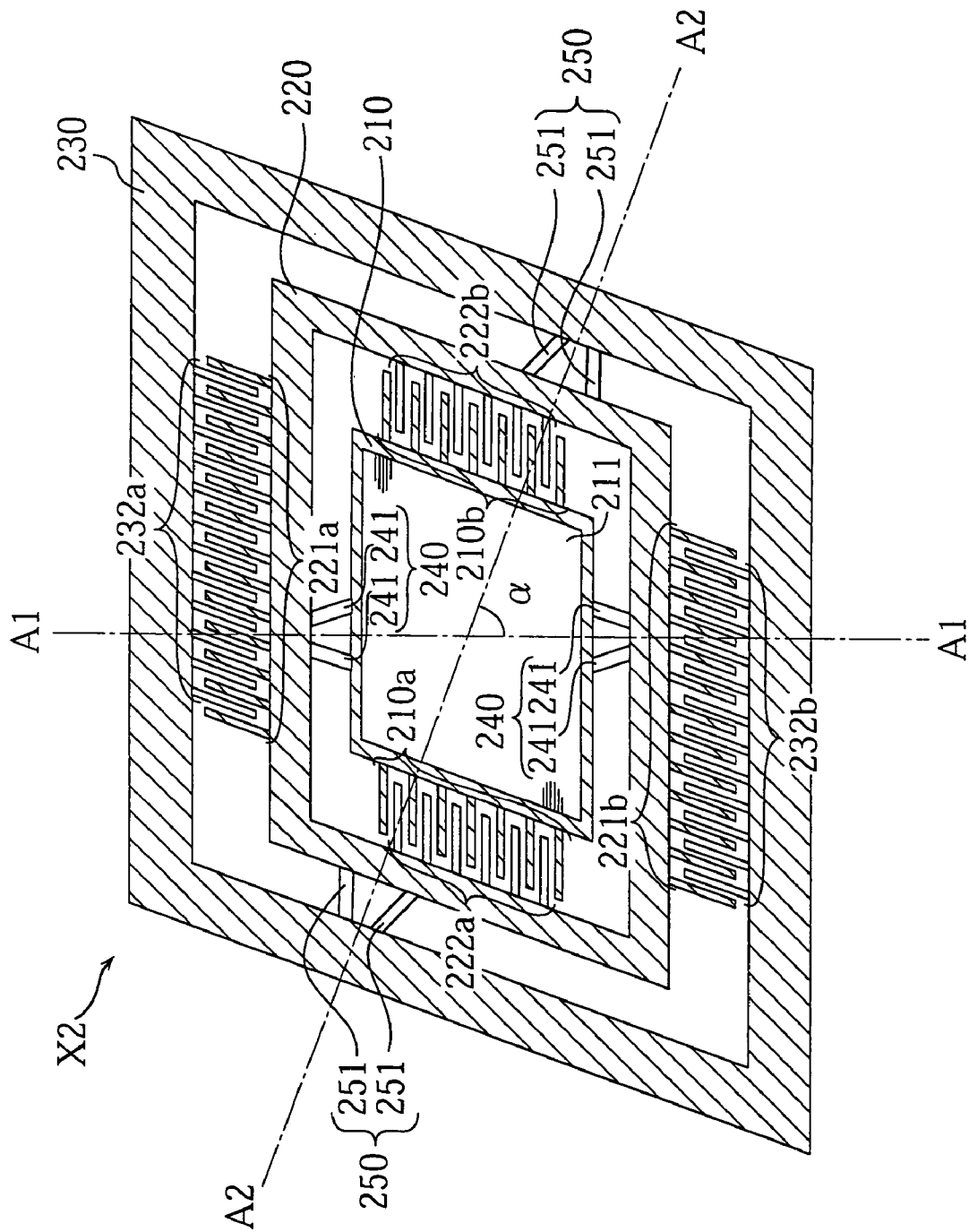
FIG. 8 is a plan view of a micromirror element as another example of the microstructure which can be manufactured according to the present invention.

FIG. 8 shows a micromirror element X2 as an example of microstructures which can be manufactured according to the present invention.

The micromirror element X2 is formed by micromachining technology, from a material substrate having a predetermined laminate structure which includes an electroconductive silicon material layer. The element includes a mirror region 210, an inner frame 220, an outer frame 230, a pair of connecting regions 240 and a pair of connecting regions 250. The connecting regions 240 provide connection between the mirror region 210 and the inner frame 220, and provide an axis A1 for a pivotal action of the mirror region 210 with respect to the inner frame 220. The connecting regions 250 provide connection between the inner frame 220 and the outer frame 230, and provide an axis A2 for a pivotal action of the inner frame 220 with respect to the outer frame 230, and for a pivotal action of the mirror region 210 associating therewith. The connecting regions 240, 250 have their axes A1 and A2 cross each other at an angle α of 70.5°. In FIG. 8, hatching indicates regions which are higher than the connecting regions 240, 250, protruding above the paper surface, toward the viewer (except for a mirror surface 211 to be described later).

The mirror region 210 has a pair of mutually parallel sides formed integrally with a pair of outwardly extended comb-teeth electrodes 210a, 210b. The mirror region 210 has an upper surface provided with the mirror surface 211.

The inner frame 220 is integrally formed with outwardly extended comb-teeth electrodes 221a, 221b, and is integrally formed with inwardly extended comb-teeth electrodes 222a, 222b. The comb-teeth electrode 222a is disposed so that the teeth of the comb-teeth electrode 210a will not make contact with the teeth of the comb-teeth electrode 222a when the mirror region 210 pivots. Likewise, the comb-teeth electrode 222b is disposed so that the teeth of the comb-teeth electrode 210b will not make contact with the teeth of the comb-teeth electrode 222b when the mirror region 210 pivots.

The outer frame 230 is integrally formed with inwardly extended comb-teeth electrodes 232a, 232b. The comb-teeth electrode 232a is disposed so that the teeth of the comb-teeth electrode 221a will not make contact with the teeth of the comb-teeth electrode 232a when the inner frame 220 pivots with respect to the outer frame 230. Likewise, the comb-teeth electrode 232b is disposed so that the teeth of the comb-teeth electrode 221b will not make contact with the teeth of the comb-teeth electrode 232b when the inner frame 220 pivots.

Each of the connecting regions 240 includes two torsion bars 241 which are separated from each other. Each torsion bar 241 connects with the mirror region 210 and with the inner frame 220, and is thinner than them. The distance between the two torsion bars 241 gradually increases from the side on the inner frame 220 toward the side on the mirror region 210.

One pair of the connecting regions 240 connects with the mirror region 210 at a place closer to the comb-teeth electrode 210a than to comb-teeth electrode 210b whereas the other pair of the connecting regions 240 connects with the mirror region 210 at a place closer to the comb-teeth electrode 210b than to the comb-teeth electrode 210a. The side surface of the mirror region 210 which makes connection with the connecting regions 240, and the side surface of the inner frame 220 which makes connection with the connecting regions 240 are perpendicular to the axis A1 which is provided by the pair of connecting regions 240.

Each of the connecting regions 250 includes two torsion bars 251 which are separated from each other. Each torsion bar 251 connects with the inner frame 220 and with the outer frame 230, and is thinner than them. The distance between the two torsion bars 251 gradually increases from the side on the outer frame 230 toward the side on the inner frame 220.

One pair of the connecting regions 250 connects with the inner frame 220 at a place closer to the comb-teeth electrode 221a than to comb-teeth electrode 221b whereas the other pair of the connecting regions 250 connects with the inner frame 220 at a place closer to the comb-teeth electrode 221b than to the comb-teeth electrode 221a. The side surface of the inner frame 220 which makes connection with the connecting regions 250, and the side surface of the outer frame 230 which makes connection with the connecting regions 250 are perpendicular to the axis A2 which is provided by the pair of connecting regions 250.

The location where the connecting regions 240, 250 are formed, and shapes of the torsion bars 241, 551 included therein are appropriately varied depending on mechanical characteristics required of the connecting regions 240, 250, a driving mode of the element, and a manufacturing method of the element.

As described, the micromirror element X2 has: the connecting regions 240 or the torsion bars 241 which are thinner than the mirror region 210 and the inner frame 220 and can serve as electrical paths between the mirror region 210 and the inner frame 220; and the connecting regions 250 or the torsion bars 251 which are thinner than the inner frame 220 and the outer frame 230 and can serve as electrical paths between the inner frame 220 and the outer frame 230.

FIG. 9A through FIG. 12C show a series of steps of a manufacturing method for the microstructure according to the second embodiment of the present invention. The method is an example through which the micromirror element X2 described above is manufactured by micromachining technology. Throughout FIG. 9A to FIG. 12C, views of a section will be given in a manner similar to FIG. 3A through FIG. 7D, to illustrate a process of forming a mirror region M, torsion bars T1-T3, inner frames F1, F2, a pair of comb-teeth electrodes E1, E2, and an outer frame F3.

Figure 9A:
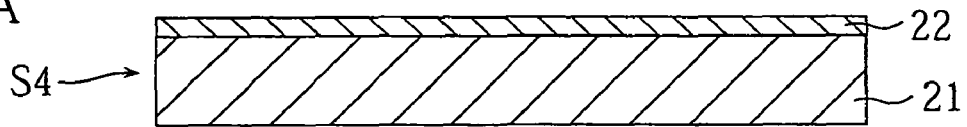
FIG. 9A through FIG. 9D show a few steps of a micromirror element manufacturing method according to a second embodiment of the present invention.

In the method of manufacturing the microstructure according to the second embodiment, a material substrate S4 as shown in FIG. 9A is prepared first. The material substrate S4 has a laminate structure which includes a silicon layer 21 and a silicon layer 22.

The silicon layer 21 is made of a silicon material which is doped with a p-type impurity such as B thereby given electric conductivity. The concentration of B dopant in the silicon layer 21 is $1\times10^{17}$-$1\times10^{18}$ atom/cm$^3$ for example. The silicon layer 21 has a crystal structure in which (110) surface extends in in-plane directions of the layer and has two (100) surfaces which are perpendicular to the (110) surface.

The silicon layer 22 is made of a silicon material which is doped with a p-type impurity such as B thereby given electric conductivity. The layer has a thickness of 1-5 µm for example. The thickness represents the thickness of the torsion bars T1-T3. The concentration of B dopant in the silicon layer 22 is higher than that in the silicon layer 21, being $1\times10^{19}$ atom/cm$^3$ or greater for example. Preferably, the dopant concentration in the silicon layer 22 is 100 times or greater than the dopant concentration in the silicon layer 21.

The material substrate S4 is made in the same way as the material substrate S1 of the first embodiment. Therefore, the silicon layer 22 of the material substrate S4 is formed by CMP method, i.e. by polishing a silicon wafer to a desired thickness, and thus has a highly accurate thickness dimension.

Figure 9B:
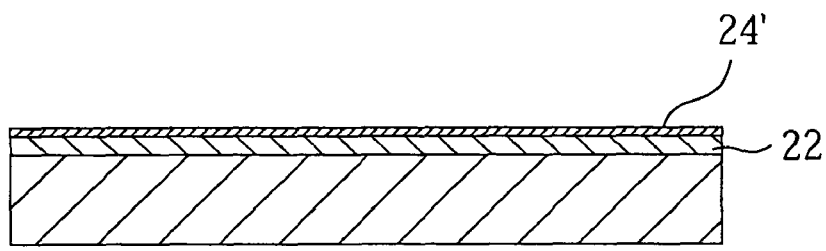

In the present embodiment, next, as shown in FIG. 9B, an oxide film 24' is formed on the surface of silicon layer 22. The oxide film 24' can be formed using CVD method, by forming a film of silicon dioxide on the silicon layer 12. Alternatively, the oxide film 24' may be formed using thermal oxidization method (heating temperature: 900° C. for example), by oxidizing the surface of silicon layer 21.

Figure 9C:
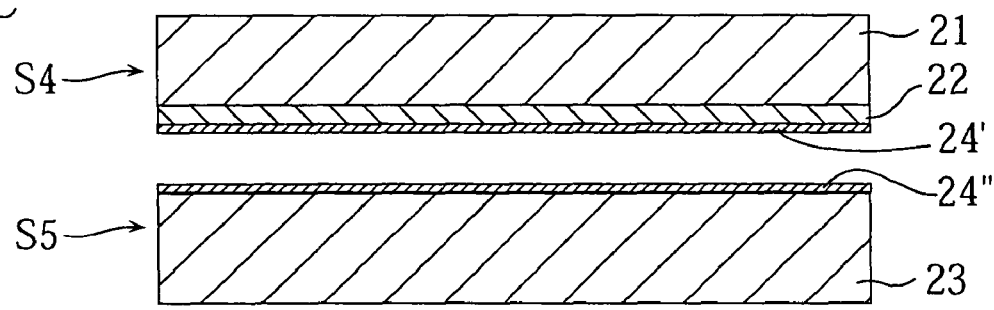
Figure 9D:
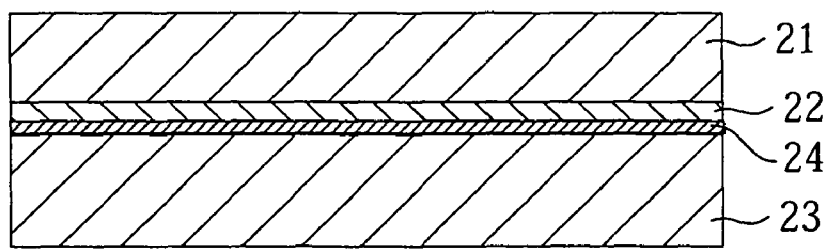

Next, as shown in FIG. 9C and FIG. 9D, the material substrate S4 is bonded to a separately prepared material substrate S5. The material substrate S5 is made of a silicon layer 23 and an oxide film 24" provided by silicon dioxide, and can be formed by forming an oxide film 24" on a surface of the silicon wafer by CVD method or thermal oxidation method (heating temperature: 900° C. for example). The oxide film 24" has a thickness of 0.1-1 µm for example. The oxide film 24' and the oxide film 24" are integrated with each other as shown in FIG. 9D, to become an insulating layer 24. The insulating layer 24 has a thickness of 0.2-2 µm for example. This particular silicon wafer, and thus the silicon layer 23, is made of a silicon material which is doped with a p-type impurity such as B thereby given electric conductivity. The silicon layer 23 has a crystal structure in which (110) surface extends in in-plane directions of the layer and two (111)

surfaces are perpendicular to this (110) surface. Bonding between the material substrate S4 and the material substrate S5 is made so that the two (111) surfaces in the silicon layer 21 and the two (111) surfaces in the silicon layer 24 orient in the same direction. Bonding between the material substrate S1 and the material substrate S2 is achieved by a predetermined direct bonding via the oxide film 14" and the oxide film 14".

Figure 10A:
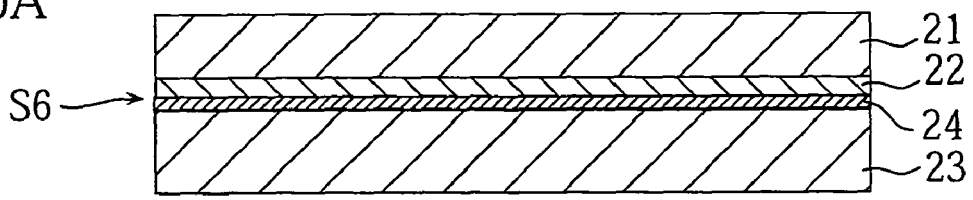
FIG. 10A through FIG. 10D show steps which follow the steps in FIG. 9D.

Next, as shown in FIG. 10A, the silicon layer 21 and the silicon layer 23 are polished to a desired thickness. In this way, a material substrate S6 is made which has a laminate structure including electroconductive silicon layers 21, 22, 23, and an insulating layer 24. In the material substrate S6, the silicon layer 21 has a thickness of 50-100 μm for example, whereas the silicon layer 22 has a thickness, as has been mentioned, of 1-5 μm for example. The silicon layer 23 has a thickness of 50-100 μm for example, and the insulating layer 24 has a thickness, as has been mentioned, of 0.2-2 μm for example.

Figure 10B:
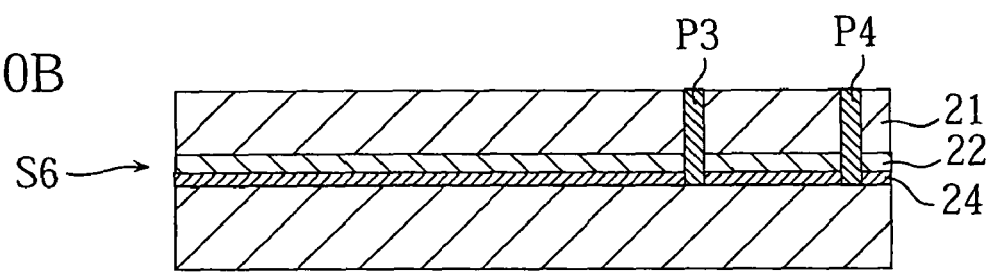

Next, as shown in FIG. 10B, at predetermined locations in the material substrate S6, plugs P3, P4 are formed which penetrate the silicon layer 21, the silicon layer 22, and the insulating layer 24, to reach the silicon layer 23. The plugs P3, P4 can be formed in the same way as the plugs P1, P2 described in the first embodiment with reference to FIG. 4B through FIG. 5A.

Figure 10C:
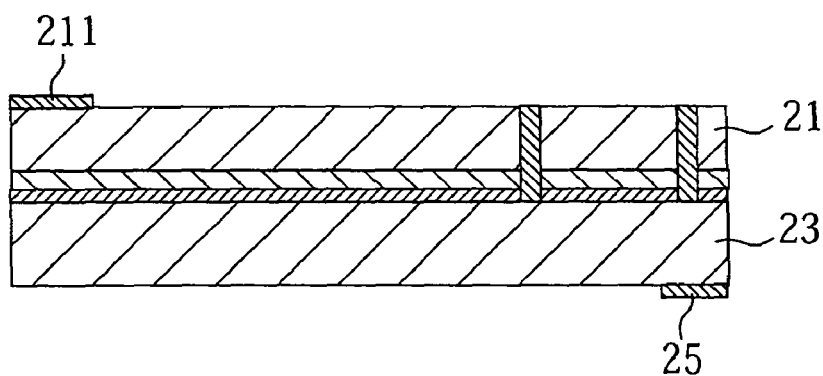

Next, as shown in FIG. 10C, a mirror surface 211 is formed on the silicon layer 21, and an electrode pad 25 (not illustrated in FIG. 8) is formed on the silicon layer 23. The mirror surface 211 and the electrode pad 25 can be formed in the same way respectively as the mirror surface 111 and the electrode pad 15 described in the first embodiment.

Figure 10D:
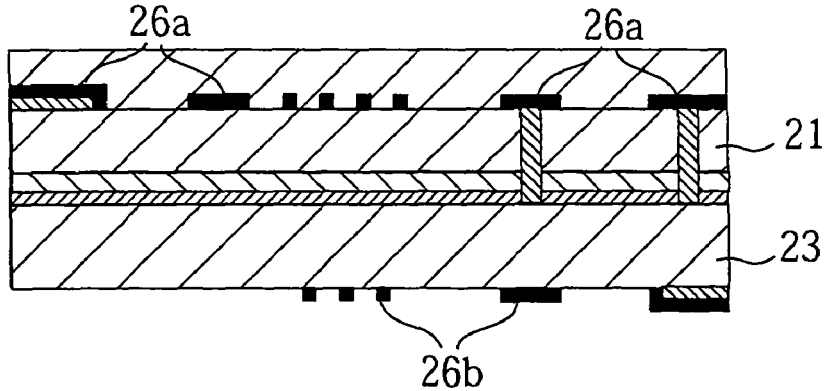

Next, as shown in FIG. 10D, an oxide film pattern 26a is formed on the silicon layer 21, and an oxide film pattern 26b is formed on the silicon layer 23. The oxide film pattern 26a serves as a mask in later steps shown in FIG. 11B, FIG. 11C and FIG. 12B, to mask regions of the material substrate S6 which are to become the mirror region M, the inner frame F1, the comb-teeth electrode E1, part of the inner frame F2, and part of the outer frame F3. The oxide film pattern 26a has an outline which follows the two kinds of (111) surfaces in the silicon crystal material that constitute the silicon layer 21. The oxide film pattern 26b serves as a mask in later steps shown in FIG. 12A and FIG. 12B, to mask regions of the material substrate S6 which are to become the comb-teeth electrode E2, part of the inner frame F2, and part of the outer frame F3. The oxide film pattern 26b has an outline which follows the two kinds of (111) surfaces in the silicon crystal material that constitute the silicon layer 23.

Figure 11A:
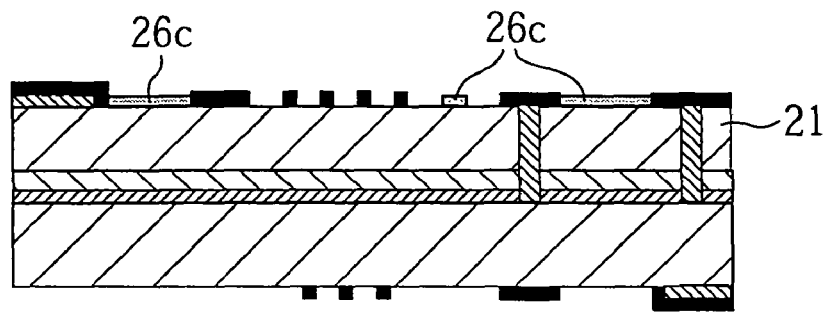
FIG. 11A through FIG. 11C show steps which follow the steps in FIG. 10D.

Next, as shown in FIG. 11A, a resist pattern 26c is formed on the silicon layer 21. The resist pattern 26c serves as a mask in the step shown in FIG. 11B, to mask parts of the silicon layer 22 which correspond to regions in the silicon layer 22 to become the torsion bars T1-T3.

Figure 11B:
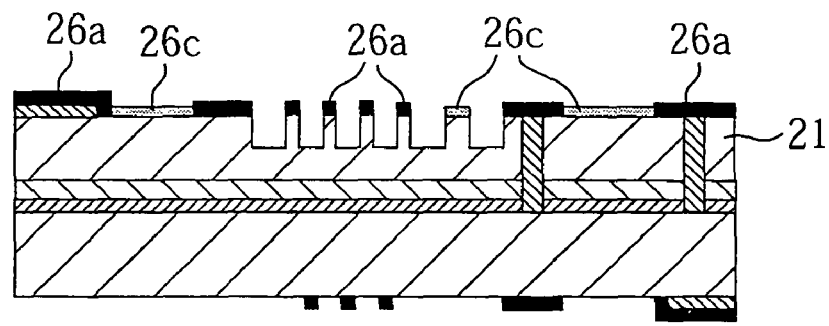

Next, as shown in FIG. 11B, the silicon layer 21 is etched to a predetermined depth, using the oxide film pattern 26a and the resist pattern 26c as masks in DRIE. The predetermined depth is determined appropriately depending upon the thickness of the torsion bars T1-T3, i.e. the thickness of the silicon layer 12. The type of the etching is anisotropic ion etching in which etching speed in the silicon layer 21 is faster in the thickness direction than in the in-plane directions. After the etching process, the resist pattern 26c is removed.

Figure 11C:
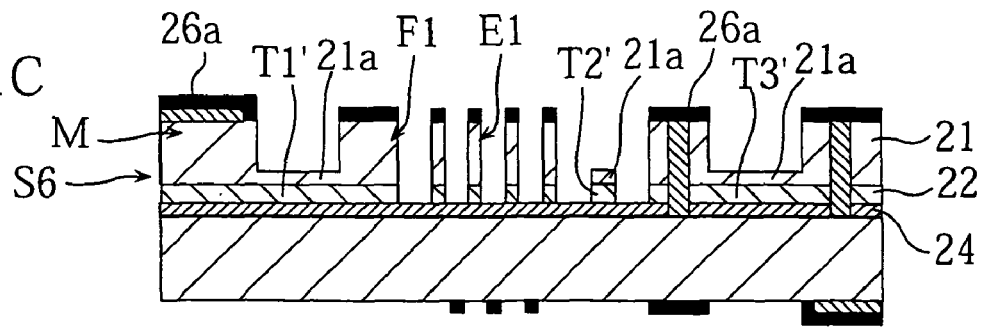

Next, as shown in FIG. 11C, using the oxide film pattern 26a as a mask, etching is performed by DRIE, from the side on the silicon layer 21 to the insulating layer 24. The type of the etching is anisotropic ion etching in which etching speed in the silicon layers 21, 22 is faster in the thickness direction than in in-plane directions. This operation yields pre torsion bars T1'-T3' which have a pair of side surfaces apart in an in-plane direction of the silicon layer 12. Each pre torsion bar makes contact with the silicon material 21a which originates from the silicon layer 21 and with the insulating layer 24. The pre torsion bars T1'-T3' originate from the silicon layer 22. Note that this etching process also yields the mirror region M, the inner frame F1, the comb-teeth electrode E1, part of the inner frame F2, and part of the outer frame F3.

Figure 12A:
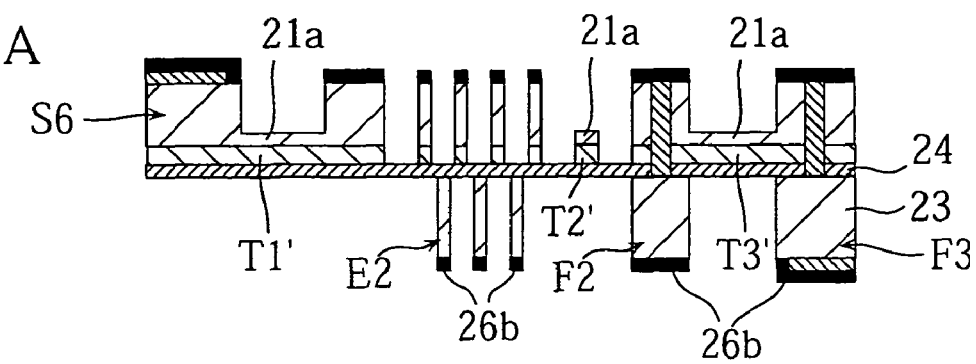
FIG. 12A through FIG. 12C show steps which follow the steps in FIG. 11C.

Next, as shown in FIG. 12A, using the oxide film pattern 26b as a mask, etching is performed by DRIE, from the side on the silicon layer 23 to the insulating layer 24, which yields the comb-teeth electrode E2, part of the inner frame F2 and part of the outer frame F3.

Figure 12B:
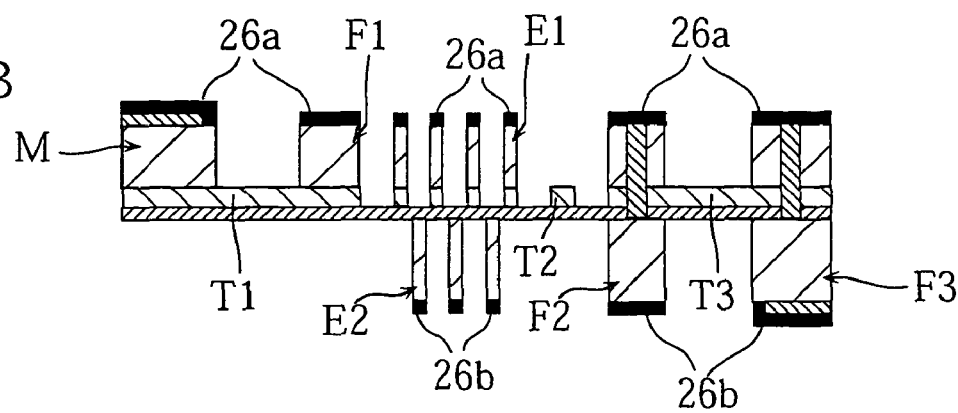

Next, as shown in FIG. 12B, using the oxide film pattern 26a and the oxide film pattern 26b as masks, the silicon material 21a is removed by wet etching method. The etchant for this operation may be the same as used in the first embodiment for removal of the silicon material 11a.

In this wet etching, the silicon layer 22 or the pre torsion bars T1'-T3' are etched at a very much slower speed than the silicon layer 21 or the silicon material 21a. Therefore, it is possible to appropriately remove the silicon material 21a while preserving the pre torsion bars T1'-T3', in this etching process.

Further, side surfaces of the mirror region M, inner frames F1, F2, comb-teeth electrodes E1, E2, and outer frame F3 are a (111) surface of the silicon crystal. Thus, the etching speed in a direction perpendicular to this surface is very slow in this etching process, creating no undesirable level of erosion.

Figure 12C:
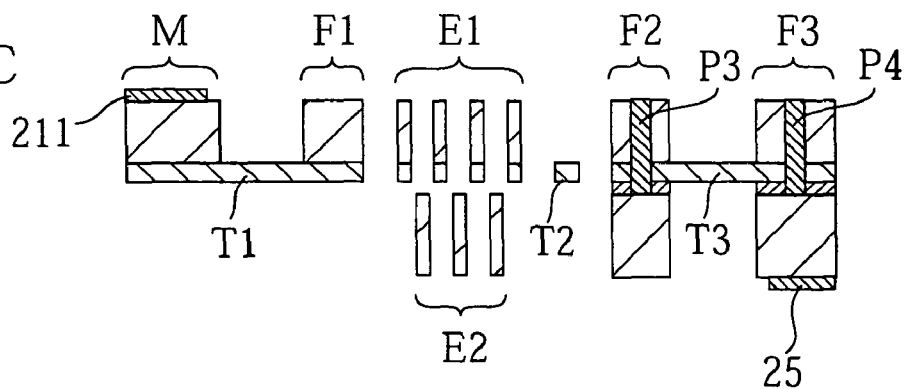

Next, as shown in FIG. 12C, etching is made in order to remove the oxide film 26a, the oxide film pattern 26b and exposed parts in the insulating layer 24. In this etching process, parts of the insulating layer 24 which make contact with the pre torsion bars T1'-T3' are removed, to form the torsion bars T1-T3.

The above-described series of steps yield the mirror region M, the torsion bars T1-T3, the inner frames F1, F2, the comb-teeth electrodes E1, E2, and the outer frame F3. In other words, the micromirror element X2 shown in FIG. 8 is manufactured.

In the present embodiment, it is possible to form a silicon layer 22 which has a highly accurate thickness dimension, in the manufacturing process of making the material substrate S4 described earlier with reference to FIG. 9A. The torsion bars T1-T3, which are thin wall portions of the micromirror element X2, are formed from such a silicon layer 22, at the same thickness as the silicon layer 22, and therefore have a highly accurate thickness dimension.

The mirror region M formed in the present embodiment has a part which originates from the silicon layer 21, and a part which originates from the silicon layer 22 and is continuous to the torsion bar T1. These two parts are electroconductive. The inner frame F1 has a part which originates from the silicon layer 21, and a part which originates from the silicon layer 22 and is continuous to the torsion bar T1. These two parts are electroconductive. Therefore, the mirror region M (mirror region 210) and the inner frame F1 (inner frame 220) are electrically connected with each other via the torsion bar T1 (torsion bar 241).

Similarly, the inner frame F2 has a part which originates from the silicon layer 21, a part which originates from the silicon layer 22 and is continuous to the torsion bar T3, and a part which originates from the silicon layer 23. These three parts are electroconductive, and are electrically connected with each other via the plug P3. The outer frame F3 has a part which originates from the silicon layer 21, a part which originates from the silicon layer 22 and is continuous to the torsion bar T3, and a part which originates from the silicon layer 23. These three parts are electroconductive and are electrically connected with each other via the plug P4. Therefore, the parts which originate from the silicon layer 23 in the inner frame F2 (inner frame 220) are electrically connected with the parts which originate from the silicon layer 23 in outer frame F3 (outer frame 230), via the torsion bar T3 (torsion bar 251).

The present embodiment may be varied in terms of electrical connection between the inner frame F2 and the outer frame F3, by not making the plug P3 or the plug P4. For example, if the plug P3 is not made, it is then possible to form electrical isolation between the part of the inner frame F2 which originates from the silicon layer 23 and the part of the outer frame F3 which originates from the silicon layer 23.

In the micromirror element X2 manufactured in accordance with the present embodiment, appropriate selections may be made for the mode of electrical connection made by each torsion bar 251 included in the connecting regions 250, and appropriate electrical paths may be formed inside the inner frame 220 and outer frame 230 so that each torsion bar 251 will not make inappropriate short circuit. Then, it becomes possible to transfer a plurality of electric potentials via a plurality of torsion bars 251, from the outer frame 230 to the inner frame 220. Thus, it becomes possible to individually control the amount of electric potential to be applied to each comb-teeth electrode.

According to the present embodiment, regions on the material substrate S6 which are to be formed into the mirror region M, the inner frames F1, F2, the comb-teeth electrodes E1, E2, and the outer frame F3 are masked by the oxide film pattern 26a, 26b whose outlines follow the two kinds of (111) surfaces in the silicon crystal structure that constitute the material substrate S6. Therefore, the etching process using the masks provided by the oxide film patterns 26a, 26b forms outlines of the mirror region M, the inner frames F1, F2, the comb-teeth electrodes E1, E2, and the outer frame F3. Specifically, side surfaces of the mirror region 210, inner frame 220, comb-teeth electrodes 210a, 210b, 221a, 221b, 222a, 222b, 232a, 232b, and outer frame 230 are provided by the (111) surfaces of the crystal structure of this silicon material, and as mentioned earlier, the two kinds of (111) surfaces cross each other at 70.5°. For this reason, it is possible according to the present embodiment to manufacture the micromirror element X2 as shown in FIG. 8.

FIG. 13A through FIG. 17C show a series of steps of a manufacturing method for the microstructure according to a third embodiment of the present invention. The method is an example through which the micromirror element X1 described earlier is manufactured by micromachining technology. Throughout FIG. 13A to FIG. 17C, views of a section will be given to illustrate a process of forming a mirror region M, torsion bars T1-T4, inner frames F1, F2, a pair of comb-teeth electrodes E1, E2, and an outer frame F3. The torsion bar T4 corresponds to a torsion bar 151 and is expressed in a longitudinal section along a direction in which the bar extends.

Figure 13A:
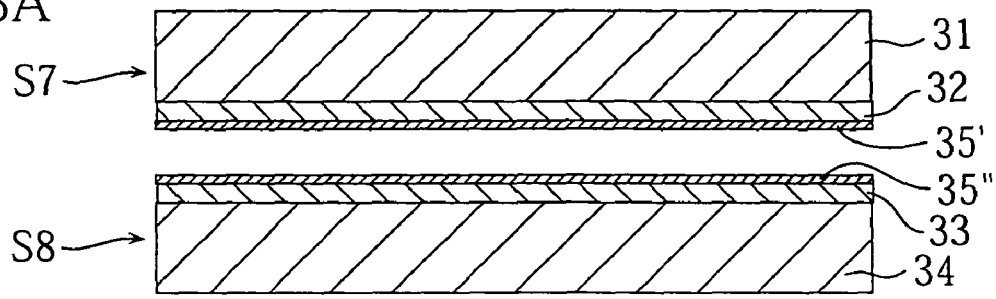
FIG. 13A through FIG. 13D show a few steps of a micromirror element manufacturing method according to a third embodiment of the present invention.

In the method of manufacturing the microstructure according to the third embodiment, a material substrates S7, S8 as shown in FIG. 13A are prepared first. The material substrate S7 has a laminate structure which includes a silicon layer 31, a silicon layer 32 and an oxide film 35'. The material substrate S8 has a laminate structure which includes a silicon layer 33, a silicon layer 34 and an oxide film 35''.

The silicon layers 31, 34 are made of a silicon material which is doped with a p-type impurity such as B thereby given electric conductivity. The concentration of B dopant in the silicon layers 31, 34 is $1\times10^{17}$-$1\times10^{18}$ atom/cm$^3$ for example. The silicon layers 21, 34 have a crystal structure in which (110) surface or (100) surface extends in in-plane directions of the layer.

The silicon layers 32, 33 are made of a silicon material which is doped with a p-type impurity such as B thereby given electric conductivity. The silicon layer 32 has a thickness of 1-5 µm for example. The thickness represents the thickness of the torsion bars T1-T3. The silicon layer 33 has a thickness of 1-5 µm for example. The thickness represents the thickness of the torsion bars T4. The concentration of B dopant in the silicon layers 32, 33 is higher than that in the silicon layers 31, 34, being $1\times10^{19}$ atom/cm$^3$ or greater for example. Preferably, the dopant concentration in the silicon layers 32, 33 is 100 times or greater than the dopant concentration in the silicon layers 31, 34.

The material substrates S7, S8 are made in the same way as has been described with reference to FIG. 3A and FIG. 3B for the first embodiment. Therefore, the silicon layer 32 of the material substrate S7 and the silicon layer 33 of the material substrate S8 are formed by CMP method, by polishing a silicon wafer to a desired thickness, and thus have a highly accurate thickness dimension.

Figure 13B:
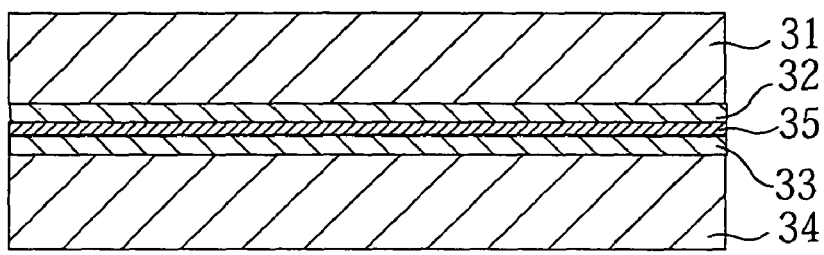

Next, in the present embodiment, as shown in FIG. 13B, the material substrates S7 and the material substrate S8 are bonded to each other. The bonding between the material substrate S7 and the material substrate S8 is achieved by a predetermined direct bonding via the oxide film 35' and the oxide film 35''. The oxide film 35' and the oxide film 35'' are integrated with each other to become the insulating layer 35. The insulating layer 35 has a thickness of 0.2-2 µm for example.

Figure 13C:
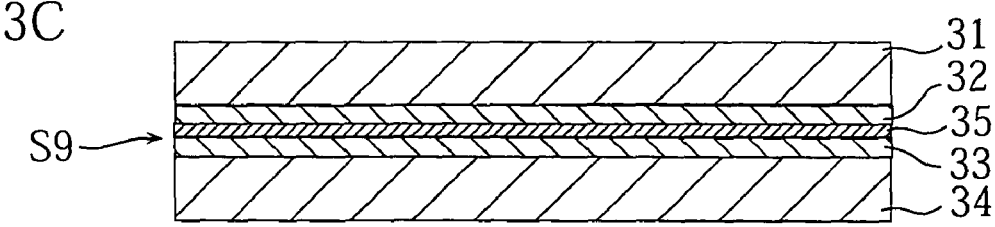

Next, as shown in FIG. 13C, the silicon layer 31 and the silicon layer 34 are polished to a desired thickness. In this way, the material substrate S9 is made which has a laminate structure including electroconductive silicon layers 31, 32, 33, 34 and an insulating layer 35. In the material substrate S9, the silicon layer 31 has a thickness of 50-100 µm for example, whereas the silicon layers 32, 33 have a thickness, as has been mentioned, of 1-5 µm for example. The silicon layer 34 has a thickness of 50-100 µm for example, and the insulating layer 35 has a thickness, as has been mentioned, of 0.2-2 µm for example.

Figure 13D:
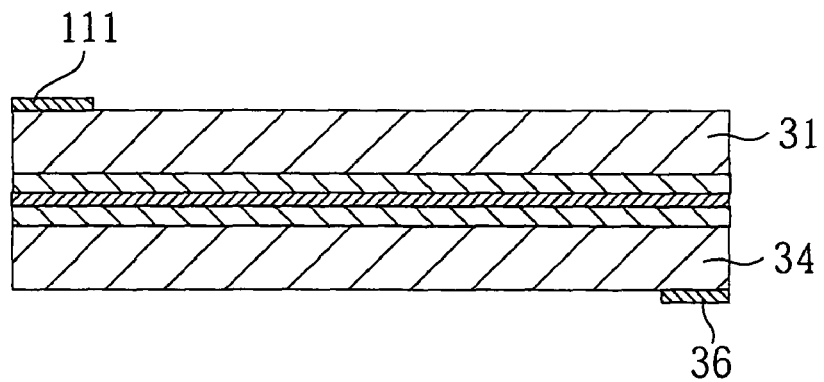

Next, as shown in FIG. 13D, a mirror surface 111 is formed on the silicon layer 31, and an electrode pad 36 (not illustrated in FIG. 1 or FIG. 2) is formed on the silicon layer 34. The mirror surface 111 and the electrode pad 36 can be formed in the same way respectively as the mirror surface 111 and the electrode pad 15 described in the first embodiment.

Figure 14A:
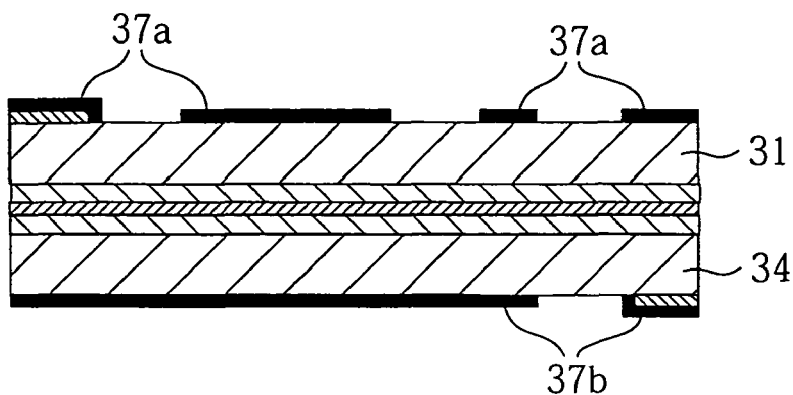
FIG. 14A through FIG. 14D show steps which follow the steps in FIG. 13D.

Next, as shown in FIG. 14A, an oxide film pattern 37a is formed on the silicon layer 31, and an oxide film pattern 37b is formed on the silicon layer 34. The oxide film pattern 37a serves as a mask in later steps shown in FIG. 14C, FIG. 15A and FIG. 15C, to mask regions of the material substrate S9 which are to become the mirror region M, the inner frame F1, the comb-teeth electrode E1, part of the inner frame F2, and part of the outer frame F3. The oxide film pattern 37b has an opening corresponding to a gap between the inner frame F2 and the outer frame F3.

Figure 14B:
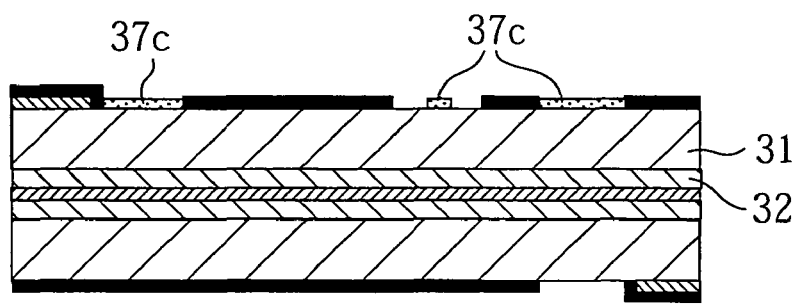

Next, as shown in FIG. 14B, a resist pattern 37c is formed on the silicon layer 31. The resist pattern 37c serves as a mask in the step shown in FIG. 14C, to mask parts of the silicon layer 31 which correspond to regions in the silicon layer 32 to become the torsion bars T1-T3.

Figure 14C:
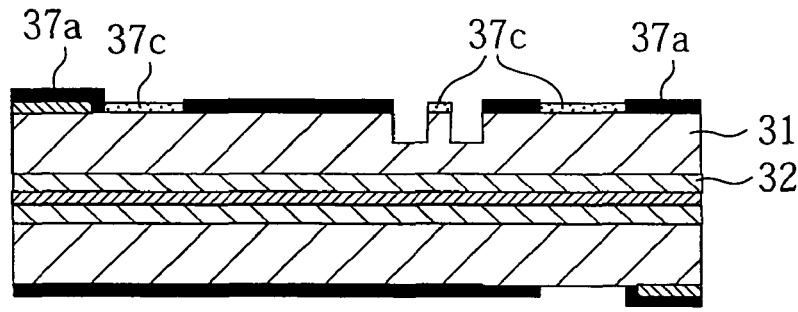

Next, as shown in FIG. 14C, the silicon layer 31 is etched to a predetermined depth, using the oxide film pattern 37a and the resist pattern 37c as masks in DRIE. The predetermined depth is determined appropriately depending upon the thickness of the torsion bars T1-T3, i.e. the thickness of the silicon layer 32. The type of the etching is anisotropic ion etching in which etching speed in the silicon layer 31 is faster in the thickness direction than in the in-plane directions. After the etching process, the resist pattern 37c is removed.

Figure 14D:
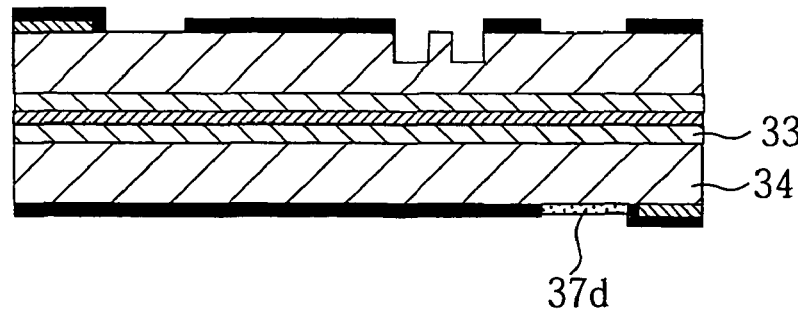

Next, as shown in FIG. 14D, a resist pattern 37d is formed on the silicon layer 34. The resist pattern 37d serves as a mask in the next step, to mask parts of the silicon layer 34 which correspond to regions in the silicon layer 33 to become the torsion bar T4.

After the resist pattern 37d is formed, the silicon layer 34 is etched to a predetermined depth, using the oxide film pattern 37b and the resist pattern 37d as masks in DRIE. This etching process removes, by a predetermined depth, a part corresponding to a gap which is to be formed between the inner frame F2 (inner frame 120) and the outer frame F3 (outer frame 130). The predetermined depth is determined appropriately depending upon the thickness of the torsion bar T4, i.e. the thickness of the silicon layer 33. After the etching process, the resist pattern 37d is removed.

Figure 15A:
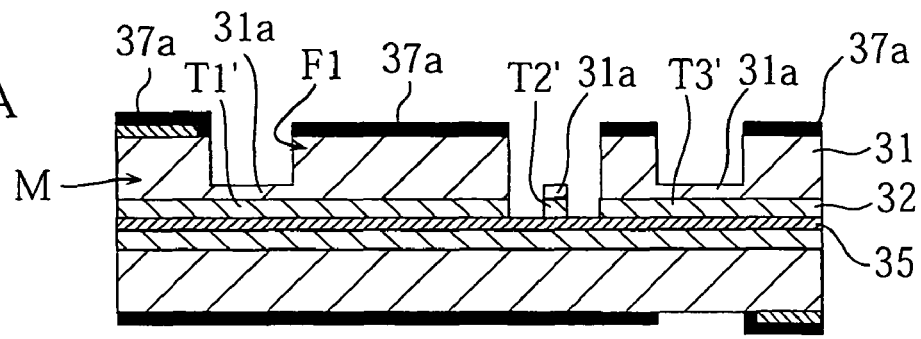
FIG. 15A through FIG. 15C show steps which follow the steps in FIG. 14D.

Next, as shown in FIG. 15A, using the oxide film pattern 37a as a mask, etching is performed by DRIE, from the side on the silicon layer 31 to the insulating layer 35. The type of the etching is anisotropic ion etching in which etching speed in the silicon layers 31, 32 is faster in the thickness direction than in the in-plane directions. This operation yields pre torsion bars T1'-T3' which have a pair of side surfaces apart in an in-plane direction of the silicon layer 32. Each pre torsion bar makes contact with the silicon material 31a which originates from the silicon layer 31 and with the insulating layer 35. The pre torsion bars T1'-T3' originate from the silicon layer 32. Note that this etching process also yields the mirror region M, the inner frame F1, part of the inner frame F2, and part of the outer frame F3.

Figure 15B:
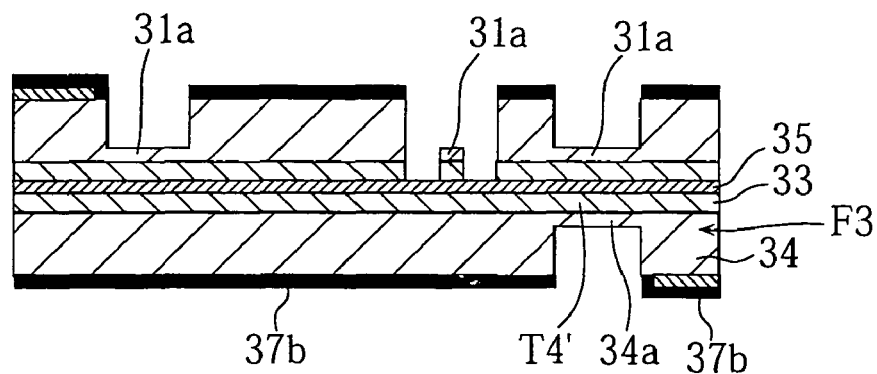

Next, as shown in FIG. 15B, using the oxide film pattern 37b as a mask, etching is performed by DRIE, from the side on the silicon layer 34 to the insulating layer 35. The type of the etching is anisotropic ion etching in which etching speed in the silicon layers 34 is faster in the thickness direction than in the in-plane directions. This operation yields a pre torsion bar T4' which has a pair of side surfaces apart in an in-plane direction of the silicon layer 33. The pre torsion bar makes contact with the silicon material 34a which originates from the silicon layer 34 and with the insulating layer 35. The pre torsion bar T4' originates from the silicon layer 33. Note that this etching process also yields part of the outer frame F3.

Figure 15C:
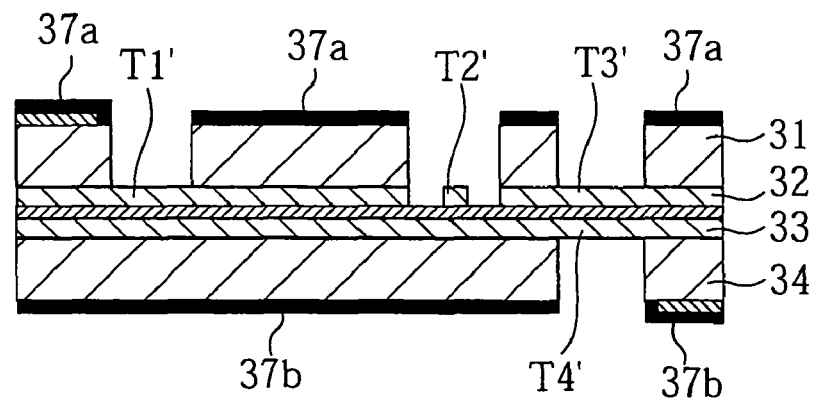

Next, as shown in FIG. 15C, using the oxide film patterns 27a, 37b as masks, the silicon materials 31a, 34a are removed by wet etching method. The etchant for this operation may be the same as used in the first embodiment for removal of the silicon material 11a. In this wet etching, the silicon layers 32, 33 or the pre torsion bars T1'-T4' are etched at a very much slower speed than the silicon layers 31, 34 or the silicon materials 31a, 34a. Therefore, it is possible to appropriately remove the silicon materials 31a, 34a while preserving the pre torsion bars T1'-T4', in this etching process.

Figure 16A:
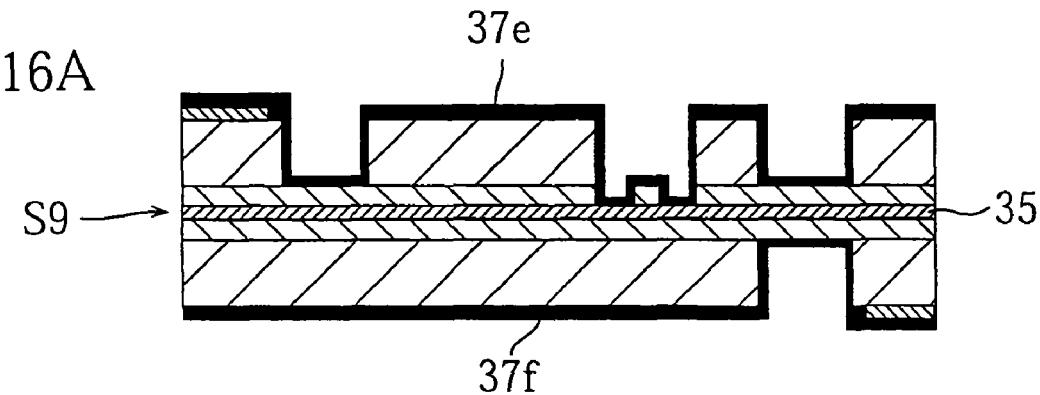
FIG. 16A through FIG. 16C show steps which follow the steps in FIG. 15C.

Next, as shown in FIG. 16A, by CVD method, films of silicon dioxide are formed on the material substrate S9 over the oxide film patterns 37a, 37b whereby oxide films 37e, 37f are formed. The oxide film 37e protects surfaces of the structure which are formed on the insulating layer 35 and are drawn on the upper side of the layer as in the drawing. The oxide film 37f protects surfaces of the structures which are formed on the insulating layer 35 and are drawn on the lower side of the layer as in the drawing.

Figure 16B:
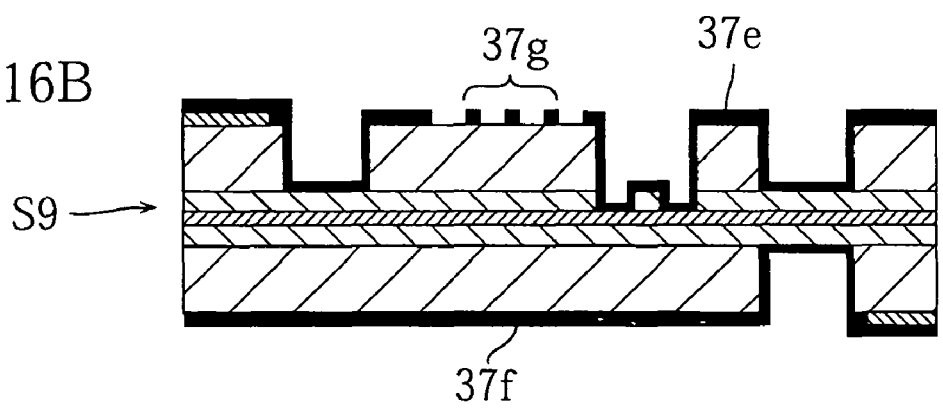

Next, as shown in FIG. 16B, an oxide film pattern 37g is formed from part of the oxide film 37e. The oxide film pattern 37g serves as a mask in a step to be described later with reference to FIG. 17A, where masking is made to a region on the material substrate S9 which are to be formed into the comb-teeth electrode E1.

Figure 16C:
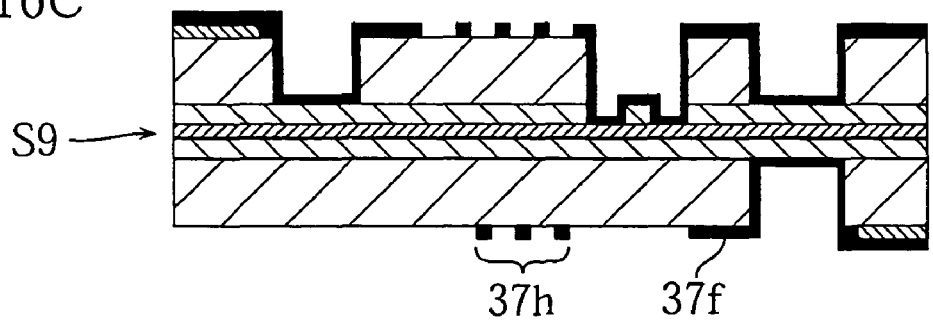

Next, as shown in FIG. 16C, an oxide film pattern 37h is formed from part of the oxide film 37f. The oxide film pattern 37h serves as a mask in a step to be described later with reference to FIG. 17B, where masking is made to a region on the material substrate S9 which are to be formed into the comb-teeth electrode E2.

Figure 17A:
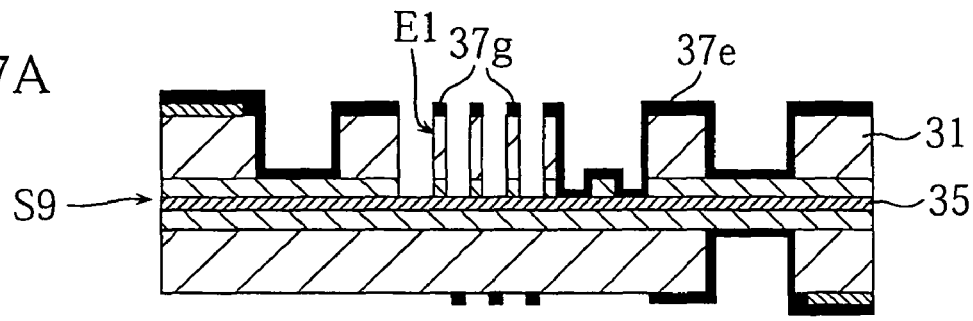
FIG. 17A through FIG. 17C show steps which follow the steps in FIG. 16C.

Next, as shown in FIG. 17A, using the oxide film 37e and the oxide film pattern 37g as masks, etching is performed by DRIE, from the side on the silicon layer 31 to the insulating layer 35, which yields the comb-teeth electrode E1.

Figure 17B:
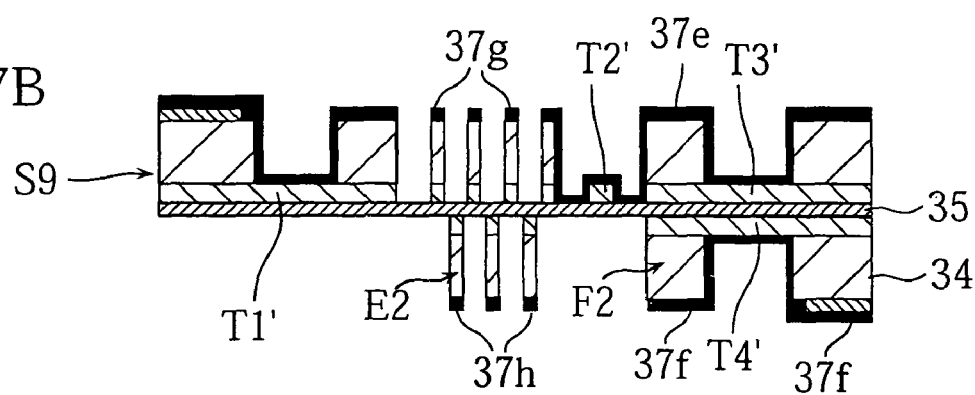
Figure 17C:
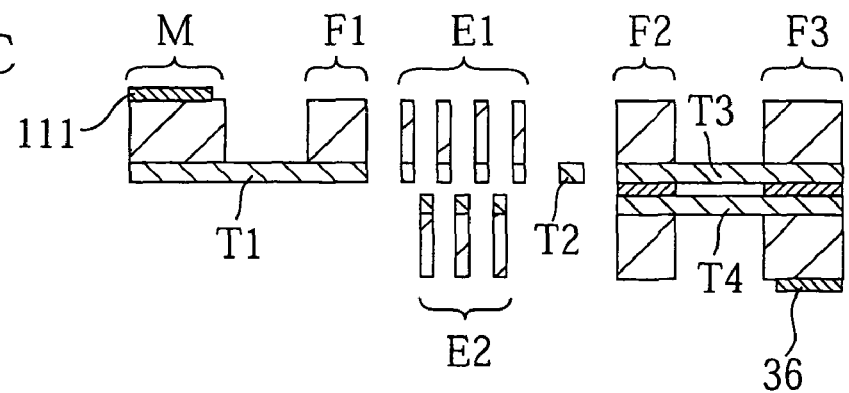

Next, as shown in FIG. 17B, using the oxide film 37f and the oxide film pattern 37h as masks, etching is performed by DRIE, from the side on the silicon layer 34 to the insulating layer 35, which yields the comb-teeth electrode E2 and part of the inner frame F2.

Next, as shown in FIG. 7C, etching is made in order to remove the oxide films 37e, 37f, the oxide film patterns 37g, 37h and exposed parts in the insulating layer 35. In this etching process, parts of the insulating layer 35 which make contact with the pre torsion bars T1'-T4' are removed, to form the torsion bars T1-T4.

The above-described series of steps yield the mirror region M, the torsion bars T1-T4, the inner frames F1, F2, the comb-teeth electrodes E1, E2, and the outer frame F3. In other words, the micromirror element X1 shown in FIG. 1 and FIG. 2 is manufactured.

In the present embodiment, it is possible to form a silicon layer 32 which has a highly accurate thickness dimension, in the manufacturing process of making the material substrate S7 described earlier with reference to FIG. 13A. The torsion bars T1-T3, which are thin wall portions of the micromirror element X1, are formed from such a silicon layer 32, at the same thickness as the silicon layer 32, and therefore have a highly accurate thickness dimension. Similarly, it is possible to form a silicon layer 33 which has a highly accurate thickness dimension, in the manufacturing process of making the material substrate S8 described earlier with reference to FIG. 13A. The torsion bar T4, which is a thin wall portion of the micromirror element X1, is formed from such a silicon layer 33, at the same thickness as the silicon layer 33, and therefore has a highly accurate thickness dimension.

The torsion bar T3 and the torsion bar T4 originate from different electroconductive silicon layers which are electrically separated from each other appropriately by the insulating layer 35. Therefore, according to the present embodiment, in the micromirror element X1, appropriate selections may be made for the mode of electrical connection made by each torsion bar 151 included in the connecting regions 150, and appropriate electrical paths may be formed inside the inner frame 120 and outer frame 130 so that each torsion bar 151 will not make inappropriate short circuit. Then, it becomes possible to transfer a plurality of electric potentials via a plurality of torsion bars 151, from the outer frame 130 to the inner frame 120. Thus, it becomes possible to individually control the amount of electric potential to be applied to each comb-teeth electrode.

In the micromirror X1 shown in FIG. 1 and FIG. 2, the two torsion bars 151 included in the connecting regions 150 are offset from each other in in-plane directions of the material substrate. The two torsion bars 151 in the micromirror X1 according to the present embodiment manufactured are offset from each other in in-plane directions of the material substrate, and also in the direction of thickness. According to the present invention, alternatively, the two torsion bars 151 may be offset from each other only in the direction of thickness of the material substrate, without the offset in the in-plane directions of the material substrate in the micromirror X1.

FIG. 18A through FIG. 21C show a series of steps of a manufacturing method for the microstructure according to a fourth embodiment of the present invention. The method is an example through which the micromirror element X2 described earlier is manufactured by micromachining technology. Throughout FIG. 18A to FIG. 21C, views of a section will be given to illustrate a process of forming a mirror region M, torsion bars T1-T4, inner frames F1, F2, a pair of comb-teeth electrodes E1, E2, and an outer frame F3. As mentioned earlier, the torsion bar T4 corresponds to a torsion bar 151 and is expressed in a longitudinal section along a direction in which the bar extends.

Figure 18A:
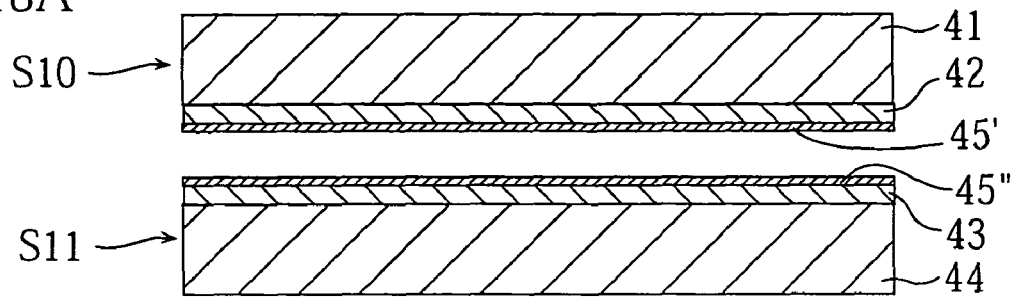
FIG. 18A through FIG. 18D show a few steps of a micromirror element manufacturing method according to a fourth embodiment of the present invention.

In the method of manufacturing the microstructure according to the fourth embodiment, a material substrates S10, S11 as shown in FIG. 18A are prepared first. The material substrate S10 has a laminate structure which includes a silicon layer 41, a silicon layer 42 and an oxide film 45'. The material substrate S11 has a laminate structure which includes a silicon layer 43, a silicon layer 44 and an oxide film 45".

The silicon layers 41, 44 are made of a silicon material which is doped with a p-type impurity such as B thereby given electric conductivity. The concentration of B dopant in the silicon layers 41, 44 is $1 \times 10^{17}$-$10^{18}$ atom/cm$^3$ for example. The silicon layers 41, 44 have a crystal structure in which (110) surface extends in in-plane directions of the layer, and two (111) surfaces are perpendicular to this (110) surface.

The silicon layers 42, 43 are made of a silicon material which is doped with a p-type impurity such as B thereby given electric conductivity. The silicon layer 42 has a thickness of 1-5 μm for example. The thickness represents the thickness of the torsion bars T1-T3. The silicon layer 43 has a thickness of 1-5 μm for example. The thickness represents the thickness of the torsion bar T4. The concentration of B dopant in the silicon layers 42, 43 is higher than that in the silicon layers 41, 44 being $1 \times 10^{19}$ atom/cm$^3$ or greater for example. Preferably, the dopant concentration in the silicon layers 42, 43 is 100 times or greater than the dopant concentration in the silicon layers 41, 44.

The material substrates S10, S11 are made in the same way as has been described with reference to FIG. 3A and FIG. 3B for the first embodiment. Therefore, the silicon layer 42 of the material substrate S10 and the silicon layer 43 of the material substrate S11 are formed by CMP method, by polishing a silicon wafer to a desired thickness, and thus have a highly accurate thickness dimension.

Figure 18B:
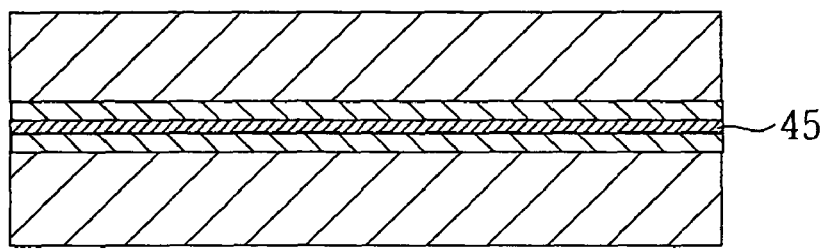

Next, in the present embodiment, as shown in FIG. 18B, the material substrates S10 and the material substrate S11 are bonded to each other. Bonding between the material substrate S10 and the material substrate S11 is made so that the two kinds of (111) surfaces in the silicon layer 41 and the two kinds of (111) surfaces in the silicon layer 44 orient in the same direction. The bonding between the material substrate S10 and the material substrate S11 is achieved by a predetermined direct bonding via the oxide film 45' and the oxide film 45". The oxide film 45' and the oxide film 45" are integrated with each other to become the insulating layer 45. The insulating layer 45 has a thickness of 0.2-2 μm for example.

Figure 18C:
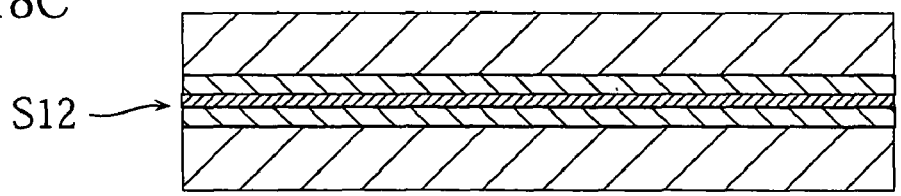

Next, as shown in FIG. 18C, the silicon layer 41 and the silicon layer 44 are polished to a desired thickness. In this way, the material substrate S12 is made which has a laminate structure including electroconductive silicon layers 41, 42, 43, 44 and an insulating layer 45. In the material substrate S12, the silicon layer 41 has a thickness of 50-100 μm for example, whereas the silicon layers 42, 43 have a thickness, as has been mentioned, of 1-5 μm for example. The silicon layer 44 has a thickness of 50-100 μm for example, and the insulating layer 45 has a thickness, as has been mentioned, of 0.2-2 μm for example.

Figure 18D:
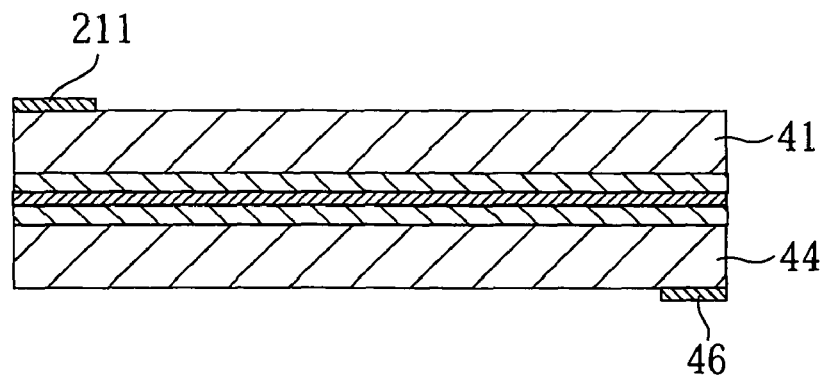

Next, as shown in FIG. 18D, a mirror surface 211 is formed on the silicon layer 41, and an electrode pad 46 (not illustrated in FIG. 8) is formed on the silicon layer 44. The mirror surface 211 and the electrode pad 46 can be formed in the same way respectively as the mirror surface 111 and the electrode pad 15 described in the first embodiment.

Figure 19A:
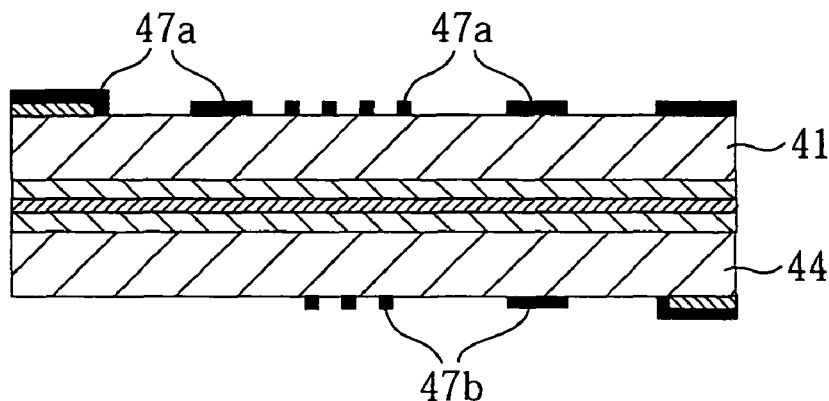
FIG. 19A through FIG. 19C show steps which follow the steps in FIG. 18D.

Next, as shown in FIG. 19A, an oxide film pattern 47a is formed on the silicon layer 41, and an oxide film pattern 47b is formed on the silicon layer 44. The oxide film pattern 47a serves as a mask in later steps shown in FIG. 19C, FIG. 20C and FIG. 21B, to mask regions of the material substrate S12 which are to become the mirror region M, the inner frame F1, the comb-teeth electrode E1, part of the inner frame F2, and part of the outer frame F3. The oxide film pattern 47a has an outline which follows the two kinds of (111) surfaces in the silicon crystal material that constitute the silicon layer 41. The oxide film pattern 47b serves as a mask in later steps shown in FIG. 20B, FIG. 21A and FIG. 21B, to mask regions of the material substrate S12 which are to become the comb-teeth electrode E2, part of the inner frame F2, and part of the outer frame F3. The oxide film pattern 47b has an outline which follows the two kinds of (111) surfaces in the silicon crystal material that constitute the silicon layer 44.

Figure 19B:
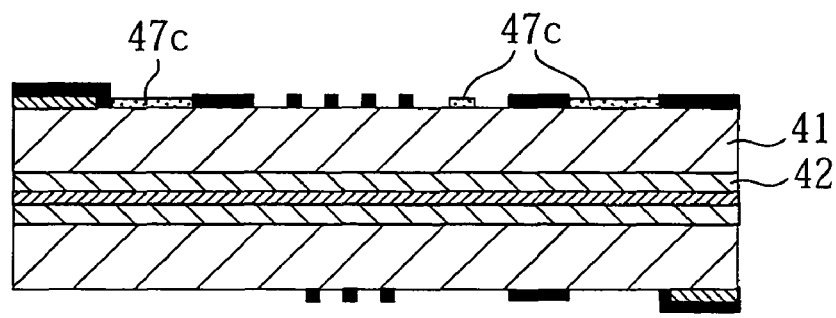

Next, as shown in FIG. 19B, a resist pattern 47c is formed on the silicon layer 41. The resist pattern 47c serves as a mask in the step shown in FIG. 19C, to mask parts of the silicon layer 41 which correspond to regions in the silicon layer 42 to become the torsion bars T1-T3.

Figure 19C:
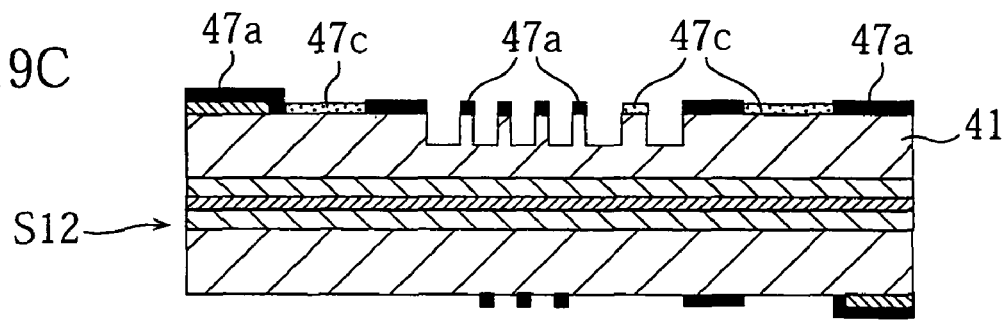

Next, as shown in FIG. 19C, the silicon layer 41 is etched to a predetermined depth, using the oxide film pattern 47a and the resist pattern 47c as masks in DRIE. The type of the etching is anisotropic ion etching in which etching speed in the silicon layer 41 is faster in the thickness direction than in the in-plane directions. The predetermined depth is determined appropriately depending upon the thickness of the torsion bars T1-T3, i.e. the thickness of the silicon layer 42. After the etching process, the resist pattern 47c is removed.

Figure 20A:
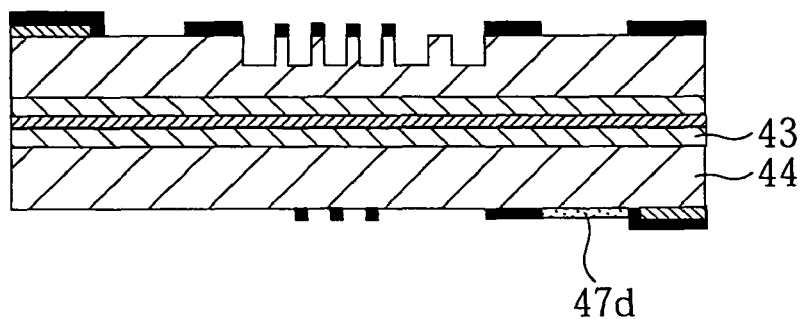
FIG. 20A through FIG. 20C show steps which follow the steps in FIG. 19C.

Next, as shown in FIG. 20A, a resist pattern 47d is formed on the silicon layer 44. The resist pattern 47d serves as a mask in the next step shown in FIG. 20B, to mask parts of the silicon layer 44 which correspond to regions in the silicon layer 43 to become the torsion bar T4.

Figure 20B:
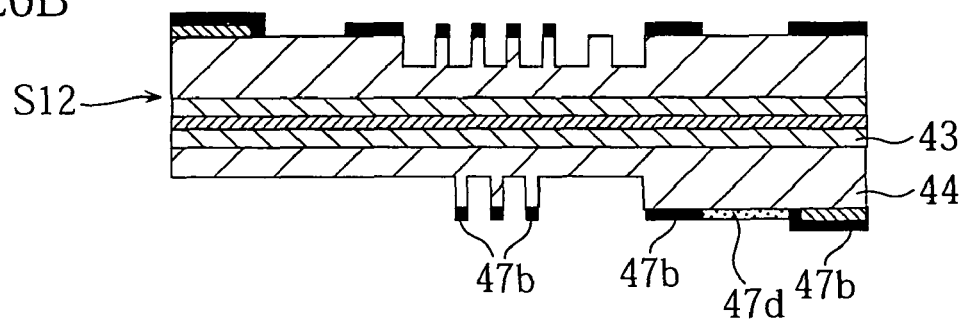

Next, as shown in FIG. 20B, the silicon layer 44 is etched to a predetermined depth, using the oxide film pattern 47b and the resist pattern 47d as masks in DRIE. The type of the etching is anisotropic ion etching in which etching speed in the silicon layer 44 is faster in the thickness direction than in the in-plane directions. The predetermined depth is determined appropriately depending upon the thickness of the torsion bar T4, i.e. the thickness of the silicon layer 43. After the etching process, the resist pattern 47d is removed.

Figure 20C:
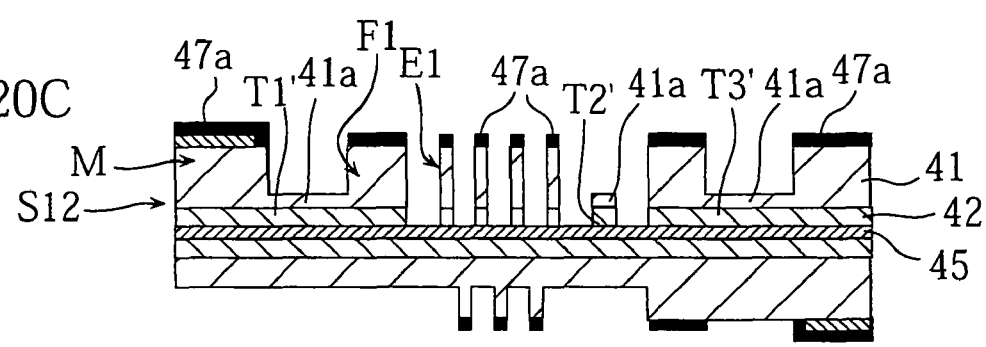

Next, as shown in FIG. 20C, using the oxide film pattern 47a as a mask, etching is performed by DRIE, from the side on the silicon layer 41 to the insulating layer 45. The type of the etching is anisotropic ion etching in which etching speed in the silicon layers 41, 42 is faster in the thickness direction than in the in-plane directions. This operation yields pre torsion bars T1'-T3' which have a pair of side surfaces apart in an in-plane direction of the silicon layer 42. Each pre torsion bar makes contact with the silicon material 41a which originates from the silicon layer 41 and with the insulating layer 45. The pre torsion bars T1'-T3' originate from the silicon layer 42. Note that this etching process also yields the mirror region M, the inner frame F1, the comb-teeth electrode E1, part of the inner frame F2, and part of the outer frame F3.

Figure 21A:
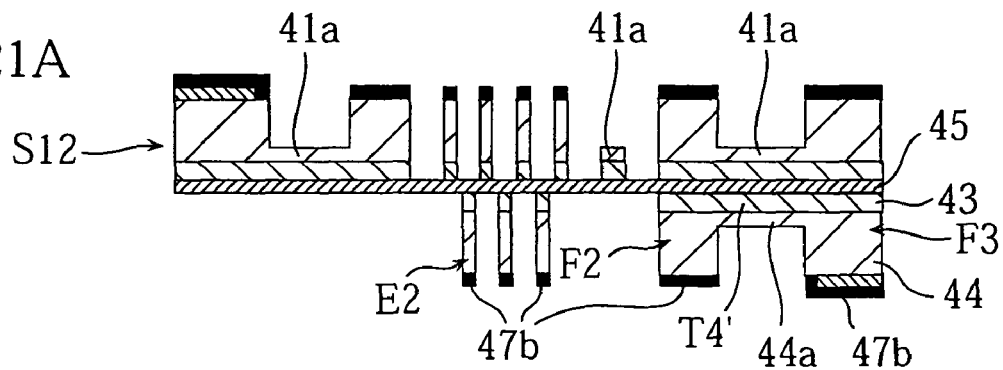
FIG. 21A through FIG. 21C show steps which follow the steps in FIG. 20C.

Next, as shown in FIG. 21A, using the oxide film pattern 47b as a mask, etching is performed by DRIE, from the side on the silicon layer 44 to the insulating layer 45. The type of the etching is anisotropic ion etching in which etching speed in the silicon layers 43, 44 is faster in the thickness direction than in the in-plane directions. This operation yields a pre torsion bar T4' which has a pair of side surfaces apart in an in-plane direction of the silicon layer 43. The pre torsion bar makes contact with the silicon material 44a which originates from the silicon layer 44 and with the insulating layer 45. The pre torsion bar T4' originates from the silicon layer 43. Note that this etching process also yields comb-teeth electrode E2, part of the inner frame F2, and part of the outer frame F3.

Figure 21B:
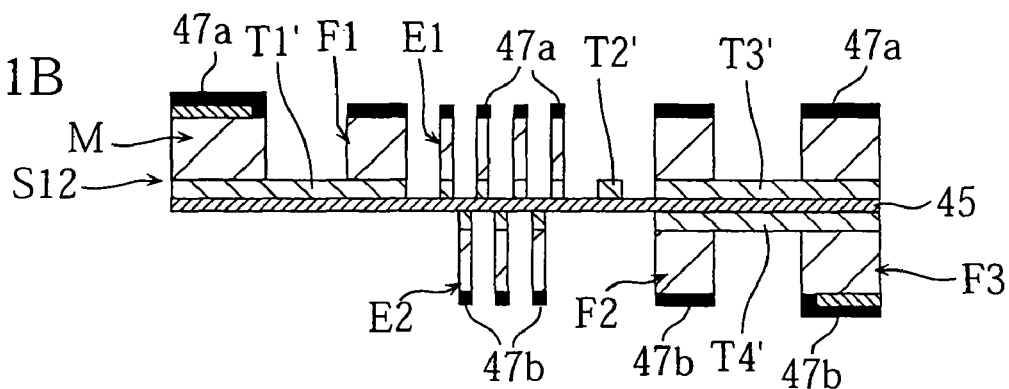

Next, as shown in FIG. 21B, using the oxide film patterns 47a, 47b as masks, the silicon materials 41a, 44a are removed by wet etching method. The etchant for the removal of the silicon materials 41a, 44a may be the same as used in the first embodiment which is used for the removal of the silicon material 11a.

In this wet etching, the silicon layers 42 or the pre torsion bars T1'-T3' are etched at a very much slower speed than the silicon layers 41 or the silicon materials 41a. Therefore, it is possible to appropriately remove the silicon materials 21a, while preserving the pre torsion bars T1'-T3', in this etching process.

Likewise, in this wet etching, the silicon layer 43 or the pre torsion bar T4' is etched at a very much slower speed than the silicon layers 44 or the silicon materials 44a. Therefore, it is possible to appropriately remove the silicon materials 44a, while preserving the pre torsion bar T4', in this etching process.

Further, side surfaces of the mirror region M, inner frames F1, F2, comb-teeth electrodes E1, E2, and outer frame F3 are a (111) surface of the silicon crystal. Thus, the etching speed in a direction perpendicular to this surface is very slow in this etching process, creating no undesirable level of erosion.

Figure 21C:
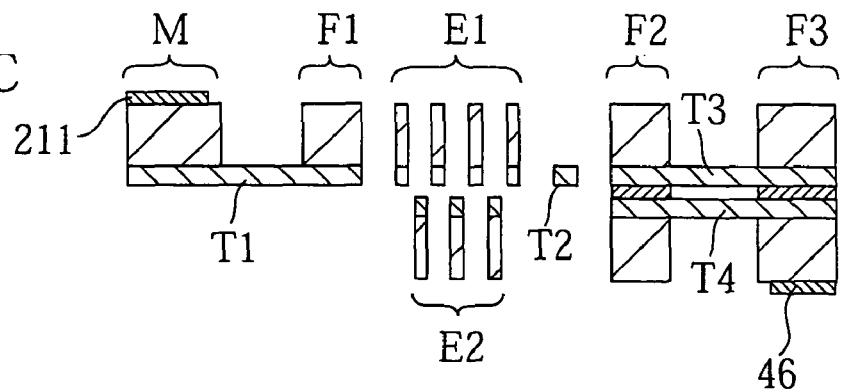

Next, as shown in FIG. 21C, etching is made in order to remove the oxide film patterns 47a, 47b and exposed parts in the insulating layer 45. In this etching process, parts of the insulating layer 45 which make contact with the pre torsion bars T1'-T4' are removed, to form the torsion bars T1-T4.

The above-described series of steps yield the mirror region M, the torsion bars T1-T4, the inner frames F1, F2, the comb-teeth electrodes E1, E2, and the outer frame F3. In other words, the micromirror element X2 shown in FIG. 8 is manufactured.

In the present embodiment, it is possible to form a silicon layer 42 which has a highly accurate thickness dimension, in the manufacturing process of making the material substrate S10 described earlier with reference to FIG. 18A. The torsion bars T1-T3, which are thin wall portions of the micromirror element X2, are formed from such a silicon layer 42, at the same thickness as the silicon layer 42, and therefore have a highly accurate thickness dimension. Similarly, it is possible to form a silicon layer 43 which has a highly accurate thickness dimension, in the manufacturing process of making the material substrate S11 described earlier with reference to FIG. 18A. The torsion bar T4, which is a thin wall portion of the micromirror element X2, is formed from such a silicon layer 43, at the same thickness as the silicon layer 43, and therefore has a highly accurate thickness dimension.

The torsion bar T3 and the torsion bar T4 originate from different electroconductive silicon layers which are electrically separated from each other appropriately by the insulating layer 45. Therefore, according to the present embodiment, in the micromirror element X2, appropriate selections may be made for the mode of electrical connection made by each torsion bar 151 included in the connecting regions 150, and appropriate electrical paths may be formed inside the inner frame 220 and outer frame 230 so that each torsion bar 151 will not make inappropriate short circuit. Then, it becomes possible to transfer a plurality of electric potentials via a plurality of torsion bars 151, from the outer frame 230 to the inner frame 220. Thus, it becomes possible to individually control the amount of electric potential to be applied to each comb-teeth electrode.

In the micromirror X2 shown in FIG. 8, the two torsion bars 251 included in the connecting regions 150 are offset from each other in in-plane directions of the material substrate. The two torsion bars 251 in the micromirror X2 manufactured in accordance with the present embodiment are offset from each other in in-plane directions of the material substrate, and also in the direction of thickness of the material substrate. According to the present invention, alternatively, the two torsion bars 251 may be offset from each other only in the direction of thickness of the material substrate, without the offset in the in-plane directions of the material substrate.

According to the present embodiment, regions on the material substrate S12 which are to be formed into the mirror region M, the inner frames F1, F2, the comb-teeth electrodes E1, E2, and the outer frame F3 are masked by the oxide film patterns 47a, 47b whose outlines follow the two kinds of (111) surfaces in the silicon crystal structure that constitute the material substrate S12. Therefore, the etching process using the masks provided by the oxide film patterns 47a, 47b forms outlines of the mirror region M, the inner frames F1, F2, the comb-teeth electrodes E1, E2, and the outer frame F3. Specifically, side surfaces of the mirror region 210, inner frame 220, comb-teeth electrodes 210a, 210b, 221a, 221b, 222a, 222b, 232a, 232b, and outer frame 230 are provided by the (111) surfaces of the crystal structure of this silicon material. For this reason, it is possible according to the present embodiment to manufacture the micromirror element X2 as shown in FIG. 8.

FIG. 22A through FIG. 26C show a series of steps of a manufacturing method for the microstructure according to a fifth embodiment of the present invention. The method is an example through which the micromirror element X1 described earlier is manufactured by micromachining technology.

Throughout FIG. 22A to FIG. 26C, views of a section will be given, as in FIG. 3A through FIG. 7D, to illustrate a process of forming a mirror region M, torsion bars T1-T3, inner frames F1, F2, a pair of comb-teeth electrodes E1, E2, and an outer frame F3.

Figure 22A:
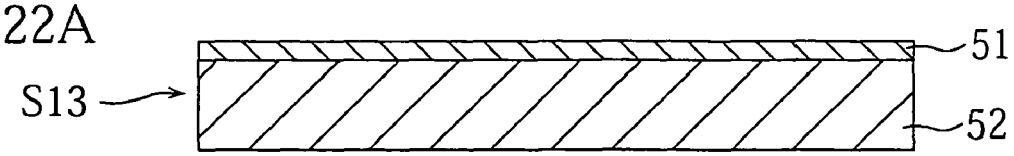
FIG. 22A through FIG. 22D show a few steps of a micromirror element manufacturing method according to a fifth embodiment of the present invention.

In the method of manufacturing the microstructure according to the fifth embodiment, a material substrate S13 as shown in FIG. 22A is prepared first. The material substrate S13 has a laminate structure which includes a silicon layer 51 and a silicon layer 52.

The silicon layer 51 is made of a silicon material which is doped with a p-type impurity such as boron thereby given electric conductivity, and has a thickness of 1-5 μm for example. The thickness represents the thickness of the torsion bars T1-T3.

The silicon layer 52 is made of a silicon material which is doped with a p-type impurity such as B thereby given electric conductivity. The concentration of B dopant in the silicon layer 52 is $1\times10^{17}$-$1\times10^{18}$ atom/cm$^3$ for example. The silicon layer 52 has a crystal structure in which (111) surface extends in in-plane directions of the layer.

The concentration of B dopant in the silicon layer 51 is higher than that in the silicon layer 52, being $1\times10^{19}$ atom/cm$^3$ or greater for example. Preferably, the dopant concentration in the silicon layer 51 is 100 times or greater than the dopant concentration in the silicon layer 52.

In the preparation of the material substrate S13, first, direct bonding is made between a first silicon wafer which is for making the silicon layer 51 and has the same thickness as the silicon layer 51 and a second silicon wafer which is for making the silicon layer 52 and has the same thickness as the silicon layer 52. When bonding, bonding surface of each wafer is physically or chemically activated, and then the surfaces are pressed against each other while being heated as necessary. After the bonding, the first silicon wafer is polished by a chemical-mechanical polishing (CMP) method, to form a silicon layer 51 of a desired thickness. CMP methods enable to give silicon layer 51 a highly accurate thickness dimension. Thus, the material substrate S13 shown in FIG. 22A is prepared.

Figure 22B:
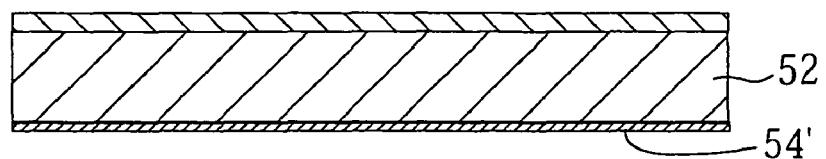

In the present embodiment, next, as shown in FIG. 22B, an oxide film 54' is formed on the surface of silicon layer 52. The oxide film 54' can be formed using CVD method, by forming a film of silicon dioxide on the silicon layer 52. Alternatively, the oxide film 54' may be formed using thermal oxidization method (heating temperature: 900° C. for example), by oxidizing the surface of silicon layer 52.

Figure 22C:
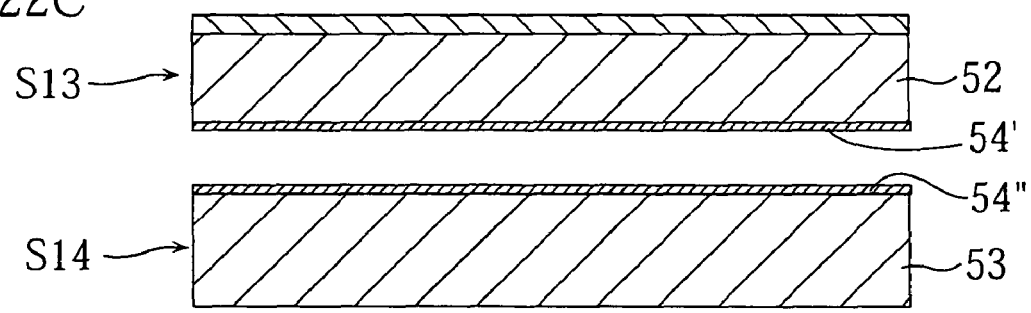
Figure 22D:
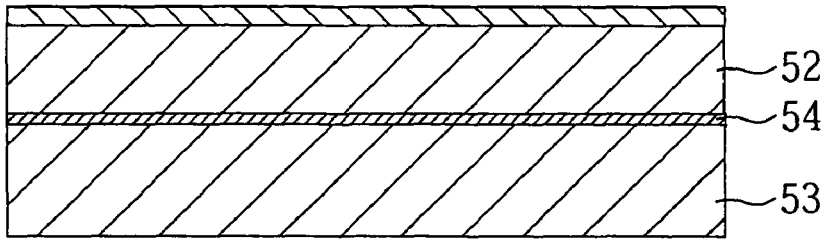

Next, as shown in FIG. 22C and FIG. 22D, the material substrate S13 is bonded to a separately prepared material substrate S14. The material substrate S14 is made of a silicon layer 53 and an oxide film 54" provided by silicon dioxide, and can be formed by forming an oxide film 54" a surface of the silicon wafer by CVD method or thermal oxidation method (heating temperature: 900° C. for example). The oxide film 54" has a thickness of 0.1-1 μm for example. The oxide film 54' and the oxide film 54" are integrated with each other as shown in FIG. 22D, to become an insulating layer 54. The insulating layer 54 has a thickness of 0.2-2 μm for example.

Figure 23A:
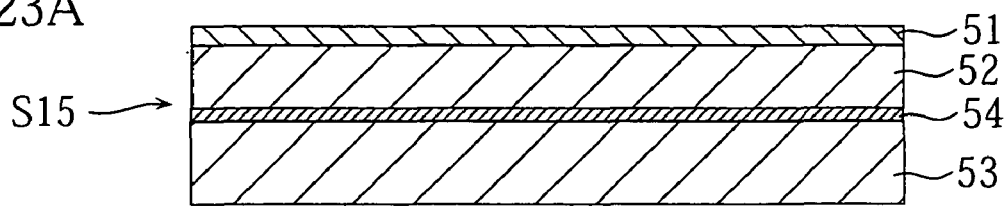
FIG. 23A through FIG. 23D show steps which follow the steps in FIG. 22D.

Next, as shown in FIG. 23A, the silicon layer 53 is polished to a desired thickness. In this way, the material substrate S15 is made which has a laminate structure including electroconductive silicon layers 51, 52, 53, and an insulating layer 54. In the material substrate S15, the silicon layer 51 has a thickness of 1-5 μm for example as mentioned earlier, whereas the silicon layer 52 has a thickness of 50-100 μm for example. The silicon layer 53 has a thickness of 50-100 μm for example, and the insulating layer 14 has a thickness, as has been mentioned, of 0.2-2 μm for example.

Figure 23B:
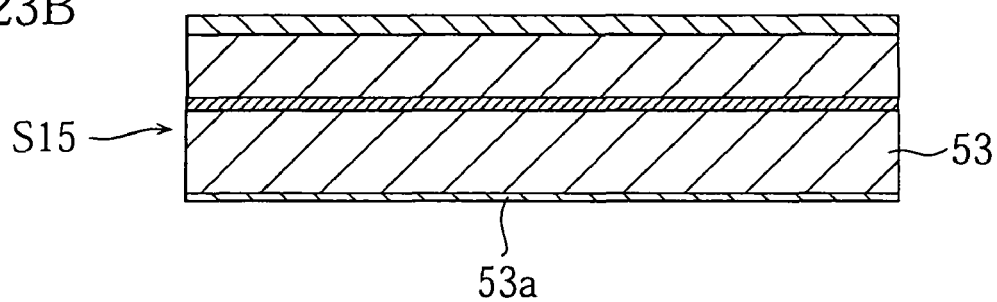

Next, as shown in FIG. 23B, a protective film 53a is formed on the surface of the silicon layer 53 of the material substrate S15. The protective film 53a is made of a silicon material which is doped with a p-type impurity such as B thereby given electric conductivity. The layer has a thickness of 0.1-1 μm for example. The concentration of B dopant in the protective film 53a is higher than that of the silicon layer 53, being $1\times10^{19}$ atom/cm$^3$ or greater. Such a protective film 53a can be formed by dopant ion implantation or dopant thermal diffusion to the surface of silicon layer 53.

Figure 23C:
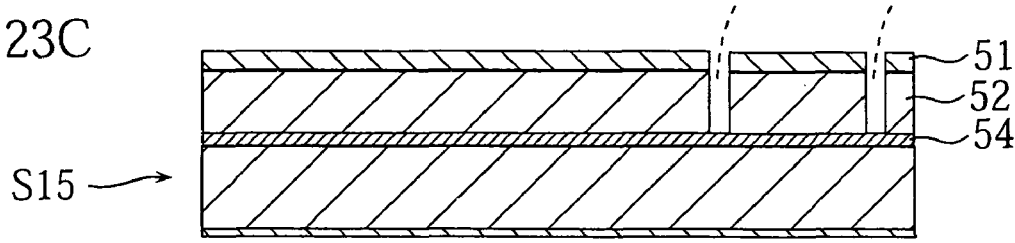

Next, as shown in FIG. 23C, holes H' are formed at predetermined locations of the material substrate S15, to penetrate the silicon layers 51, 52. In forming the holes H', first, a predetermined resist pattern is formed on the silicon layer 51. The resist pattern has openings at locations where the holes H' are formed. Next, using the resist pattern as a mask, etching is performed by DRIE, from the side on the silicon layer 51 to the insulating layer 54.

Figure 23D:
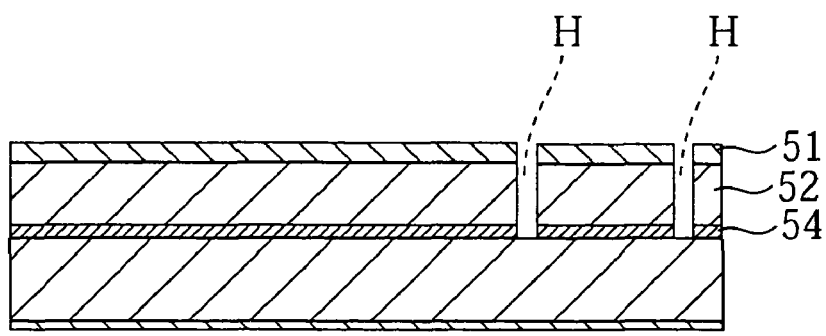

Next, as shown in FIG. 23D, areas in the insulating layer 54 exposed to the holes H' are removed, whereby holes H are formed which penetrate the silicon layers 51, 52 and the insulating layer 54. The removal can be achieved by wet etching or dry etching.

Figure 24A:
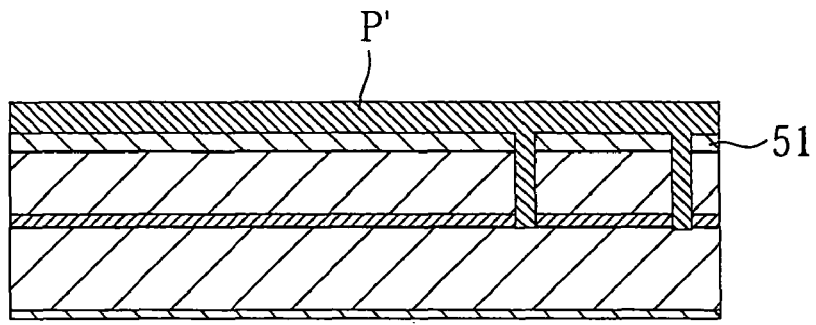
FIG. 24A through FIG. 24D show steps which follow the steps in FIG. 23D.

Next, as shown in FIG. 24A, CVD method is used for example, to make a deposit of electroconductive material P' inside the holes H, on the silicon layer 51. Examples of the electroconductive material P' includes poly silicon doped with a predetermined impurity, and metals such as Cu and W.

Figure 24B:
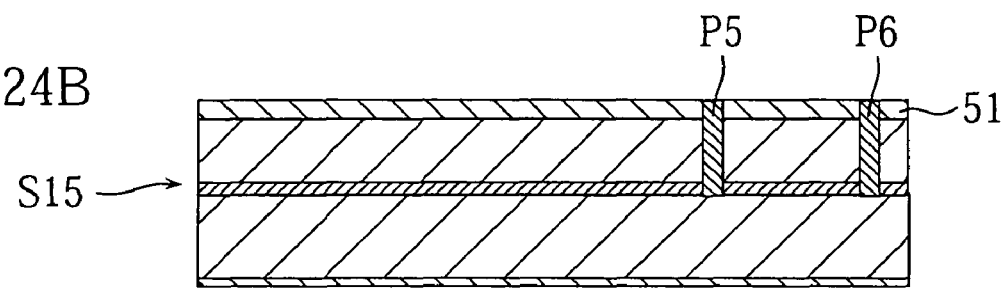

Next, as shown in FIG. 24B, the deposit of electroconductive material P' on the silicon layer 11 is removed by CMP polishing. These steps leave plugs P5, P6 which are buried in the material substrate S15.

Figure 24C:
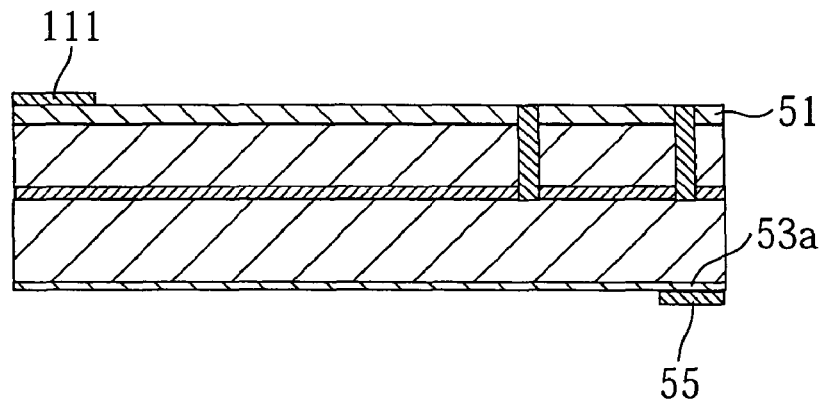

Next, as shown in FIG. 24C, a mirror surface 111 is formed on the silicon layer 51, and an electrode pad 55 (not illustrated in FIG. 1 or FIG. 2) is formed on the protective film 53a. The mirror surface 111 and the electrode pad 55 can be made in the same way as for the mirror surface 111 and the electrode pad 15 in the first embodiment.

Figure 24D:
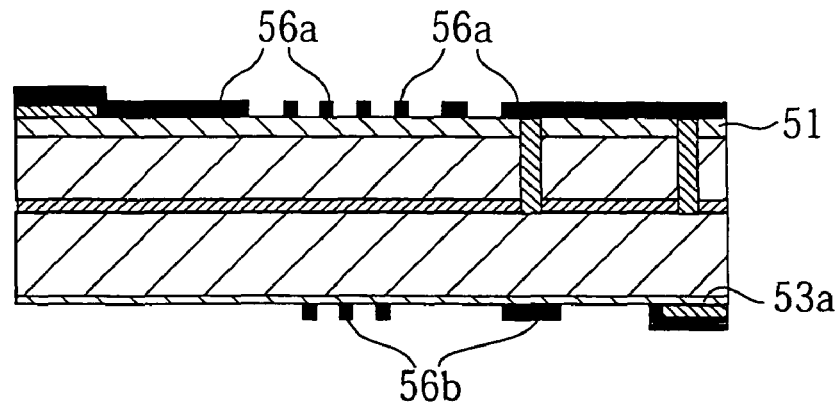

Next, as shown in FIG. 24D, an oxide film pattern 56a is formed on the silicon layer 51, and an oxide film pattern 56b is formed on the protective film 53a. The oxide film pattern 56a serves as a mask in later steps shown in FIG. 26A, to mask regions of the material substrate S15 which are to become the mirror region M, the inner frame F1, the comb-teeth electrode E1, part of the inner frame F2, and part of the outer frame F3. The oxide film pattern 56b serves as a mask in later steps shown in FIG. 26B, to mask regions of the material substrate S15 which are to become the comb-teeth electrode E2, part of the inner frame F2, and part of the outer frame F3.

Figure 25A:
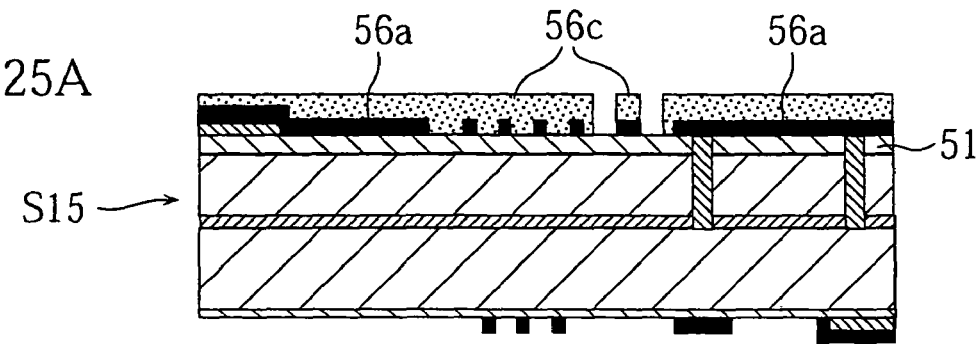
FIG. 25A through FIG. 25D show steps which follow the steps in FIG. 24D.

Next, as shown in FIG. 25A, a resist pattern 56c is formed over the oxide film pattern 56a, to the material substrate S15. The resist pattern 56c serves as a mask in the next step shown in FIG. 25B, to cover regions of the silicon layer 51 which are to become the torsion bars T1-T3.

Figure 25B:
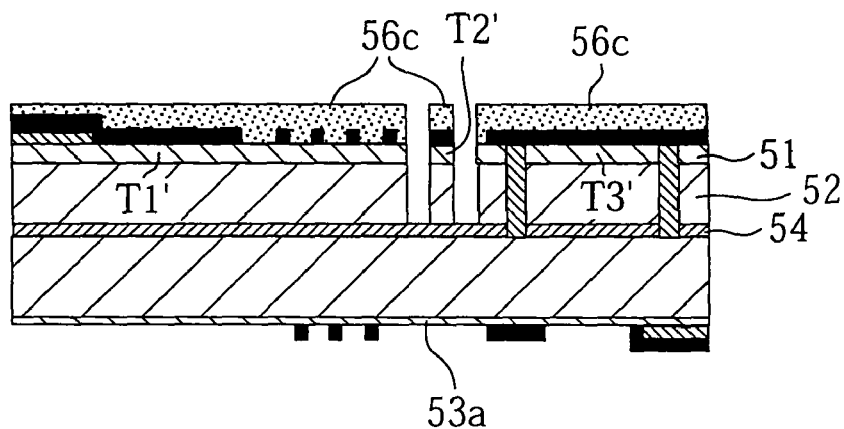

Next, as shown in FIG. 25B, using the resist pattern 56c as a mask, etching is performed by DRIE, from the side on the silicon layer 51 to the insulating layer 54. The type of the etching is anisotropic ion etching in which etching speed in the silicon layers 51, 52 is faster in the thickness direction than in in-plane directions. This operation yields pre torsion bars T1'-T3' which have a pair of side surfaces apart in an in-plane direction of the silicon layer 51. Each pre torsion bar makes contact with the silicon layer 52. The pre torsion bars T1'-T3' originate from the silicon layer 51. Note that this etching process also yields the mirror region M, the inner frame F1, part of the inner frame F2, and part of the outer frame F3. After the etching process, the resist pattern 56c is removed.

Figure 25C:
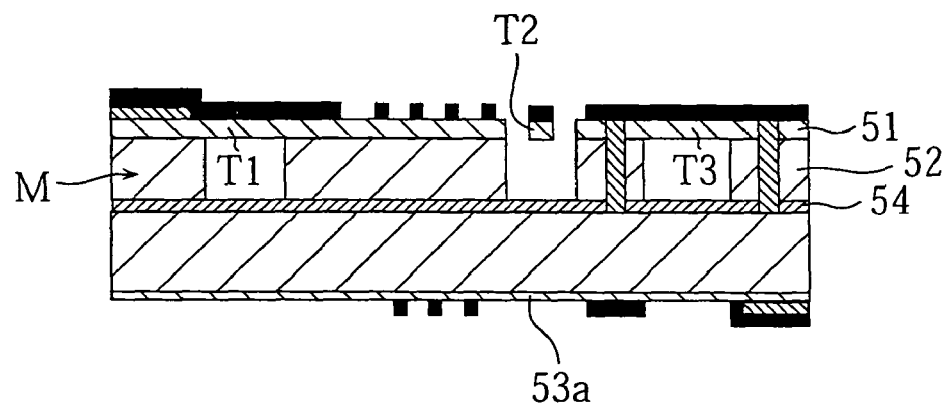

Next, as shown in FIG. 25C, wet etching is performed to the silicon layer 52. The etchant for this operation may be the same as used in the first embodiment for removal of the silicon material 11a. This etching process removes parts of the silicon layer 52 which connect with the torsion bars T1'-T3', thereby yielding the torsion bars T1-T3.

In this wet etching, the silicon layer 51 or the pre torsion bars T1'-T3' are etched at a very much slower speed than the etching speed in directions other than the (111) direction in the silicon crystal material that constitutes the silicon layer 52. The (111) surface in the silicon layer 52 spreads in in-plane directions. Therefore, erosion by the etchant proceeds transversely as in the drawing, and it is possible to appropriately remove the silicon layer 52 which lays between the torsion bars T1'-T3' and the insulating layer 54.

Also, the protective film 53a is etched at a very much slower speed than the etching speed in directions other than the (111) direction in the silicon crystal material that constitutes the silicon layer 52. Therefore, the protective film 53a protects the silicon layer 53 from being eroded.

Figure 25D:
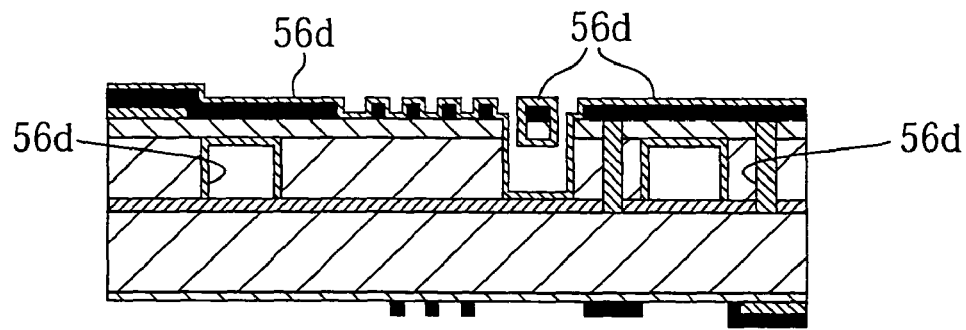

Next, as shown in FIG. 25D, a protective film 56d is formed. The protective film 56d is primarily for protecting the torsion bars T1-T3 in the next step shown in FIG. 26A, and is formed of silicon dioxide using CVD method.

Figure 26A:
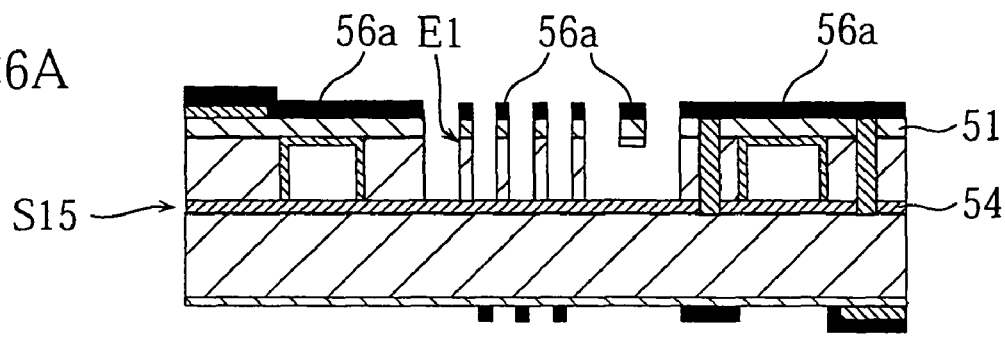
FIG. 26A through FIG. 26C show steps which follow the steps in FIG. 25D.

Next, as shown in FIG. 26A, using the oxide film pattern 56a as a mask, etching is performed by DRIE, from the side on the silicon layer 51 to the insulating layer 54. This operation yields the comb-teeth electrode E1.

Figure 26B:
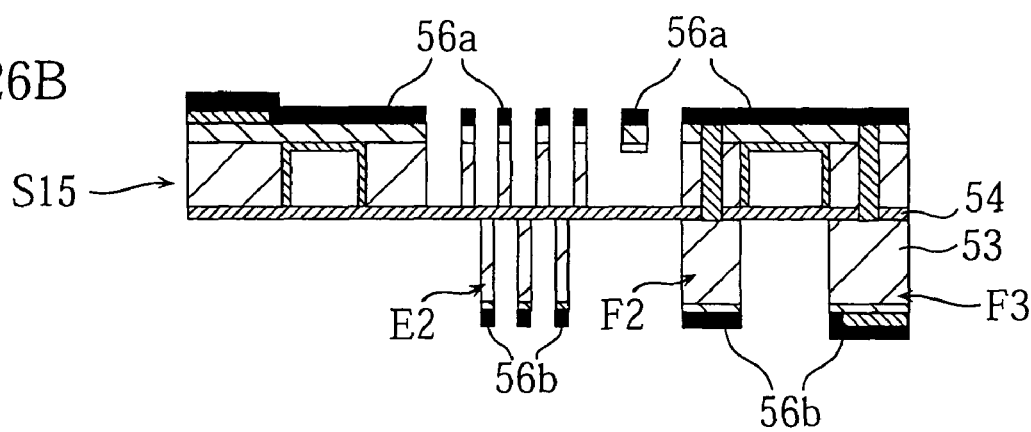

Next, as shown in FIG. 26B, using the oxide film pattern 56b as a mask, etching is performed by DRIE, from the side on the silicon layer 53 to the insulating layer 54. This operation yields the comb-teeth electrode E2, part of the inner frame F2, and part of the outer frame F3.

Figure 26C:
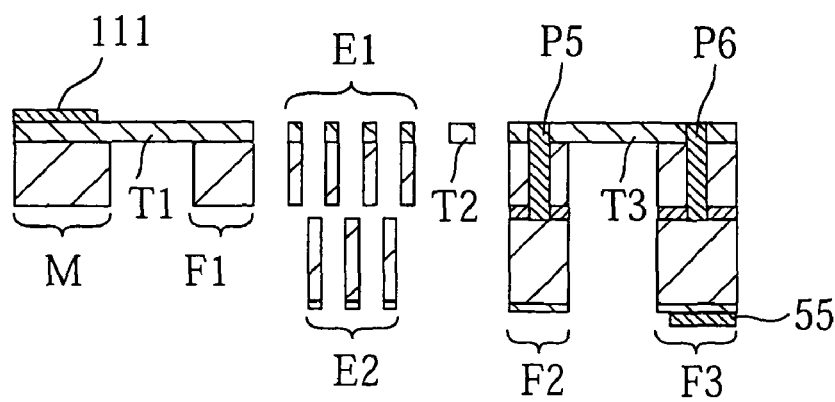

Next, as shown in FIG. 26C, etching is made in order to remove the oxide films 56a, 56b and exposed parts in the insulating layer 54.

The above-described series of steps yield the mirror region M, the torsion bars T1-T3, the inner frames F1, F2, the comb-teeth electrodes E1, E2, and the outer frame F3. In other words, the micromirror element X1 is manufactured. In the present embodiment, it is possible to form a silicon layer 51 which has a highly accurate thickness dimension, in the manufacturing process of making the material substrate S13 described earlier with reference to FIG. 22A. The torsion bars T1-T3, which are thin wall portions of the micromirror element X1 are formed from such a silicon layer 51, at the same thickness as the silicon layer 51, and therefore have a highly accurate thickness dimension.

The mirror region M formed in the present embodiment has a part which originates from the silicon layer 51 and is continuous to the torsion bar T1, and a part which originates from the silicon layer 52. These two parts are electroconductive. The inner frame F1 has a part which originates from the silicon layer 51 and is continuous to the torsion bar T1, and a part which originates from the silicon layer 52. These two parts are electroconductive. Therefore, the mirror region M (mirror region 110) and the inner frame F1 (inner frame 120) are electrically connected with each other via the torsion bar T1 (torsion bar 141).

Similarly, the inner frame F2 has a part which originates from the silicon layer 11 and is continuous to the torsion bar T3, a part which originates from the silicon layer 52, and a part which originates from the silicon layer 53. These three parts are electroconductive, and are electrically connected with each other via the plug P5. The outer frame F3 has a part which originates from the silicon layer 51 and is continuous to the torsion bar T3, a part which originates from the silicon layer 52, and a part which originates from the silicon layer 53. These three parts are electroconductive and are electrically connected with each other via the plug P6. Therefore, the parts which originate from the silicon layer 53 in the inner frame F2 (inner frame 120) are electrically connected with the parts which originate from the silicon layer 53 in outer frame F3 (outer frame 130), via the torsion bar T3 (torsion bar 151).

The present embodiment may be varied in terms of electrical connection between the inner frame F2 and the outer frame F3, by not making the plug P5 or the plug P6. For example, if the plug P1 is not made, it is then possible to form electrical isolation between the part of the inner frame F2 which originates from the silicon layer 53 and the part of the outer frame F3 which originates from the silicon layer 53.

In the micromirror element X1 manufactured in accordance with the present embodiment, appropriate selections may be made for the mode of electrical connection made by each torsion bar 151 included in the connecting regions 150, and appropriate electrical paths may be formed inside the inner frame 120 and outer frame 130 so that each torsion bar 151 will not make inappropriate short circuit. Then, it becomes possible to transfer a plurality of electric potentials via a plurality of torsion bars 151, from the outer frame 130 to the inner frame 120. Thus, it becomes possible to individually control the amount of electric potential to be applied to each comb-teeth electrode.

FIG. 27A through FIG. 31C show a series of steps of a manufacturing method for the microstructure according to a sixth embodiment of the present invention. The method is an example through which the micromirror element X1 described earlier is manufactured by micromachining technology.

Throughout FIG. 27A to FIG. 31C, views of a section will be given, as in FIG. 3A-FIG. 7D, to illustrate a process of forming a mirror region M, torsion bars T1-T3, inner frames F1, F2, a pair of comb-teeth electrodes E1, E2, and an outer frame F3.

Figure 27A:
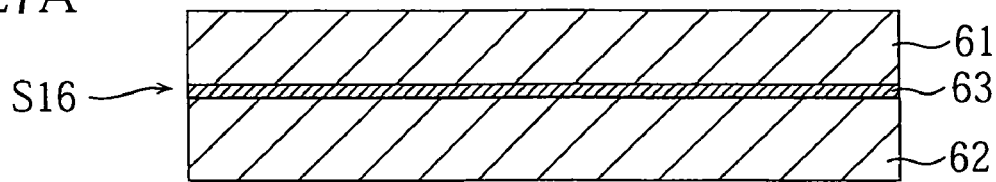
FIG. 27A through FIG. 27D show a few steps of a micromirror element manufacturing method according to a sixth embodiment of the present invention.

In the method of manufacturing the microstructure according to the sixth embodiment, a material substrate S16 as shown in FIG. 27A is prepared first. The material substrate S16 has a laminate structure which includes a silicon layer 61, a silicon layer 62 and an insulating later 63.

The silicon layers 61, 62 are made of a silicon material which is doped with a p-type impurity such as B thereby given electric conductivity. The silicon material has a thickness of 50-100 µm for example. The concentration of B dopant in the silicon layers 61, 62 is $1\times10^{17}$-$1\times10^{18}$ atom/cm$^3$ for example. The silicon layer 61 has a crystal structure in which (111) surface extends in in-plane directions of the layer.

Figure 27B:
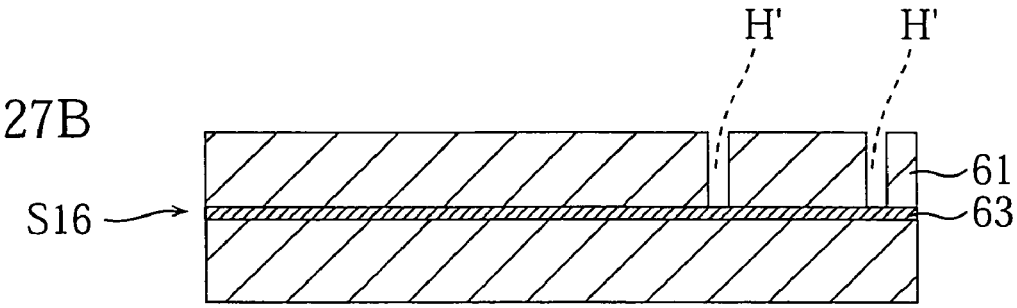

Next, as shown in FIG. 27B, holes H' are formed at predetermined locations of the material substrate S16, to penetrate the silicon layer 61. In forming the holes H', first, a predetermined resist pattern is formed on the silicon layer 61. The resist pattern has openings at locations where the holes H' are formed. Next, using the resist pattern as a mask, etching is performed by DRIE, from the side on the silicon layer 61 to the insulating layer 63.

Figure 27C:
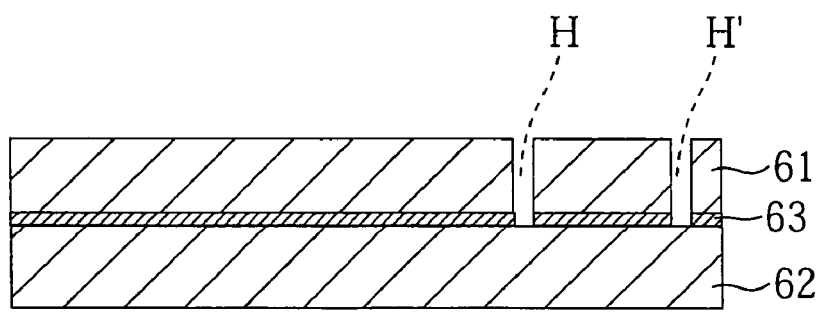

Next, as shown in FIG. 27C, areas in the insulating layer 63 exposed to the holes H' are removed, whereby holes H are formed which penetrate the silicon layers 61 and the insulating layer 63. The removal can be achieved by wet etching or dry etching.

Figure 27D:
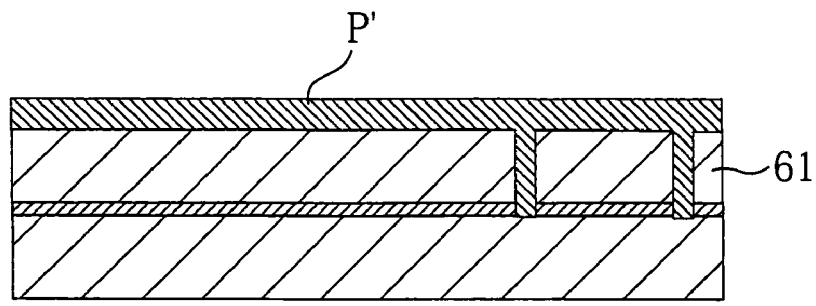

Next, as shown in FIG. 27D, CVD method is used for example, to make a deposit of electroconductive material P' inside the holes H, on the silicon layer 61. Examples of the electroconductive material P' includes poly silicon doped with a predetermined impurity, and metals such as Cu and W.

Figure 28A:
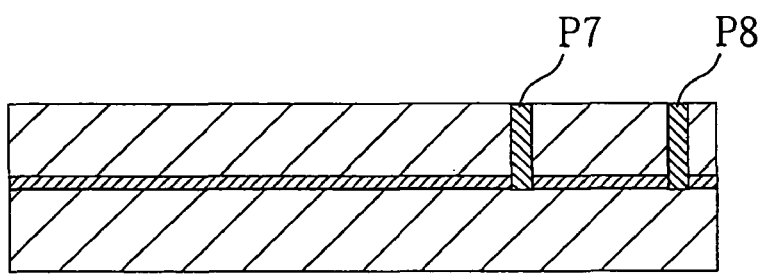
FIG. 28A through FIG. 28D show steps which follow the steps in FIG. 27D.

Next, as shown in FIG. 28A, the deposit of electroconductive material P' on the silicon layer 61 is removed by CMP polishing. These steps leave plugs P7, P8 which are buried in the material substrate S16.

Figure 28B:
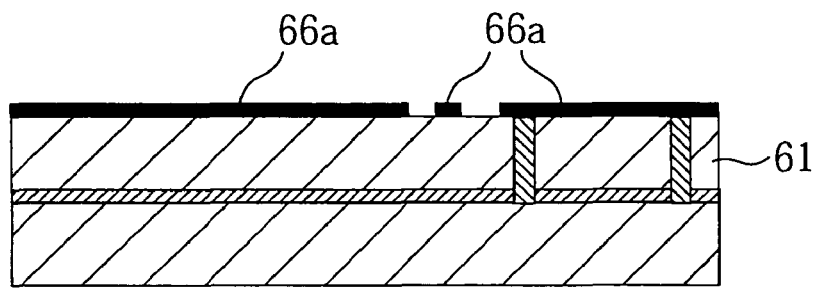

Next, as shown in FIG. 28B, an oxide film pattern 66a is formed on the silicon layer 61. The oxide film pattern 66a serves as a mask in the next step shown in FIG. 28C, to mask regions of the material substrate S16 which are to become the mirror region M, the torsion bars T1-T3, the inner frame F1, part of the inner frame F2, and part of the outer frame F3.

Figure 28C:
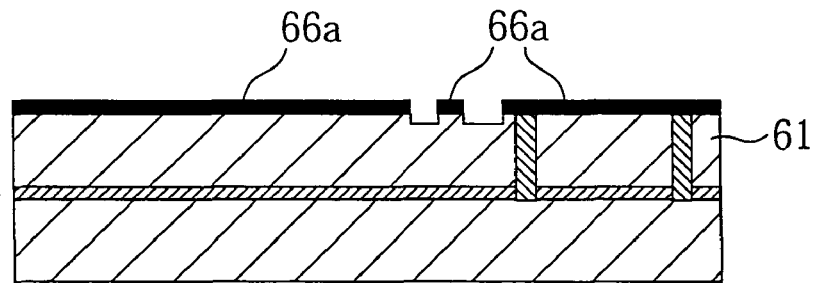

Next, as shown in FIG. 28C, the silicon layer 61 is etched to a predetermined depth, using the oxide film pattern 66a as a mask in DRIE. The predetermined depth is determined appropriately depending upon the thickness of the torsion bars T1-T3. The type of the etching is anisotropic ion etching in which etching speed in the silicon layer 61 is faster in the thickness direction than in the in-plane directions. After the etching process, the resist pattern 66a is removed.

Figure 28D:
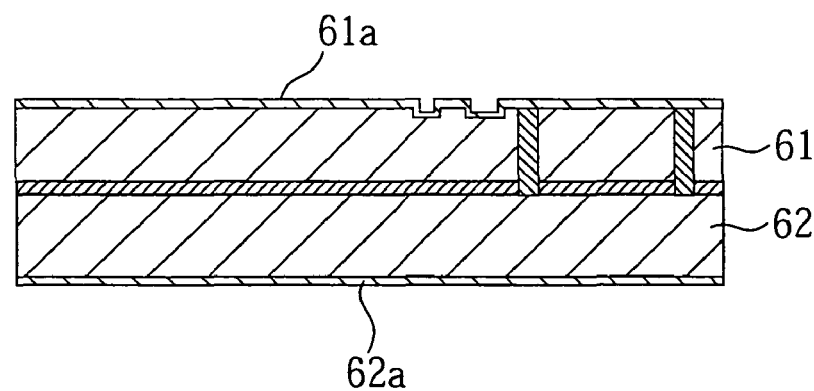

Next, as shown in FIG. 28D, protective films 61a, 62a are formed on the surface of the silicon layers 61, 62. The protective films 61a, 62a are made of a silicon material which is doped with a p-type impurity such as B thereby given electric conductivity. The layer has a thickness of 0.1-1 μm for example. The concentration of B dopant in the protective films 61a, 62a is higher than that of the silicon layers 61, 62, being $1 \times 10^{19}$ atom/cm$^3$ or greater for example. Such protective films 61a, 62a can be formed by dopant thermal diffusion to the surface of silicon layers 61, 62.

Figure 29A:
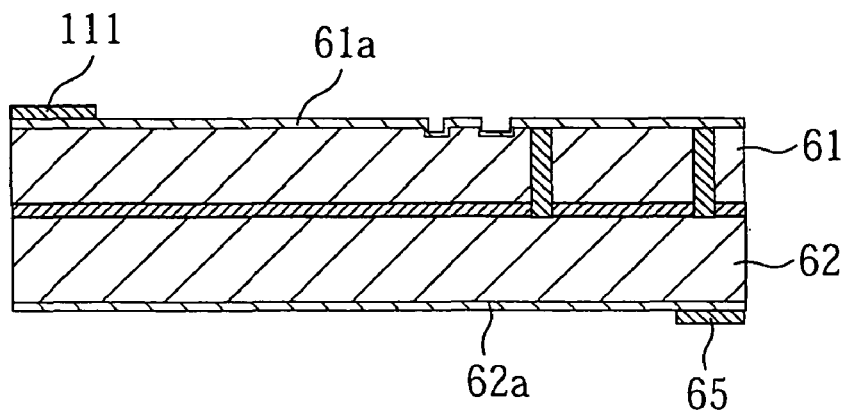
FIG. 29A through FIG. 29C show steps which follow the steps in FIG. 28D.

Next, as shown in FIG. 29A, a mirror surface 111 is formed on the protective film 61a, and an electrode pad 65 (not illustrated in FIG. 1 or FIG. 2) is formed on the protective film 62a. The mirror surface 111 and the electrode pad 65 can be made in the same way as for the mirror surface 111 and the electrode pad 15 in the first embodiment.

Figure 29B:
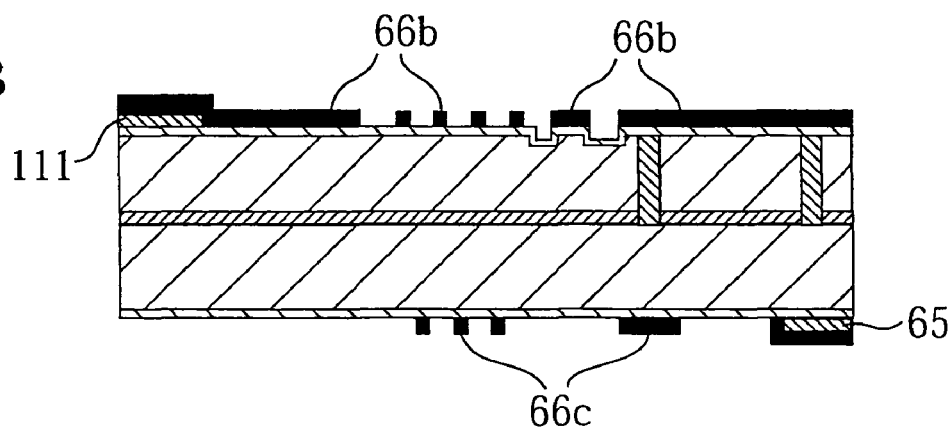

Next, as shown in FIG. 29B, an oxide film pattern 66b is formed over the mirror region 111, and an oxide film pattern 66c is formed over the electrode pad 65, to the material substrate S16. The oxide film pattern 66b serves as a mask in a later step shown in FIG. 30C, to mask regions of the material substrate S16 which are to become the mirror region M, the inner frame F1, the comb-teeth electrode E1, part of the inner frame F2, and part of the outer frame F3. The oxide film pattern 66c serves as a mask in a later step shown in FIG. 31B, to mask regions of the material substrate S16 which are to become the comb-teeth electrode E2, part of the inner frame F2, and part of the outer frame F3.

Figure 29C:
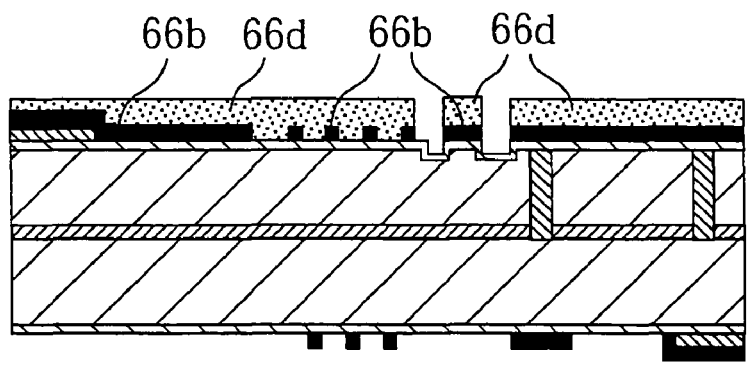

Next, as shown in FIG. 29C, a resist pattern 66d is formed over the oxide film pattern 66b, to the material substrate S16. The resist pattern 66d serves as a mask in the next step shown in FIG. 30A, to cover regions of the silicon layer 61 which are to become the torsion bars T1-T3.

Figure 30A:
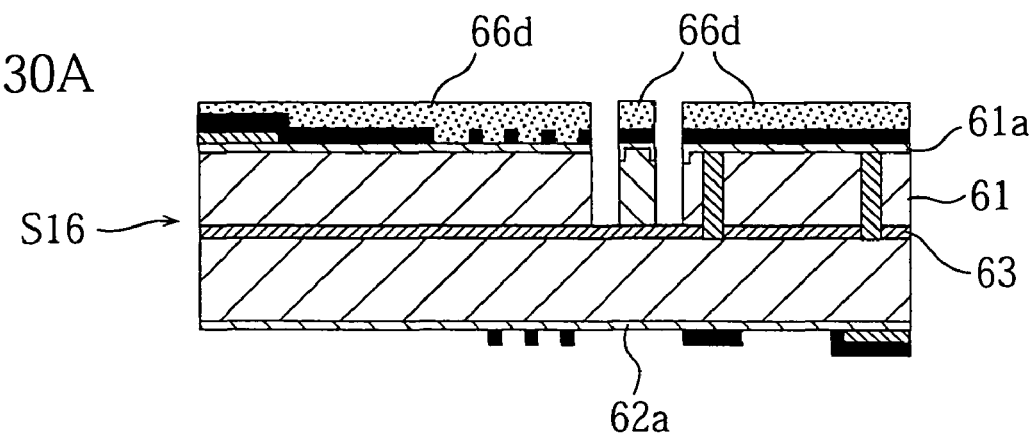
FIG. 30A through FIG. 30C show steps which follow the steps in FIG. 29C.

Next, as shown in FIG. 30A, using the resist pattern 66d as a mask, etching is performed by DRIE, from the side on the silicon layer 61 to the insulating layer 63. The type of the etching is anisotropic ion etching in which etching speed in the silicon layers 61 is faster in the thickness direction than in in-plane directions. This operation yields side surfaces of the torsion bars T1-T3. This etching process also yields the mirror region M, the inner frame F1, part of the inner frame F2, and part of the outer frame F3. After the etching process, the resist pattern 66d is removed.

Figure 30B:
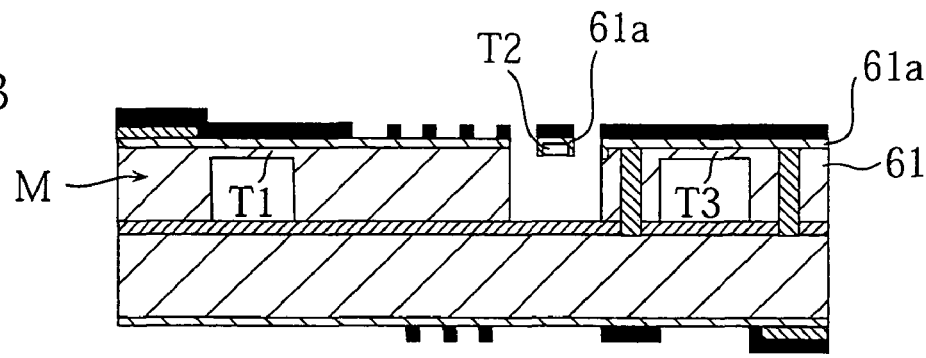

Next, as shown in FIG. 30B, wet etching is preformed to the silicon layer 61. The etchant for this operation may be the same as used in the first embodiment for removal of the silicon material 11a in the first embodiment.

In this etching process, the protective film 61a is etched at a very much slower speed than the etching speed in directions other than the (111) direction in the silicon crystal material that constitutes the silicon layer 61. The (111) surface in the silicon layer 61 spreads in in-plane directions. Therefore, protective film 61a works as an etch stop layer, allowing the etchant to etch silicon material transversely as in the drawing, between the regions which are to be the torsion bars T1-T3 and the insulating layer 63, thereby removing the material appropriately. The (111) surface of the silicon crystal material which constitute the silicon layer 61 has an ability to stop etching in a direction perpendicular to the surface. As a result, this etching yields the torsion bars T1-T3 appropriately.

Similarly, the protective film 62a is etched at a very much slower speed than the etching speed in directions other than the (111) direction in the silicon crystal material that constitutes the silicon layer 61. Therefore, protective film 62a prevents the silicon layer 62 from being eroded in this etching.

Figure 30C:
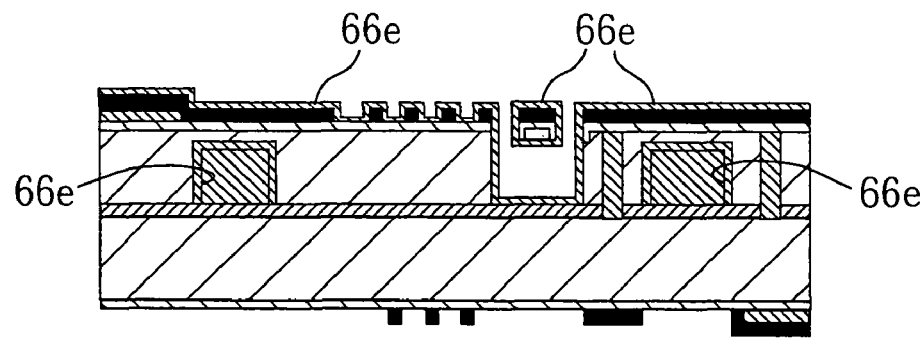

Next, as shown in FIG. 30C, a protective film 66c is formed. The protective film 66c is primarily for protecting the torsion bars T1-T3 in the next step shown in FIG. 31A, and is formed of silicon dioxide using CVD method.

Figure 31A:
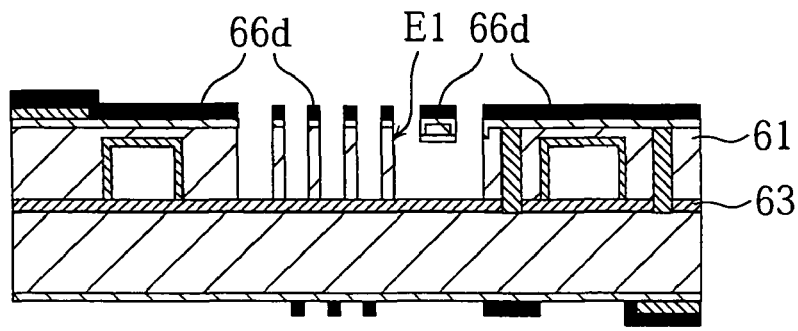
FIG. 31A through FIG. 31C show steps which follow the steps in FIG. 30C.

Next, as shown in FIG. 31A, using the oxide film pattern 66b as a mask, etching is performed by DRIE, from the side on the silicon layer 61 to the insulating layer 63. This operation yields the comb-teeth electrode E1.

Figure 31B:
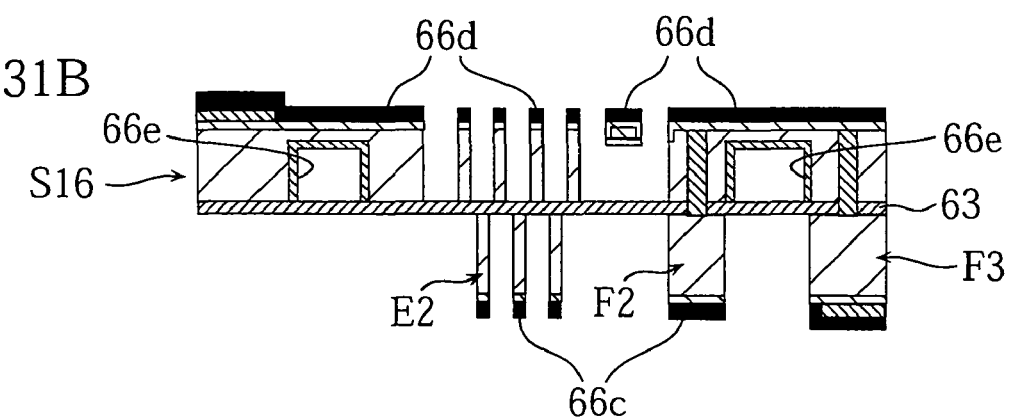

Next, as shown in FIG. 31B, using the oxide film pattern 66c as a mask, etching is performed by DRIE, from the side on the silicon layer 62 to the insulating layer 63. This operation yields the comb-teeth electrode E2, part of the inner frame F2, and part of the outer frame F3.

Figure 31C:
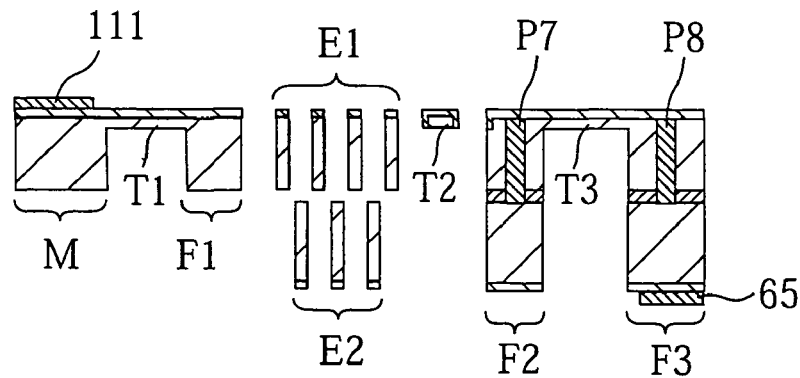
Figure 32:
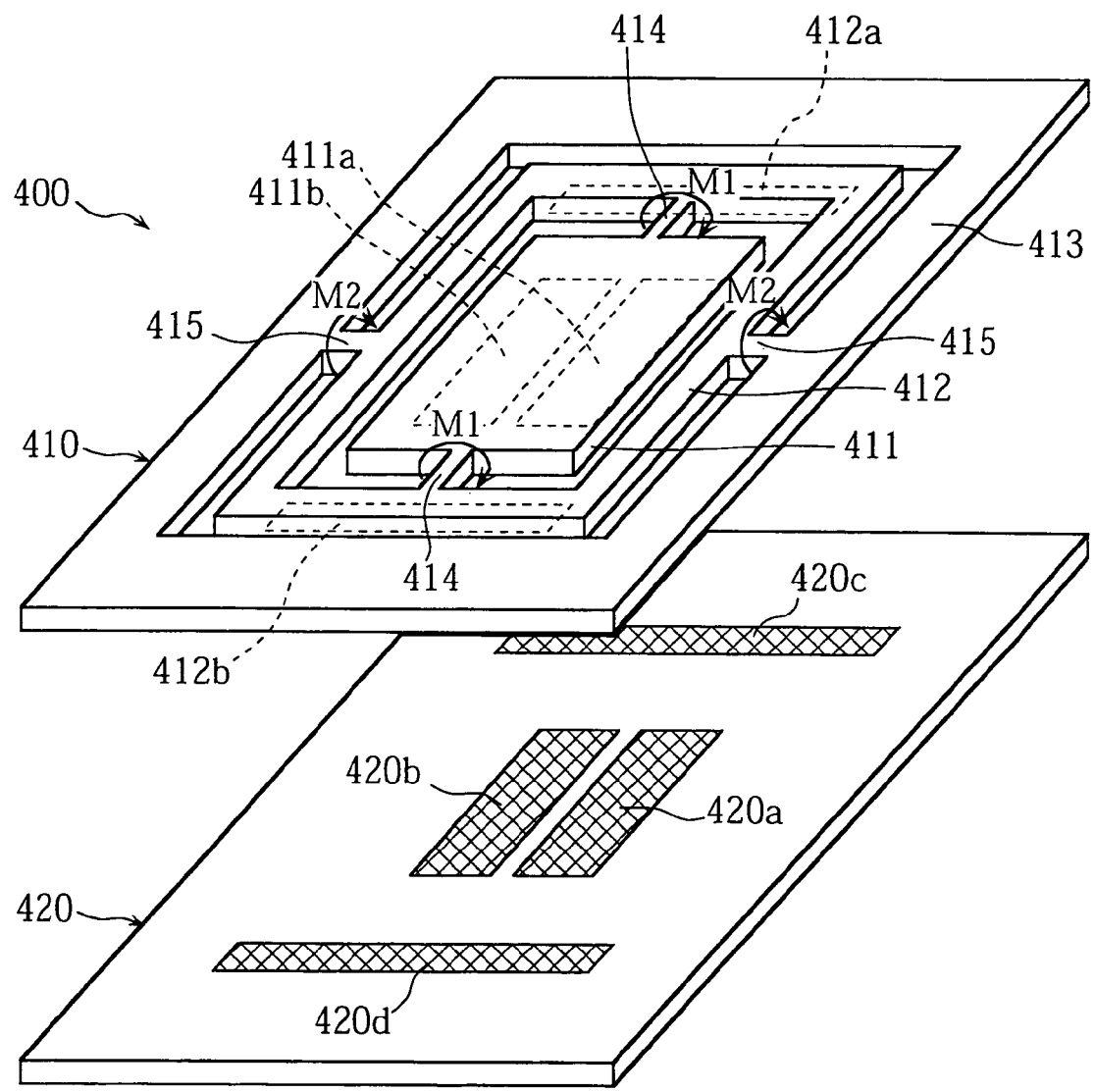
FIG. 32 is an exploded perspective view of a conventional flat-plate-electrode micromirror element.
Figure 33:
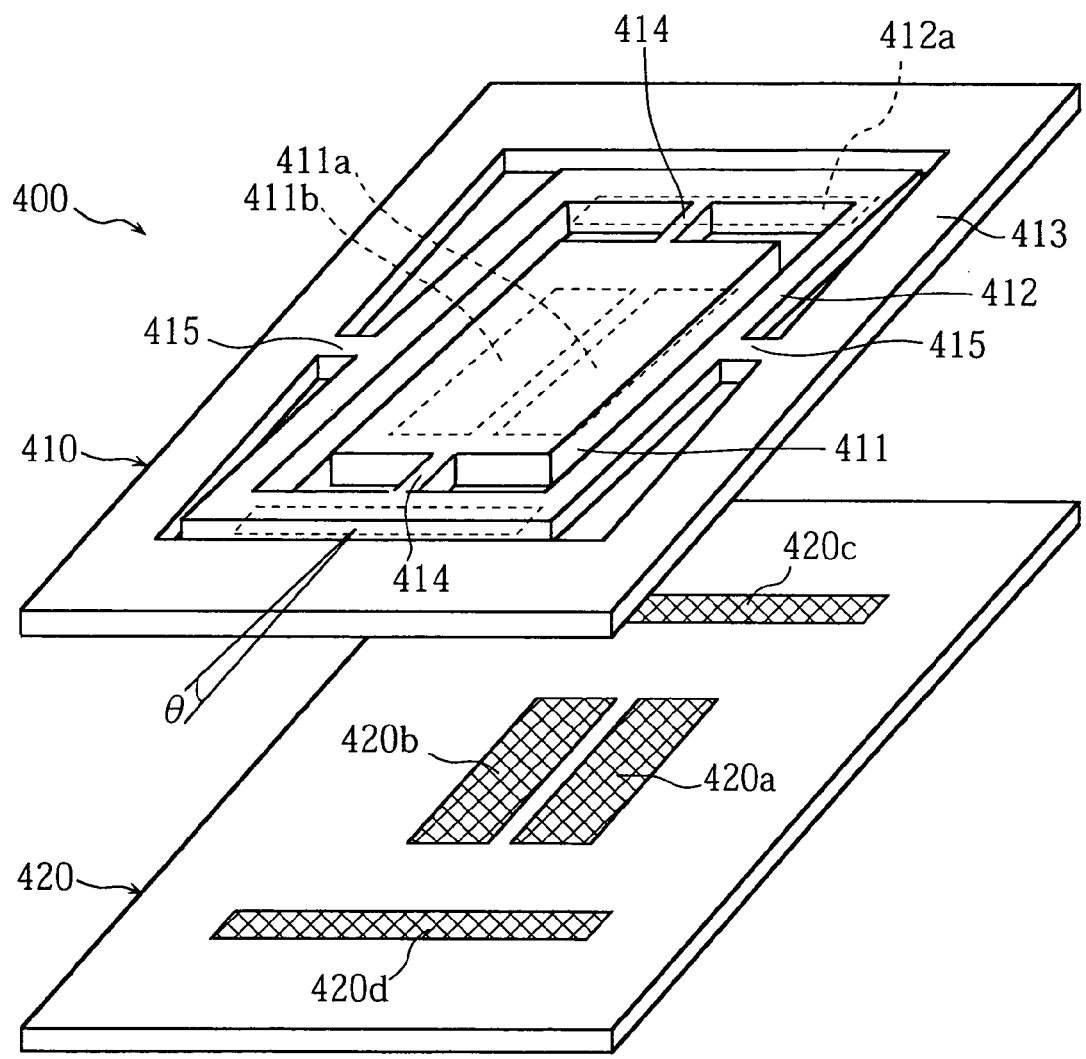
FIG. 33 shows the micromirror element in FIG. 32 in a pivoted position.
Figure 34:
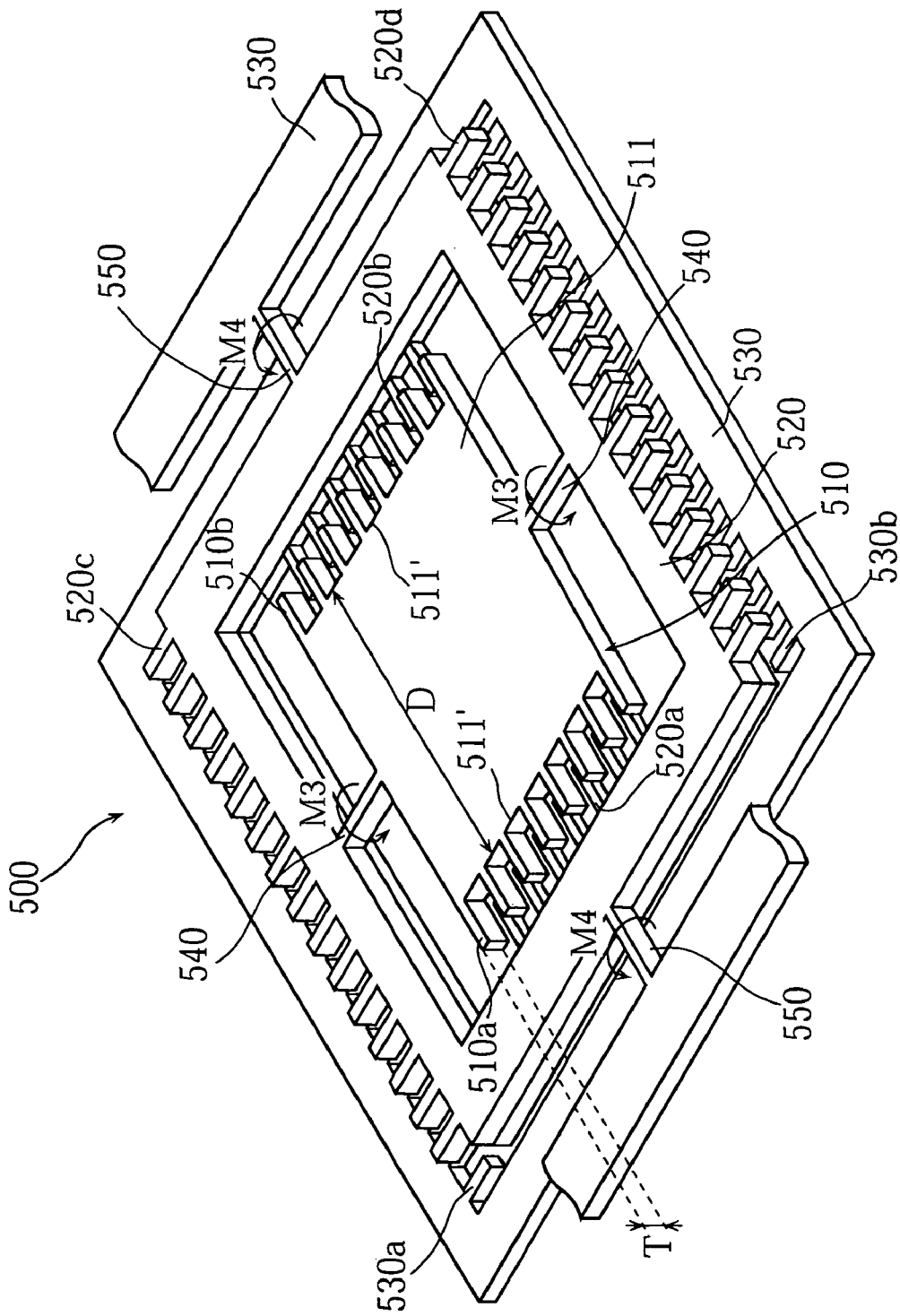
FIG. 34 is a fragmentary sectional perspective view of a conventional comb-teeth-electrode micromirror element.
Figure 35A:
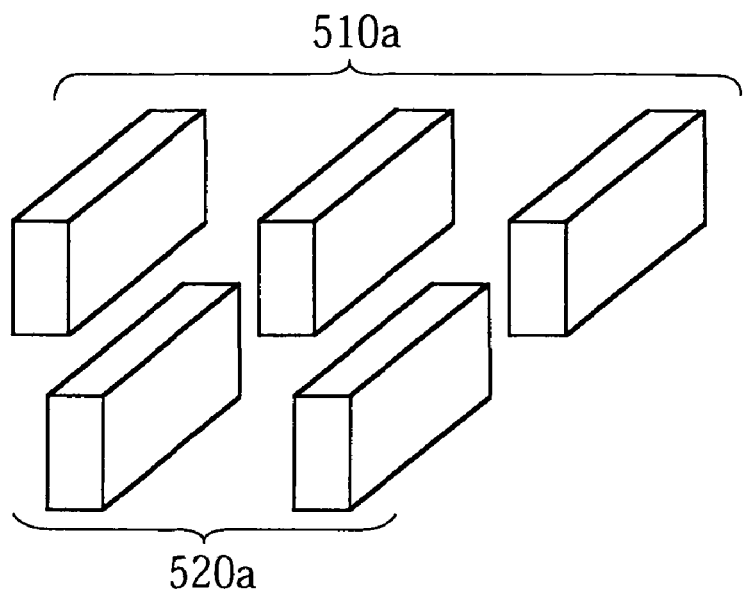
FIG. 35A and FIG. 35B show orientations of a pair of comb-teeth electrode.
Figure 35B:
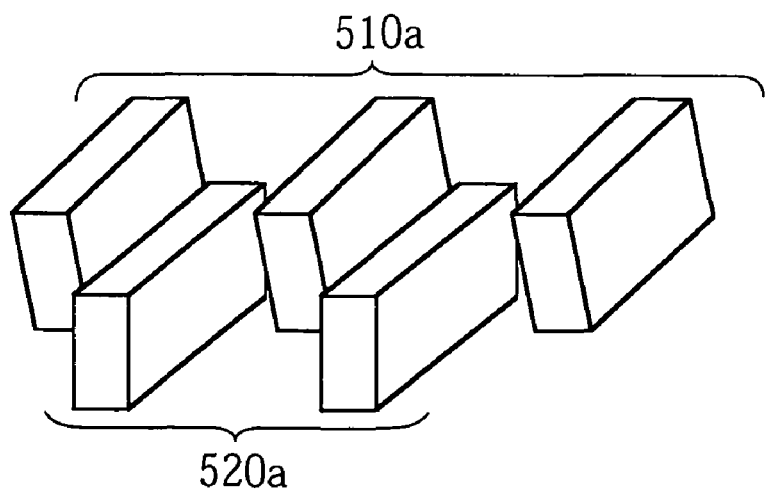

Next, as shown in FIG. 31C, etching is made in order to remove the oxide film patterns 66b, 66c, protective film 66e and exposed parts in the insulating layer 53.

The above-described series of steps yield the mirror region M, the torsion bars T1-T3, the inner frames F1, F2, the comb-teeth electrodes E1, E2, and the outer frame F3. In other words, the micromirror element X1 is manufactured.

In the present embodiment, it is possible to etch the silicon layer 61 and thereby remove the silicon material highly accurately to the depth corresponding to the thickness of the torsion bars T1-T3 due to be formed, because the depth of etching in this etching process is relatively shallow. The torsion bars T1-T3, which are thin wall portions of the micromirror element X1, are given the thickness by a highly accurate etching, and therefore have a highly accurate thickness dimension.

The mirror region M formed in the present embodiment has a part which originates from the silicon layer 61 and is continuous to the torsion bar T1, and the inner frame F1 has a part which originates from the silicon layer 61 and is continuous to the torsion bar T1. These two parts are electroconductive. Therefore, the mirror region M (mirror region 110) and the inner frame F1 (inner frame 120) are electrically connected with each other via the torsion bar T1 (torsion bar 141).

Similarly, the inner frame F2 has a part which originates from the silicon layer 61 and is continuous to the torsion bar T3 and a part which originates from the silicon layer 62. These two parts are electroconductive, and are electrically connected with each other via the plug P7. The outer frame F3 has a part which originates from the silicon layer 61 and is continuous to the torsion bar T3, and a part which originates from the silicon layer 62. These two parts are electroconductive and are electrically connected with each other via the plug P8. Therefore, the inner frame F2 (inner frame 120) is electrically connected with the outer frame F3 (outer frame 130) via the torsion bar T3 (torsion bar 151).

The present embodiment may be varied in terms of electrical connection between the inner frame F2 and the outer frame F3, by not making the plug P7 or the plug P8. For example, if the plug P7 is not made, it is then possible to form electrical isolation between the part of the inner frame F2 which originates from the silicon layer 62 and the part of the outer frame F3 which originates from the silicon layer 62.

In the micromirror element X1 manufactured in accordance with the present embodiment, appropriate selections may be made for the mode of electrical connection made by each torsion bar 151 included in the connecting regions 150, and appropriate electrical paths may be formed inside the inner frame 120 and outer frame 130 so that each torsion bar

151 will not make inappropriate short circuit. Then, it becomes possible to transfer a plurality of electric potentials via a plurality of torsion bars 151, from the outer frame 130 to the inner frame 120. Thus, it becomes possible to individually control the amount of electric potential to be applied to each comb-teeth electrode.

The invention claimed is:

1. A method of making a microstructure including a thin wall portion, the method comprising:
  performing a first etching process to a material substrate of a laminate structure including a first conductive layer and a second conductive layer having a thickness corresponding to a thickness of the thin wall portion, the etching being performed from a side of the first conductive layer to form, in the second conductive layer, a pre thin wall portion including a pair of side surfaces apart from each other in an in-plane direction of the second conductive layer, the pre thin wall portion contacting the first conductive layer; and
  performing a second etching process from a side of the first conductive layer for removing part of the first conductive layer that contacts the pre thin wall portion to form the thin wall portion.

2. The method of making a microstructure according to claim 1, wherein the first etching process is anisotropic reactive ion etching in which etching speed in the first conductive layer and the second conductive layer is faster in a thickness direction than in an in-plane direction.

3. The method of making a microstructure according to claim 1, wherein the first conductive layer is made of silicon material having a crystal structure that includes a (110) surface extending in an in-plane direction of the first conductive layer and two (111) surfaces perpendicular to the (110) surface.

4. The method of making a microstructure according to claim 1, wherein the second etching process is wet etching in which etching speed is faster in the first conductive layer than in the second conductive layer.

5. The method of making a microstructure according to claim 4, wherein the first conductive layer and the second conductive layer are made of electroconductive silicon material, the second conductive layer being higher in dopant concentration than the first conductive layer.

6. A method of making a microstructure including a thin wall portion, the method comprising:
  performing a first etching process to a material substrate of a laminate structure including: a first conductive layer; a second conductive layer that has a thickness corresponding to a thickness of the thin wall portion, and that contacts the first conductive layer; a third conductive layer; and an insulating layer between the second conductive layer and the third conductive layer; the etching being performed from a side of the first conductive layer via a first masking pattern for masking a region of the material substrate to become a thick wall region and via a second masking pattern for masking part of the first conductive layer which corresponds to a region of the second conductive layer to become the thin wall portion;
  performing a second etching process to the material substrate from a side of the first conductive layer via the first masking pattern after removing the second masking pattern, thereby forming, in the second conductive layer, a pre thin wall portion having a pair of side surfaces apart from each other in an in-plane direction of the second conductive layer, the pre thin wall contacting the first conductive layer and the insulating layer;
  performing a third etching process from a side of the first conductive layer to remove part of the first conductive layer contacting the pre thin wall portion; and
  performing a fourth etching process to remove part of the insulating layer contacting the pre thin wall portion, thereby forming the thin wall portion.

7. The method of making a microstructure according to claim 6, wherein the second etching process is anisotropic reactive ion etching in which etching speed in the first conductive layer and the second conductive layer is faster in a thickness direction than in an in-plane direction.

8. The method of making a microstructure according to claim 6, further comprising: performing an etching process from a side of the first conductive layer for forming a hole which penetrates the first conductive layer, the second conductive layer and the insulating layer to reach the third conductive layer; and filling the hole with electroconductive material to form an electroconductive path.

9. The method of making a microstructure according to claim 6, wherein the third etching process is wet etching in which etching speed is faster in the first conductive layer than in the second conductive layer.

10. The method of making a microstructure according to claim 9, wherein the first conductive layer and the second conductive layer are made of electroconductive silicon material, the second conductive layer being higher in dopant concentration than the first conductive layer.

11. The method of making a microstructure according to claim 6, wherein the first conductive layer is made of silicon material having a crystal structure that includes a (110) surface extending in an in-plane direction of the first conductive layer and two (111) surfaces perpendicular to the (110) surface, these two surfaces crossing each other, and wherein the first masking pattern has an outline at least part of which extends along the two (111) surfaces.

12. The method of making a microstructure according to claim 11, wherein the third conductive layer is made of silicon material having a crystal structure that includes a (110) surface extending in an in-plane direction of the third conductive layer and two (111) surfaces crossing each other, these two surfaces being parallel to one of the two (111) surfaces of the first conductive layer.

13. A method of making a microstructure having a first thin wall portion and a second thin wall portion, the method comprising:
  a step of performing a first etching process to a material substrate having a laminate structure including: a first conductive layer; a second conductive layer having a thickness corresponding to a thickness of the first thin wall portion and contacting the first conductive layer; a third conductive layer having a thickness corresponding to a thickness of the second thin wall portion; a fourth conductive layer contacting the third conductive layer; and an insulating layer between the second conductive layer and the third conductive layer; the etching being performed from a side of the first conductive layer via a first masking pattern masking a region of the material substrate to become a thick wall region and via a second masking pattern masking part of the first conductive layer which corresponds to a region of the second conductive layer to become the thin wall portion;
  a step of performing a second etching process to the material substrate from a side of the fourth conductive layer via a third masking pattern masking part of the material substrate to become a thick wall region and via a fourth masking pattern masking part of the fourth conductive layer corresponding to a region of the third conductive layer to become the second thin wall portion;

a step of removing the second masking pattern and then performing a third etching process to the material substrate from a side of the first conductive layer via the first masking pattern, thereby forming, in the second conductive layer, a first pre thin wall portion having a pair of side surfaces apart from each other in an in-plane direction of the second conductive layer, these side surfaces contacting the first conductive layer and the insulating layer;

a step of removing the fourth masking pattern and then performing a fourth etching process to the material substrate from a side of the fourth conductive layer via the third masking pattern, thereby forming, in the third conductive layer, a second pre thin wall portion having a pair of side surfaces apart from each other in an in-plane direction of the third conductive layer, these side surfaces contacting the fourth conductive layer and the insulating layer;

a step of performing a fifth etching process, thereby removing part of the first conductive layer contacting the first pre thin wall portion and also removing part of the fourth conductive layer contacting the second pre thin wall portion; and a step of performing a sixth etching process for removing part of the insulating layer contacting the first pre thin wall portion, thereby forming the first thin wall portion, and also removing part of the insulating layer contacting the second pre thin wall portion to form the second thin wall portion.

14. The method of making a microstructure according to claim 13, wherein the third etching process is anisotropic reactive ion etching in which etching speed in the first conductive layer and the second conductive layer is faster in a thickness direction than in an in-plane direction, and wherein the fourth etching is anisotropic reactive ion etching in which etching speed in the fourth conductive layer and the third conductive layer is faster in a thickness direction than in an in-plane direction.

15. The method of making a microstructure according to claim 13, wherein the fifth etching process is wet etching in which etching speed in the first conductive layer is faster than in the second conductive layer, and wherein etching speed in the fourth conductive layer is faster than in the third conductive layer.

16. The method of making a microstructure according to claim 15, wherein the first conductive layer, the second conductive layer, the third conductive layer and the fourth conductive layer are made of electroconductive silicon material, the second conductive layer being higher in dopant concentration than the first conductive layer, the third conductive layer being higher in dopant concentration than the fourth conductive layer.

17. The method of making a microstructure according to claim 13, wherein the first conductive layer is made of silicon material having a crystal structure including a (110) surface extending in an in-plane direction of the first conductive layer and two (111) surfaces perpendicular to the (110) surface, these two surfaces crossing each other, and wherein the first masking pattern has an outline part of which extends along the two (111) surfaces.

18. The method of making a microstructure according to claim 17, wherein the fourth conductive layer is made of silicon material having a crystal structure including a (110) surface extending in an in-plane direction of the fourth conductive layer and two (111) surfaces crossing each other and being parallel to one of the two (111) surfaces in the first conductive layer, and wherein the third masking pattern has an outline part of which extends along the two (111) surfaces of the fourth conductive layer.

19. A method of making a microstructure having a thin wall portion, the method comprising:

performing a first etching process to a material substrate having a laminate structure including: a first conductive layer having a thickness corresponding to a thickness of the thin wall portion; and a second conductive layer; the etching being performed from a side of the first conductive layer via a masking pattern masking a region of the first conductive layer to become a thick wall region, thereby forming, in the first conductive layer, a pre thin wall portion having a pair of side surfaces apart from each other in an in-plane direction of the first conductive layer, these side surfaces contacting the second conductive layer; and performing a second etching process from a side of the first conductive layer, thereby removing part of the second conductive layer contacting the pre thin wall portion.

20. The method of making a microstructure according to claim 19, wherein the second conductive layer is made of silicon material having a crystal structure including a (111) surface extending in an in-plane direction of the second conductive layer.

21. The method of making a microstructure according to claim 19, wherein the second etching process is wet etching in which etching speed in the second conductive layer is faster than in the first conductive layer.

22. The method of making a microstructure according to claim 21, wherein the first conductive layer and the second conductive layer are made of electroconductive silicon material, the first conductive layer being higher in dopant concentration than the second conductive layer.

23. The method of making a microstructure according to claim 19, wherein the laminate structure in the material substrate further includes: an insulating layer contacting the second conductive layer on a side opposite to the first conductive layer; and a third conductive layer contacting the insulating layer on a side opposite to the second conductive layer.

24. The method of making a microstructure according to claim 23, further comprising: performing an etching process from a side of the first conductive layer for forming a hole penetrating the first conductive layer, the second conductive layer and the insulating layer to reach the third conductive layer; and filling the hole with electroconductive material to form an electroconductive path.

25. A method of making a microstructure having a thin wall portion, the method comprising:

performing a first etching process to a material substrate having a laminate structure including: a first conductive layer; a second conductive layer; and an insulating layer between the first conductive layer and the second conductive layer; the etching being performed from a side of the first conductive layer part way to the insulating layer via a first masking pattern masking a region of the first conductive layer to become a thin wall portion, thereby forming, in the first conductive layer, a pre thin wall portion having a pair of side surfaces apart from each other in an in-plane direction of the first conductive layer;

forming an wet-etching stop layer on a surface of the first conductive layer which includes the pre thin wall portion;

performing a second etching process provided by dry etching, the etching being performed from a side of the first conductive layer to the insulating layer via a second masking pattern masking the pre thin-film layer; and performing wet etching for removing material between the pre thin wall portion and the insulating layer in the first conductive layer.

26. The method of making a microstructure according to claim 25, wherein the first conductive layer and the wet-etching stop layer are made of electroconductive silicon material, the wet-etching stop layer being higher in dopant concentration than the first conductive layer.

27. The method of making a microstructure according to claim 25, wherein the first conductive layer is made of silicon material having a crystal structure including a (111) surface extending in an in-plane direction of the first conductive layer.

28. The method of making a microstructure according to claim 25, further comprising: performing an etching process from a side of the first conductive layer for forming a hole penetrating the first conductive layer and the insulating layer to reach the second conductive layer; and filling the hole with electroconductive material to form an electroconductive path.

* * * * *